(12) United States Patent
Rathburn

(10) Patent No.: US 10,667,410 B2
(45) Date of Patent: May 26, 2020

(54) METHOD OF MAKING A FUSION BONDED CIRCUIT STRUCTURE

(71) Applicant: HSIO Technologies, LLC, Maple Grove, MN (US)

(72) Inventor: James J. Rathburn, Maple Grove, MN (US)

(73) Assignee: HSIO Technologies, LLC, Brooklyn Park, MN (US)

( * ) Notice: Subject to any disclaimer, the term of this patent is extended or adjusted under 35 U.S.C. 154(b) by 245 days.

(21) Appl. No.: 15/842,310

(22) Filed: Dec. 14, 2017

(65) Prior Publication Data

US 2018/0124928 A1    May 3, 2018

Related U.S. Application Data

(63) Continuation-in-part of application No. 14/864,215, filed on Sep. 24, 2015, now Pat. No. 10,159,154,
(Continued)

(51) Int. Cl.
*H05K 3/20* (2006.01)
*H05K 3/46* (2006.01)
(Continued)

(52) U.S. Cl.
CPC ........ *H05K 3/4623* (2013.01); *H01L 21/4857* (2013.01); *H01L 23/5383* (2013.01);
(Continued)

(58) Field of Classification Search
CPC .... H05K 1/113; H05K 3/4644; H05K 3/4682; H05K 3/4623; H05K 3/0023;
(Continued)

(56) References Cited

U.S. PATENT DOCUMENTS 3,672,986 A    6/1972  Schneble
4,188,438 A    2/1980  Burns
(Continued)

FOREIGN PATENT DOCUMENTS

JP    05254023    10/1993
JP    2003/217774    7/2003
(Continued)

OTHER PUBLICATIONS

Notification of Transmittal of the International Search Report and the Written Opinion of the International Searching Authority dated Jul. 30, 2010 in International Application No. PCT/US2010/036043.
(Continued)

*Primary Examiner* — Paul D Kim

(57) ABSTRACT

A method of making a fusion bonded circuit structure. Each major surface of an LCP substrate is provided with a seed layers of a conductive material. Resist layers are deposited on the seed layers. The resist layers are processed to create recesses corresponding to a desired circuitry layers on each side of the LCP substrate. The recesses expose portions of the seed layers of conductive material. The LCP substrate is electroplated to simultaneously create conductive traces defined by the first recesses on both sides of the LCP substrate. The resist layers are removed to reveal the conductive traces. The LCP substrate is etched to remove exposed portions of the seed layers adjacent the conductive traces. LCP layers are fusion bonded to the major surfaces of the LCP substrate to encapsulate the conductive traces in an LCP material. The LCP layers can be laser drilled to expose the conductive traces.

19 Claims, 43 Drawing Sheets

Related U.S. Application Data which is a continuation-in-part of application No. PCT/US2014/045856, filed on Jul. 9, 2014, application No. 15/842,310, which is a continuation-in-part of application No. 15/070,026, filed on Mar. 15, 2016, now Pat. No. 10,506,722.

(60) Provisional application No. 62/441,617, filed on Jan. 3, 2017, provisional application No. 61/845,088, filed on Jul. 11, 2013, provisional application No. 61/915,194, filed on Dec. 12, 2013, provisional application No. 62/140,038, filed on Mar. 30, 2015.

(51) Int. Cl.
| | |
|---|---|
| *H05K 3/00* | (2006.01) |
| *H05K 3/18* | (2006.01) |
| *H05K 3/06* | (2006.01) |
| *H01L 21/48* | (2006.01) |
| *H05K 3/42* | (2006.01) |
| *H01L 23/538* | (2006.01) |
| *H01L 23/66* | (2006.01) |
| *H05K 1/11* | (2006.01) |

(52) U.S. Cl.
CPC ........... *H01L 23/66* (2013.01); *H05K 3/0023* (2013.01); *H05K 3/0032* (2013.01); *H05K 3/064* (2013.01); *H05K 3/188* (2013.01); *H05K 3/425* (2013.01); *H05K 3/4644* (2013.01); *H01L 21/486* (2013.01); *H01L 23/5384* (2013.01); *H01L 23/5386* (2013.01); *H01L 2223/6627* (2013.01); *H01L 2224/16235* (2013.01); *H01L 2224/32225* (2013.01); *H01L 2224/73267* (2013.01); *H01L 2924/19105* (2013.01); *H05K 1/113* (2013.01); *H05K 3/429* (2013.01); *H05K 3/4682* (2013.01); *H05K 2201/0141* (2013.01); *H05K 2201/096* (2013.01); *H05K 2201/10674* (2013.01)

(58) Field of Classification Search
CPC ...... H05K 3/188; H05K 3/064; H05K 3/0032; H05K 3/429; H05K 3/425; H01L 23/5383; H01L 23/66; H01L 23/5384; H01L 21/4857; H01L 21/486; H01L 23/5386

See application file for complete search history.

(56) References Cited

U.S. PATENT DOCUMENTS

| | | |
|---|---|---|
| 4,295,700 A | 10/1981 | Sado |
| 4,489,999 A | 12/1984 | Miniet |
| 4,922,376 A | 5/1990 | Pommer et al. |
| 4,959,515 A | 9/1990 | Zavracky |
| 4,964,948 A | 10/1990 | Reed |
| 5,014,159 A | 5/1991 | Butt |
| 5,046,238 A | 9/1991 | Daigle |
| 5,071,363 A | 12/1991 | Reylek et al. |
| 5,072,520 A | 12/1991 | Nelson |
| 5,090,116 A | 2/1992 | Henschen |
| 5,096,426 A | 3/1992 | Simpson et al. |
| 5,127,837 A | 7/1992 | Shah et al. |
| 5,129,573 A | 7/1992 | Duffey |
| 5,161,983 A | 11/1992 | Ohno |
| 5,167,512 A | 12/1992 | Walkup |
| 5,208,068 A | 5/1993 | Davis et al. |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A | 10/1995 | Beilin et al. |
| 5,479,319 A | 12/1995 | Werther et al. |
| 5,509,019 A | 4/1996 | Yamamura |
| 5,527,998 A | 6/1996 | Anderson et al. |
| 5,534,787 A | 7/1996 | Levy |
| 5,562,462 A | 10/1996 | Matsuba et al. |
| 5,596,178 A | 1/1997 | Christian |
| 5,619,018 A | 4/1997 | Rossi |
| 5,659,181 A | 8/1997 | Bridenbaugh |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,764,485 A | 6/1998 | Lebaschi |
| 5,772,451 A | 6/1998 | Dozler et al. |
| 5,785,538 A | 7/1998 | Beaman et al. |
| 5,787,976 A | 8/1998 | Hamburgen et al. |
| 5,802,699 A | 9/1998 | Fjelstad et al. |
| 5,802,711 A | 9/1998 | Card et al. |
| 5,819,579 A | 10/1998 | Roberts |
| 5,880,590 A | 3/1999 | Desai et al. |
| 5,904,546 A | 5/1999 | Wood et al. |
| 5,913,109 A | 6/1999 | Distefano et al. |
| 5,921,786 A | 7/1999 | Slocum et al. |
| 5,925,931 A | 7/1999 | Yamamoto |
| 5,933,558 A | 8/1999 | Sauvageau et al. |
| 5,973,394 A | 10/1999 | Slocum et al. |
| 6,020,597 A | 2/2000 | Kwak |
| 6,062,879 A | 5/2000 | Beaman et al. |
| 6,080,932 A | 6/2000 | Smith et al. |
| 6,107,109 A | 8/2000 | Akram et al. |
| 6,114,240 A | 9/2000 | Akram et al. |
| 6,118,426 A | 9/2000 | Albert |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,288,451 B1 | 9/2001 | Tsao |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,428,328 B2 | 8/2002 | Haba et al. |
| 6,433,427 B1 | 8/2002 | Wu et al. |
| 6,437,452 B2 | 8/2002 | Lin |
| 6,437,591 B1 | 8/2002 | Farnworth et al. |
| 6,459,418 B1 | 10/2002 | Comiskey |
| 6,461,183 B1 | 10/2002 | Ohkita |
| 6,462,418 B2 | 10/2002 | Sakamoto et al. |
| 6,462,568 B1 | 10/2002 | Cram |
| 6,477,286 B1 | 11/2002 | Ouchi |
| 6,490,786 B2 | 12/2002 | Belke et al. |
| 6,494,725 B2 | 12/2002 | Lin et al. |
| 6,506,438 B2 | 1/2003 | Duthaler et al. |
| 6,521,489 B2 | 2/2003 | Duthaler |
| 6,545,291 B1 | 4/2003 | Amundson |
| 6,572,396 B1 | 6/2003 | Rathburn |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |

(56) References Cited

U.S. PATENT DOCUMENTS

| | | |
|---|---|---|
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |
| 6,750,473 B2 | 6/2004 | Amundson |
| 6,758,691 B1 | 7/2004 | McHugh |
| 6,765,288 B2 | 7/2004 | Damberg |
| 6,773,302 B2 | 8/2004 | Gutierrez et al. |
| 6,796,810 B2 | 9/2004 | DelPrete |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B2 | 12/2004 | Payne et al. |
| 6,830,460 B1 | 12/2004 | Rathburn |
| 6,840,777 B2 | 1/2005 | Sathe et al. |
| 6,853,087 B2 | 2/2005 | Neuhasu et al. |
| 6,856,151 B1 | 2/2005 | Cram |
| 6,857,880 B2 | 2/2005 | Ohtsuki |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |
| 7,049,838 B2 | 5/2006 | Kagami |
| 7,064,412 B2 | 6/2006 | Geissinger et al. |
| 7,070,419 B2 | 7/2006 | Brown et al. |
| 7,095,090 B2 | 8/2006 | Nakajiman et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,276,919 B1 | 10/2007 | Beaman et al. |
| 7,297,003 B2 | 11/2007 | Rathburn |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arena et al. |
| 7,410,825 B2 | 8/2008 | Majumclar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morimoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,535,114 B2 | 5/2009 | Agraharam et al. |
| 7,536,714 B2 | 5/2009 | Yuan |
| 7,537,461 B2 | 5/2009 | Rathburn |
| 7,538,415 B1 | 5/2009 | Lin et al. |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,658,163 B2 | 2/2010 | Renn |
| 7,658,617 B1 | 2/2010 | Brodsky |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 | 1/2011 | Mizoguchi |
| 7,874,847 B2 | 1/2011 | Matsui et al. |
| 7,897,503 B2 | 3/2011 | Foster et al. |
| 7,898,087 B2 | 3/2011 | Chainer |
| 7,950,927 B2 | 5/2011 | Kazama |
| 7,955,088 B2 | 6/2011 | Di Stefano |
| 7,999,369 B2 | 8/2011 | Malhan et al. |
| 8,004,092 B2 | 8/2011 | Lin |
| 8,044,502 B2 | 10/2011 | Rathburn |
| 8,058,558 B2 | 11/2011 | Mok et al. |
| 8,072,058 B2 | 12/2011 | Kim et al. |
| 8,120,173 B2 | 2/2012 | Forman et al. |
| 8,144,687 B2 | 2/2012 | Mizoguchi |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 * | 6/2012 | Getz ..................... B81B 7/007 |
| | | 257/621 |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,322 B1 | 9/2013 | Kim et al. |
| 8,525,346 B2 | 9/2013 | Rathburn |
| 8,536,714 B2 | 9/2013 | Sakagushi |
| 8,536,889 B2 | 9/2013 | Nelson et al. |
| 8,610,265 B2 | 12/2013 | Rathburn |
| 8,618,649 B2 | 12/2013 | Rathburn |
| 8,704,377 B2 | 4/2014 | Rathburn |
| 8,758,067 B2 | 6/2014 | Rathburn |
| 8,789,272 B2 | 7/2014 | Rathburn |
| 8,803,539 B2 | 8/2014 | Rathburn |
| 8,829,671 B2 | 9/2014 | Rathburn |
| 8,911,266 B2 | 12/2014 | Kawate |
| 8,912,812 B2 | 12/2014 | Rathburn |
| 8,928,344 B2 | 1/2015 | Rathburn |
| 8,955,215 B2 | 2/2015 | Rathburn |
| 8,955,216 B2 | 2/2015 | Rathburn |
| 8,970,031 B2 | 3/2015 | Rathburn |
| 8,981,568 B2 | 3/2015 | Rathburn |
| 8,981,809 B2 | 3/2015 | Rathburn |
| 8,984,748 B2 | 3/2015 | Rathbun |
| 8,987,886 B2 | 3/2015 | Rathburn |
| 8,988,093 B2 | 3/2015 | Rathburn |

(56) References Cited

U.S. PATENT DOCUMENTS

| | | |
|---|---|---|
| 9,054,097 B2 | 6/2015 | Rathburn |
| 9,076,884 B2 | 7/2015 | Rathburn |
| 9,093,767 B2 | 7/2015 | Rathburn |
| 9,136,196 B2 | 9/2015 | Rathburn |
| 9,184,145 B2 | 11/2015 | Rathburn |
| 9,184,527 B2 | 11/2015 | Rathburn |
| 9,196,980 B2 | 11/2015 | Rathburn |
| 9,231,328 B2 | 1/2016 | Rathburn |
| 9,232,654 B2 | 1/2016 | Rathburn |
| 9,276,336 B2 | 3/2016 | Rathburn |
| 9,276,339 B2 | 3/2016 | Rathburn |
| 9,277,654 B2 | 3/2016 | Rathburn |
| 9,318,862 B2 | 4/2016 | Rathburn |
| 9,320,133 B2 | 4/2016 | Rathburn |
| 9,320,144 B2 | 4/2016 | Rathburn |
| 9,350,093 B2 | 5/2016 | Rathburn |
| 9,350,124 B2 | 5/2016 | Rathburn |
| 9,350,214 B2 | 5/2016 | Rathburn |
| 9,414,500 B2 | 8/2016 | Rathburn |
| 9,536,815 B2 | 1/2017 | Rathburn |
| 9,559,447 B2 | 1/2017 | Rathburn |
| 9,603,249 B2 | 3/2017 | Rathburn |
| 9,613,841 B2 | 4/2017 | Rathburn |
| 9,660,368 B2 | 5/2017 | Rathburn |
| 9,689,897 B2 | 6/2017 | Rathburn |
| 9,699,906 B2 | 7/2017 | Rathburn |
| 9,755,335 B2 | 9/2017 | Rathburn |
| 9,761,520 B2 | 9/2017 | Rathburn |
| 2001/0012707 A1 | 8/2001 | Ho et al. |
| 2001/0016551 A1 | 8/2001 | Yishio et al. |
| 2002/0011639 A1 | 1/2002 | Carlson et al. |
| 2002/0027441 A1 | 3/2002 | Akrma et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2002/0179334 A1 | 12/2002 | Curcio |
| 2003/0003779 A1 | 1/2003 | Rathburn |
| 2003/0096512 A1 | 5/2003 | Cornell |
| 2003/0114029 A1 | 6/2003 | Lee et al. |
| 2003/0117161 A1 | 6/2003 | Burns |
| 2003/0141884 A1 | 7/2003 | Maruyama et al. |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0104451 A1 | 6/2004 | Ooi |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0048680 A1 | 3/2005 | Matsumani |
| 2005/0100294 A1 | 5/2005 | Nguyen et al. |
| 2005/0101164 A1 | 5/2005 | Rathburn |
| 2005/0162176 A1 | 7/2005 | Bucksch |
| 2005/0164527 A1 | 7/2005 | Radza et al. |
| 2005/0196511 A1 | 9/2005 | Garrity et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Andersen |
| 2006/0063312 A1 | 3/2006 | Kurita |
| 2006/0087064 A1 | 4/2006 | Daniel et al. |
| 2006/0125500 A1 | 6/2006 | Watkins et al. |
| 2006/0145338 A1 | 7/2006 | Dong |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0216603 A1* | 9/2006 | Choi .................. H01M 4/0402 429/231.95 |
| 2006/0265919 A1 | 10/2006 | Huang |
| 2006/0258912 A1 | 11/2006 | Belson et al. |
| 2006/0261827 A1 | 11/2006 | Cooper et al. |
| 2006/0274510 A1 | 12/2006 | Nakada |
| 2006/0281303 A1 | 12/2006 | Trezza et al. |
| 2007/0021002 A1 | 1/2007 | Laurx et al. |
| 2007/0035030 A1 | 2/2007 | Horton |
| 2007/0057382 A1 | 3/2007 | Liu et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das |
| 2007/0224735 A1 | 9/2007 | Karashima et al. |
| 2007/0232059 A1 | 10/2007 | Abe |
| 2007/0026999 A1 | 11/2007 | Di Stefano |
| 2007/0259539 A1 | 11/2007 | Brown et al. |
| 2007/0267138 A1 | 11/2007 | White et al. |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0290306 A1 | 12/2007 | Muramatsu |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0020624 A1 | 1/2008 | Nikaido et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0115961 A1 | 5/2008 | Mok et al. |
| 2008/0117606 A1 | 5/2008 | Karlsson |
| 2008/0143358 A1 | 6/2008 | Breinlinger |
| 2008/0143367 A1 | 6/2008 | Chabineau-Loygren |
| 2008/0156856 A1 | 7/2008 | Barausky et al. |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0233672 A1 | 9/2008 | Heck |
| 2008/0237884 A1 | 10/2008 | Hsu |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0039496 A1 | 2/2009 | Beer et al. |
| 2009/0047808 A1 | 2/2009 | Ma |
| 2009/0058444 A1 | 3/2009 | McIntyre |
| 2009/0061089 A1 | 3/2009 | King |
| 2009/0071699 A1 | 3/2009 | Hsu |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0180236 A1 | 7/2009 | Lee et al. |
| 2009/0224404 A1 | 9/2009 | Wood et al. |
| 2009/0241332 A1 | 10/2009 | Lauffer et al. |
| 2009/0267628 A1 | 10/2009 | Takase |
| 2009/0309212 A1 | 12/2009 | Shim |
| 2009/0321915 A1 | 12/2009 | Hu et al. |
| 2010/0133680 A1 | 6/2010 | Kang et al. |
| 2010/0143194 A1 | 6/2010 | Lee et al. |

(56) References Cited

U.S. PATENT DOCUMENTS

| | | |
|---|---|---|
| 2010/0182717 A1 | 7/2010 | Ishibashi |
| 2010/0188112 A1 | 7/2010 | Yoshida |
| 2010/0213960 A1 | 8/2010 | Mok et al. |
| 2010/0244872 A1 | 9/2010 | Yoshida |
| 2010/0290501 A1 | 11/2010 | De Bruyker |
| 2010/0030734 A1 | 12/2010 | Ables et al. |
| 2010/0300734 A1* | 12/2010 | Ables .................... H01L 24/16 174/257 |
| 2011/0083881 A1 | 4/2011 | Nguyen et al. |
| 2011/0101540 A1 | 5/2011 | Chainer |
| 2012/0003844 A1 | 1/2012 | Kumar |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0002285 A1 | 1/2013 | Nelson |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0283922 A1 | 10/2013 | Qualtieri |
| 2013/0330942 A1 | 12/2013 | Rathburn |
| 2013/0334698 A1 | 12/2013 | Mohammed |
| 2014/0041919 A1 | 2/2014 | Huang et al. |
| 2014/0043782 A1 | 2/2014 | Rathburn |
| 2014/0045350 A1 | 2/2014 | Taylor |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0231961 A1 | 8/2014 | Lin |
| 2014/0242816 A1 | 8/2014 | Rathburn |
| 2014/0273641 A1 | 9/2014 | Light |
| 2015/0009644 A1 | 1/2015 | Rendek |
| 2015/0013901 A1 | 1/2015 | Rathburn |
| 2015/0091600 A1 | 4/2015 | Rathburn |
| 2015/0136467 A1 | 5/2015 | Rathburn |
| 2015/0162678 A1 | 6/2015 | Rathburn |
| 2015/0181810 A1 | 6/2015 | Rathburn |
| 2016/0014908 A1 | 1/2016 | Rathburn |

FOREIGN PATENT DOCUMENTS

| | | |
|---|---|---|
| JP | 3274601 | 3/2009 |
| WO | WO 1991/014015 | 9/1991 |
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO 2014/011226 | 1/2014 |
| WO | WO 2014/011228 | 1/2014 |
| WO | WO 2014/011232 | 1/2014 |
| WO | WO 2015/006393 | 1/2015 |

OTHER PUBLICATIONS

Notification of Transmittal of the International Search Report and the Written Opinion of the International Searching Authority dated Jul. 21, 2010 in International Application No. PCT/US2010/036047.

Notification of Transmittal of the International Search Report and the Written Opinion of the International Searching Authority dated Jul. 28, 2010 in International Application No. PCT/US2010/036363.

Notification of Transmittal of the International Search Report, and the Written Opinion of the International Searching Authority dated Jul. 28, 2010 in International Application No. PCT/US2010/036377.

Notification of Transmittal of the International Search Report and the Written Opinion of the International Searching Authority dated Jul. 30, 2010 in International Application No. PCT/US2010/036388.

Notification of Transmittal of the International Search Report and the Written Opinion of the International Searching Authority dated Jul. 27, 2010 in International Application No. PCT/US2010/036397.

Notification of Transmittal of the International Search Report and the Written Opinion of the International Searching Authority dated Jul. 30, 2010 in International Application No. PCT/US2010/036055.

Notification of Transmittal of the International Search Report and the Written Opinion of the International Searching Authority dated Aug. 4, 2010 in International Application No. PCT/US2010/036288.

Notification of Transmittal of the International Search Report arid the Written Opinion of the International Searching Authority dated Aug. 4, 2010 in International Application No. PCT/US2010/036285.

Notification of Transmittal of the International Search Report and the Written Opinion of the International Searching Authority dated Jul. 30, 2010 in International Application No. PCT/US2010/036282.

Notification of Transmittal of the International Search Report and the Written Opinion of the International Searching Authority dated Jul. 30, 2010 in International Application No. PCT/US2010/036295.

(56) References Cited

OTHER PUBLICATIONS

Notification of Transmittal of the International Search Report and the Written Opinion of the International Searching Authority dated Jul. 30, 2010 in International Application No. PCT/US2010/036313.
Notification of Transmittal of the International Search Report and the Written Opinion of the International Searching Authority dated Aug. 3, 2010 in International Application No. PCT/US2010/037619.
Notification of Transmittal of the International Search Report and the Written Opinion of the International Searching Authority dated Sep. 7, 2010 in International Application No. PCT/US2010/038600.
Notification of Transmittal of the International Search Report and the Written Opinion of the International Searching Authority dated Aug. 18, 2010 in International Application No. PCT/US2010/038606.
Notification of Transmittal of the International Search Report and the Written Opinion of the International Searching Authority dated Sep. 1, 2010 in International Application No. PCT/US2010/040188.
Notification of Transmittal of the International Search Report and the Written Opinion of the International Searching Authority dated Aug. 20, 2010 in International Application No. PCT/US2010/040197.
Notification of Transmittal of the International Search Report and the Written Opinion of the International Searching Authority dated Apr. 14, 2011 in International Application No. PCT/US2011/023138.
Notification of Transmittal of the International Search Report and the Written Opinion of the International Searching Authority dated Aug. 17, 2011 in International Application No. PCT/US2011/033726.
Notification of Transmittal of the International Search Report and the Written Opinion of the International Searching Authority dated Sep. 27, 2011 in International Application No. PCT/US2011/038845.
Notification of Transmittal of the International Search Report and the Written Opinion of the International Searching Authority dated Feb. 8, 2012 in International Application No. PCT/US2011/056664.
Notification of Transmittal of the International Search Report and the Written Opinion of the International Searching Authority dated Mar. 26, 2012 in International Application No. PCT/US2011/062313.
Notification of Transmittal of the International Search Report and the Written Opinion of the International Searching Authority dated Jun. 20, 2012 in International Application No. PCT/US2012/027813.
Notification of Transmittal of the International Search Report and the Written Opinion of the International Searching Authority dated Jun. 19, 2012 in International Application No. PCT/US2012/027823.
Notification of Transmittal of the International Search Report and the Written Opinion of the International Searching Authority dated Nov. 29, 2012 in International Application No. PCT/US2012/053848.
Notification of Transmittal of the International Search Report and the Written Opinion of the International Searching Authority dated Jun. 3, 2013 in International Application No. PCT/US2013/031395.
Notification of Transmittal of the International Search Report and the Written Opinion of the International,Searching Authority dated Jun. 19, 2013 in International Application No. PCT/US2013/030981.
Notification of Transmittal of the International Search Report and the Written Opinion of the International Searching Authority dated Jun. 7, 2013 in International Application No. PCT/US2013/030856.
Notification of Transmittal of the International Search Report and the Written Opinion of the International Searching Authority dated Oct. 27, 2014 in International Application No. PCT/US2014/045856.
Tarzwell, Robert, "A Real Printed Electronic Replacement for PCB Fabrication," PCB007 Magazine, May 19, 2009.
Tarzwell, Robert. "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Liu, et al, "All-Polymer Capacitor Fabricated With Inkjet Printing Technique," Solid-State Electronics, vol. 47, pp. 1543-1548 (2003).
Print—Definition of Print by The Free Dictionary. htttp://www.thefreedictionary.com/print. Aug. 13, 2014.
European Search Report for EP 16 16 2703 A3 dated Sep. 9, 2016.
European Search Report for EP 14 82 2548 dated Nov. 2, 2016.
European Patent Office Article 94(3) Communication in Application No. 16162703.9 dated Feb. 26, 2020.
U.S. Appl. No. 13/266,486, filed Oct. 27, 2011, 2012/0055701, U.S. Pat. No. 8,955,215, High Performance Surface Mount Electrical Interconnect.
U.S. Appl. No. 14/621,663, filed Feb. 13, 2015, 2015/0162678, U.S. Pat. No. 9,660,368, High Performance Surface Mount Electrical Interconnect.
U.S. Appl. No. 13/266,522, filed Oct. 27, 2011, 2012/0068727, U.S. Pat. No. 8,803,539, Compliant Wafer Level Probe Assembly.
U.S. Appl. No. 13/266,573, filed Oct. 27, 2011, 2012/0061846, U.S. Pat. No. 9,054,097, Compliant Printed Circuit Area Array Semiconductor Device Package.
U.S. Appl. No. 13/266,907, filed Oct. 28, 2011, 2012/0268155, U.S. Pat. No. 8,928,344, Compliant Printed Circuit Socket Diagnostic Tool.
U.S. Appl. No. 13/318,038, filed Oct. 28, 2011, 2012/0062270, U.S. Pat. No. 8,912,812, Compliant Printed Circuit Wafer Probe Diagnostic Tool.
U.S. Appl. No. 13/318,171, filed Oct. 31, 2011, 2012/0049877, U.S. Pat. No. 8,789,272, Compliant Printed Circuit Peripheral Lead Semiconductor Test Socket.
U.S. Appl. No. 13/318,181, filed Oct. 31, 2011, 2012/0044659, U.S. Pat. No. 8,955,216, Compliant Printed Circuit Peripheral Lead Seimconductor Package.
U.S. Appl. No. 13/318,200, filed Oct. 31, 2011, 2012/0056332, U.S. Pat. No. 9,136,196, Compliant Printed Circuit Wafer Level Semiconductor Package.
U.S. Appl. No. 13/318,263, filed Oct. 31, 2011, 2012/0043667, U.S. Pat. No. 8,618,649, Compliant Printed Circuit Semiconductor Package.
U.S. Appl. No. 14/086,029, filed Nov. 21, 2013, 2014/0080258, U.S. Pat. No. 9,076,884, Compliant Printed Circuit Semiconductor Package.
U.S. Appl. No. 13/320,285, filed Nov. 14, 2011, 2012/005702, U.S. Pat. No. 9,414,500, Compliant Printed Flexible Circuit.
U.S. Appl. No. 13/318,369, filed Nov. 1, 2011, 2012/0043119, U.S. Pat. No. 9,277,654, Composite Polymer-Metal Electrical Contacts.
U.S. Appl. No. 13/318,382, filed Nov. 1, 2011, 2012/0043130, U.S. Pat. No. 9,231,328, Resilient Conductive Electrical Interconnect.
U.S. Appl. No. 13/319,120, filed Nov. 7, 2011, 2012/0061851, U.S. Pat. No. 8,981,568, Simulated Wirebond Semiconductor Pakage.
U.S. Appl. No. 13/319,145, filed Nov. 7, 2011, 2012/0049342, U.S. Pat. No. 8,970,031, Semiconductor Die Terminal.
U.S. Appl. No. 13/319,158, filed Nov. 7, 2011, 2012/0051016, U.S. Pat. No. 9,320,144, Semiconductor Socket.
U.S. Appl. No. 13/319,203, filed Nov. 7, 2011, 2012/0056640, U.S. Pat. No. 8,981,809, Compliant Printed Circuit Semiconductor Tester Interface.
U.S. Appl. No. 13/319,228, filed Nov. 7, 2011, 2012/0058653, U.S. Pat. No. 8/984,748, Singulated Semiconductor Device Separable Electrical Interconnect.
U.S. Appl. No. 13/575,368, filed Jul. 26, 2012, 2013/0203273, Abandoned, High Speed Backplane Connector.
U.S. Appl. No. 13/643,436, filed Oct. 25, 2012, 2013/0105984, U.S. Pat. No. 9,184,145, Semiconductor Device Package Adapter.

(56) References Cited

OTHER PUBLICATIONS

U.S. Appl. No. 13/700 639, filed Nov. 28, 2012, 2013/0078860, U.S. Pat. No. 9,184,527, Electrical Connector Insulator Housing.
U.S. Appl. No. 13/879,783, filed Apr. 16, 2013, 2013/0223034, U.S. Pat. No. 9,232,654, High Performance Electrical Circuit Structure.
U.S. Appl. No. 13/879,883, filed Apr. 17, 2013, 2013/0244490, U.S. Pat. No. 9,093,767, High Performance Surface Mount Electrical Interconnect.
U.S. Appl. No. 13/880,231, filed Apr. 18, 2013, 2013/0210276, U.S. Pat. No. 9,276,339, Electrical Interconnect IC Device Socket.
U.S. Appl. No. 13/880,461, filed Apr. 19, 2013, 2013/0206468, U.S. Pat. No. 9,320,133, Electrical Interconnect IC Device Socket.
U.S. Appl. No. 13/410,914, filed Mar. 2, 2012, 2012/0164888, U.S. Pat. No. 9,276,336, Metalized Pad to Electrical Contact Interface.
U.S. Appl. No. 13/410,943, filed Mar. 2, 2012, 2012/0161317, U.S. Pat. No. 9,613,841, Area Array Semiconductor Device Package Interconnect Structure With Optional Package-to-Package or Flexible Circuit to Package Connection.
U.S. Appl. No. 13/412,870, filed Mar. 6, 2012, 2012/0171907, U.S. Pat. No. 8,758,067, Selective Metalization of Electrical Connector or Socket Housing.
U.S. Appl. No. 14/271,801, filed May 7, 2014, 2014/0242816, U.S. Pat. No. 9,350,093, Selective Metalization of Electrical Connector or Socket Housing.
U.S. Appl. No. 13/413,032, filed Mar. 6, 2012, 2012/0182035, U.S. Pat. No. 8,988,093, Bumped Semiconductor Wafer or Die Level Electrical Interconnect.
U.S. Appl. No. 13/413,724, filed Mar. 7, 2012, 2012/0168948, U.S. Pat. No. 8,987,886, Copper Pillar Full Metal Via Electrical Circuit Structure.
U.S. Appl. No. 14/255,083, filed Apr. 17, 2014, 2014/0225255, U.S. Pat. No. 9,930,775, Copper Pillar Full Metal Via Electrical Circuit Structure.
U.S. Appl. No. 13/418,853, filed Mar. 13, 2012, 2012/0244728, U.S. Pat. No. 9,196,980, High Performance Surface Mount Electrical Interconnect With External Biased Normal Force Loading.
U.S. Appl. No. 13/448 865, filed Apr. 17, 2012, 2012/0199985, U.S. Pat. No. 8,610,265, Compliant Conductive Nano-Particle Electrical Interconnect.
U.S. Appl. No. 14/058,863, filed Oct. 21, 2013, 2014/0043782, U.S. Pat. No. 8,829,671, Compliant Core Peripheral Lead Semiconductor Socket.
U.S. Appl. No. 13/448,914, filed Apr. 17, 2012, 2012/0202364, U.S. Pat. No. 8,525,346, Compliant Core Peripheral Lead Semiconductor Test Socket.
U.S. Appl. No. 13/969,953, filed Aug. 19, 2013, 2013/0330942, U.S. Pat. No. 8,704,377, Compliant Conductive Nano-Particle Electrical Interconnect.
U.S. Appl. No. 14/138,638, filed Feb. 12, 2014, 2014/0192498, U.S. Pat. No. 9,603,249, Direct Metalization of Electrical Circuit Structure.
U.S. Appl. No. 14/408,205, filed Dec. 15, 2014, 2015/0181710, U.S. Pat. No. 9,699,906, Hybrid Printed Circuit Assembly With Low Density Main Core and Embedded High Density Circuit Regions.
U.S. Appl. No. 14/408,039, filed Dec. 15, 2014, 2015/0136467, U.S. Pat. No. 9,350, 124, High Speed Circuit Assembly With Integral Terminal and Mating Bias Loading Electrical Connector Assembly.
U.S. Appl. No. 14/408,338, filed Dec. 16, 2014, 2015/0279768, U.S. Pat. No. 9,536,815, Semiconductor Socket With Direct Selective Metalization.
U.S. Appl. No. 14/254,038, filed Apr. 16, 2014, 2014/0220797, U.S. Pat. No. 9,318,862, High Performance Electrical Connector With Translated Insulator Contact Positioning.
U.S. Appl. No. 14/327,916, filed Jul. 10, 2014, 2015/0013901, Matrix Defined Electrical Circuit Structure.
U.S. Appl. No. 14/864,215, filed Sep. 24, 2015, 2016/0014908, U.S. Pat. No. 10,159,154, Fusion Bonded Liquid Crystal Polymer Electrical Structure.
U.S. Appl. No. 14/565,724, filed Dec. 10, 2014, 2015/0091600, U.S. Pat. No. 9,689,897, Performance Enhanced Semiconductor Socket.
U.S. Appl. No. 15/062,136, filed Mar. 6, 2016, U.S. Pat. No. 9,559,447, Mechanical Contact Retention Within an Electrical Connector.
U.S. Appl. No. 15/062,137, filed Mar. 6, 2016, U.S. Pat. No. 9,761,520, Electrodeposited Contact Terminal for Use as an Electrical Connector or Semiconductor Packaging Substrate.
U.S. Appl. No. 15/070,026, filed Mar. 15, 2016, 2016/0212862, Fusion Bonded Formable Liquid Crystal Polymer Electrical Circuit Structure.
U.S. Appl. No. 15/062,138, filed Mar. 6, 2015, U.S. Pat. No. 9,755,335, Low Profile Electrical Interconnect With Fusion Bonded Contact Retention and Solder Wick Prevention.

\* cited by examiner

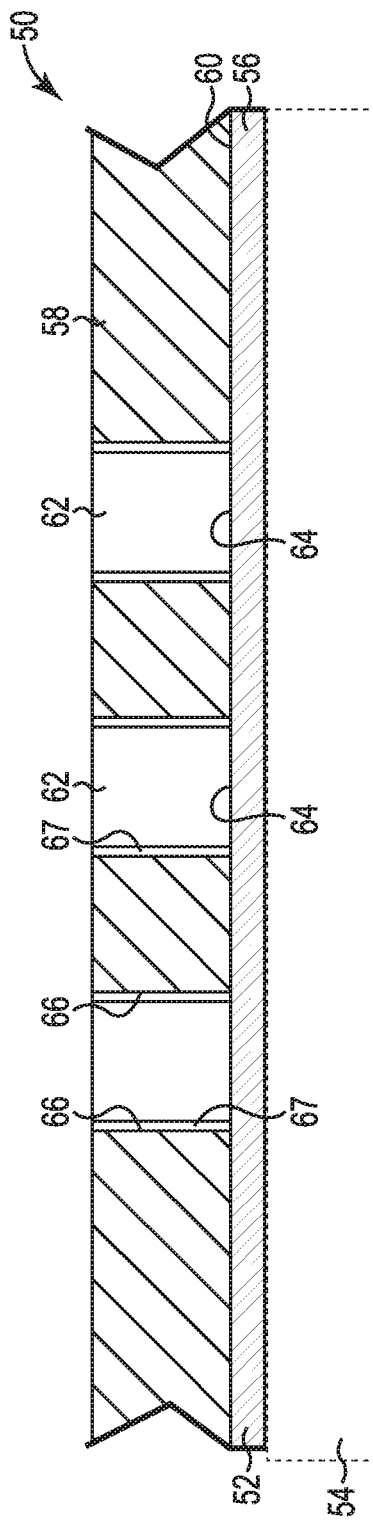
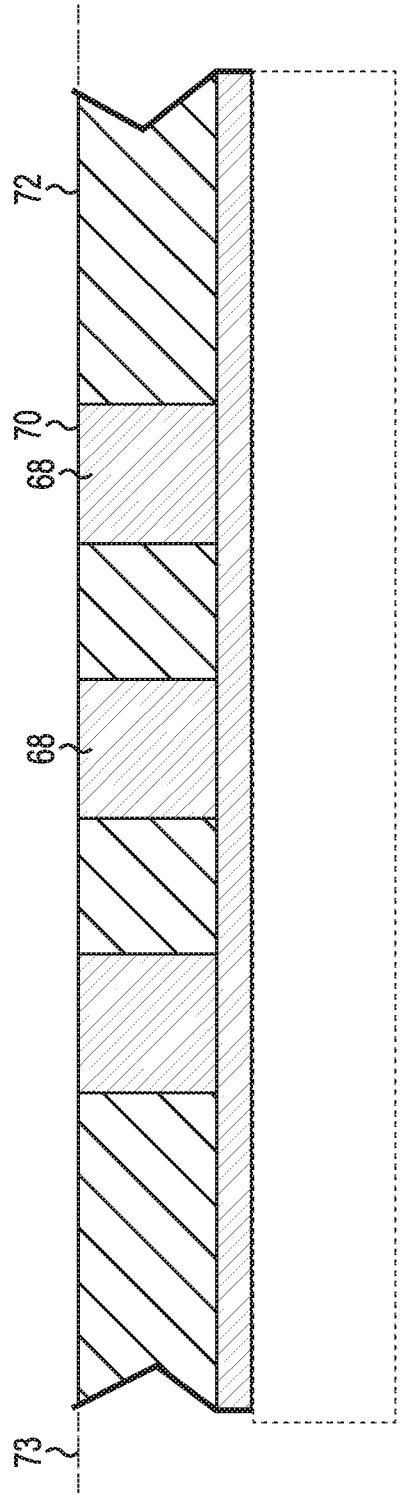
Fig. 1
Fig. 2

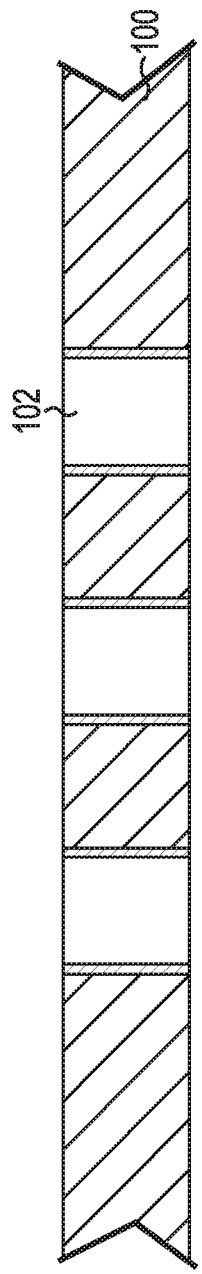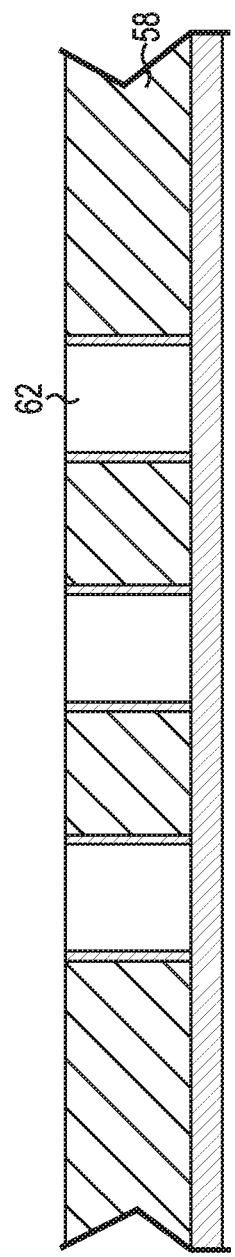
Fig. 7
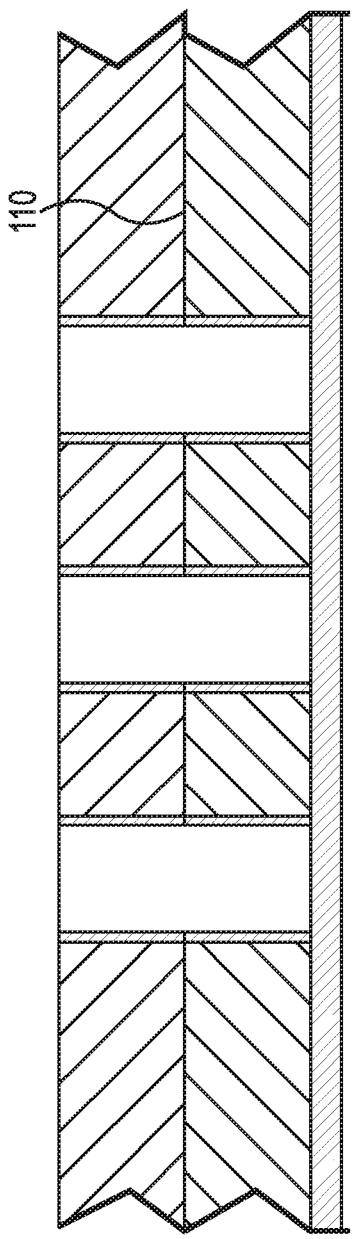
Fig. 8

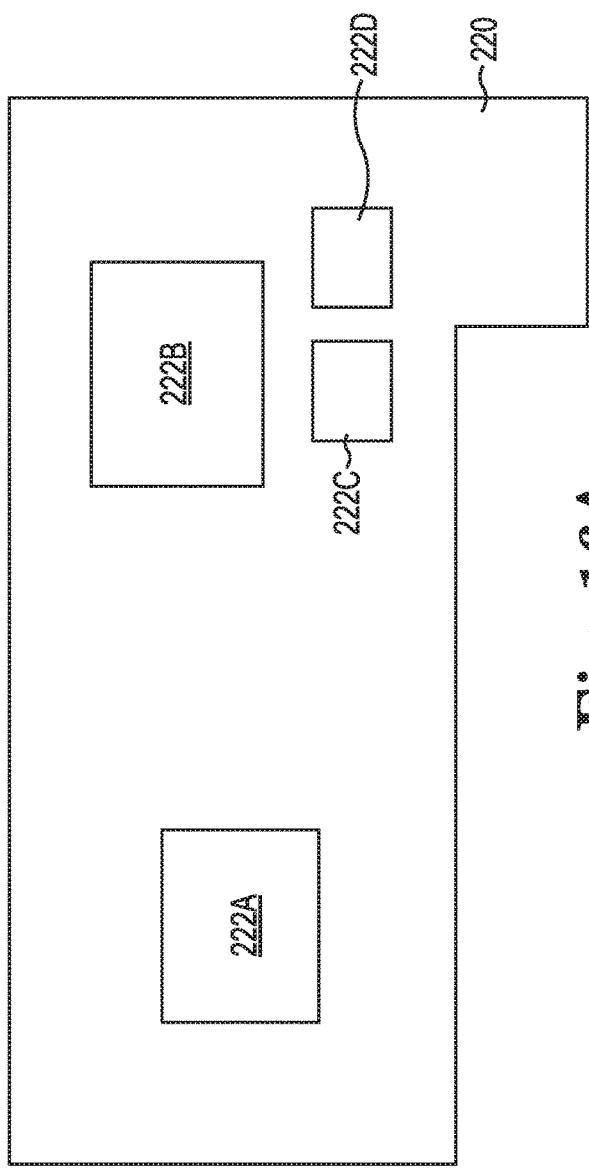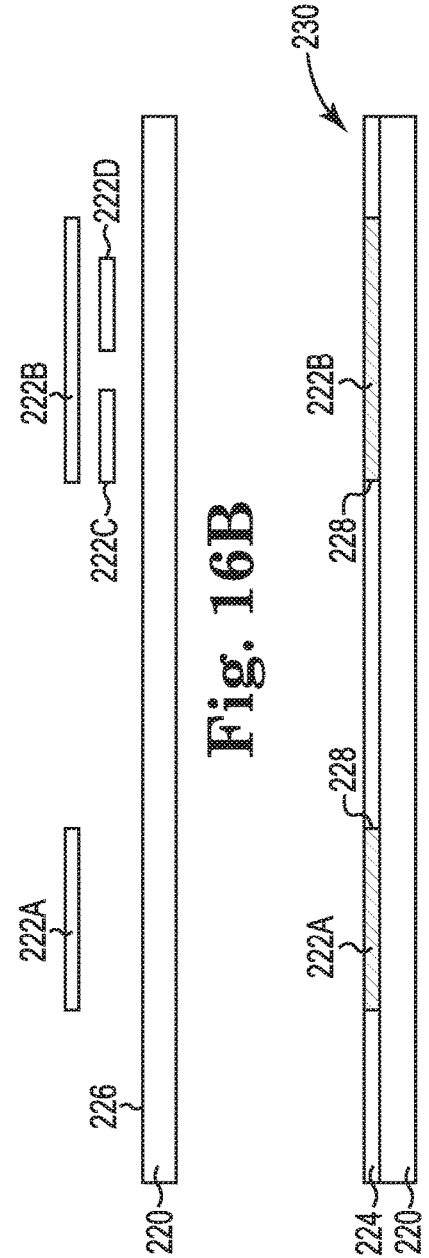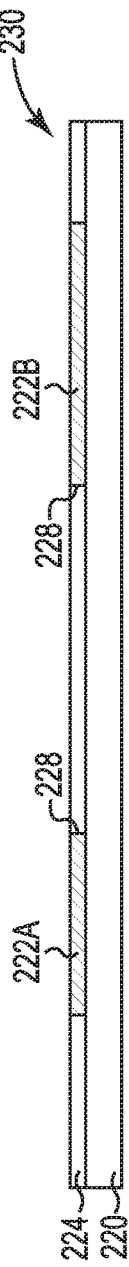
Fig. 16A
Fig. 16B
Fig. 16C

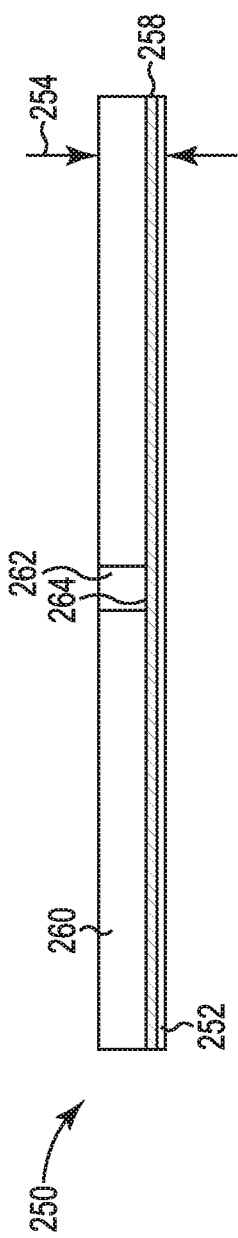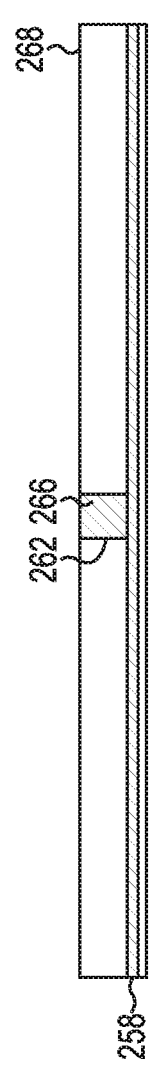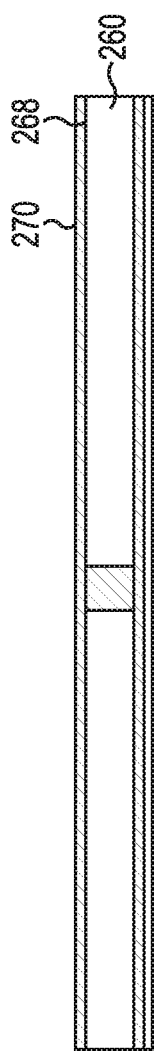

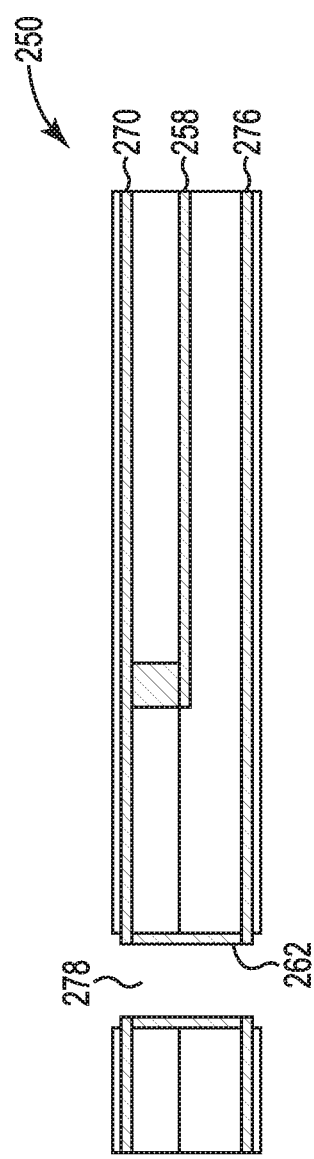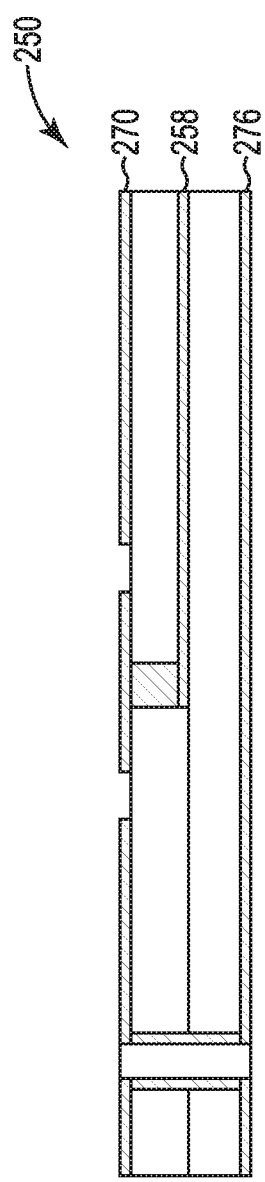

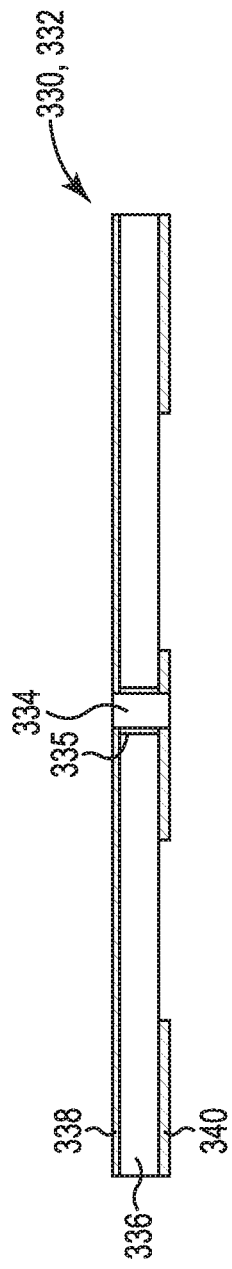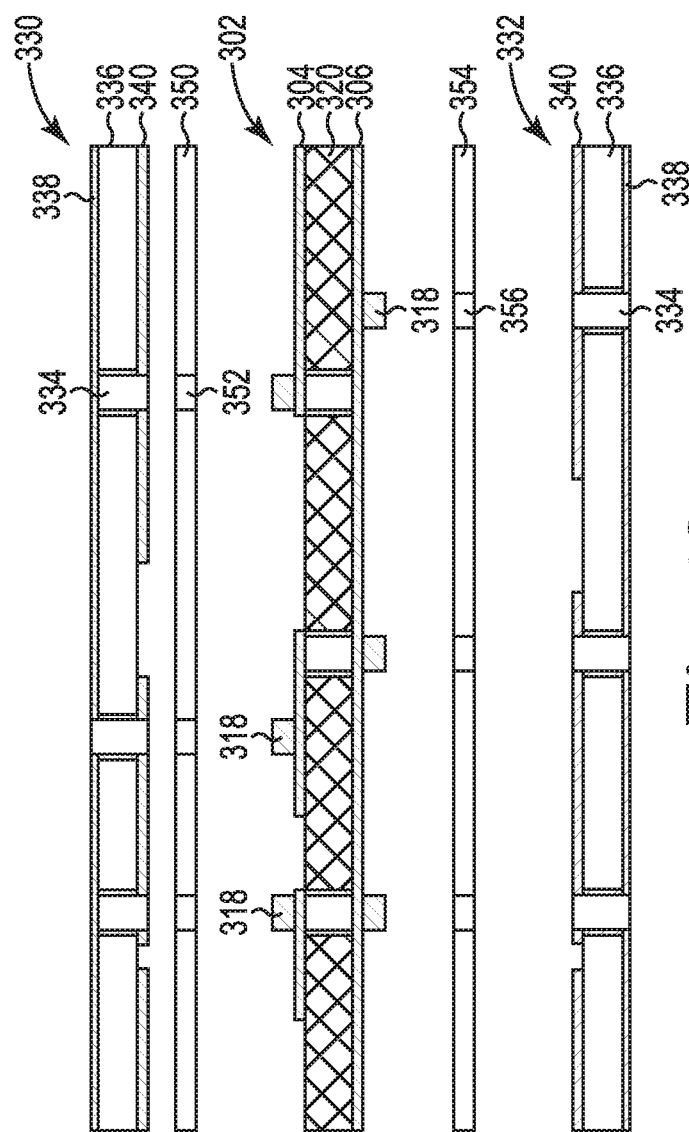

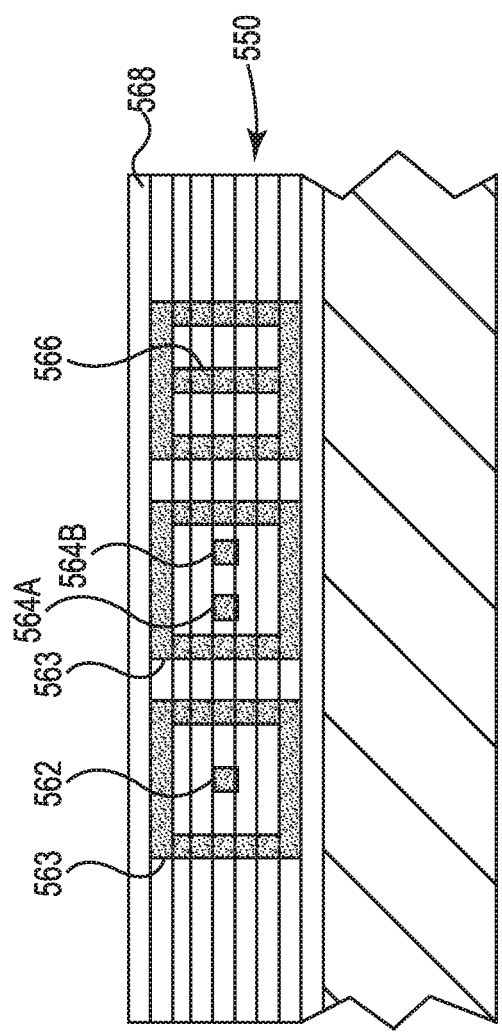

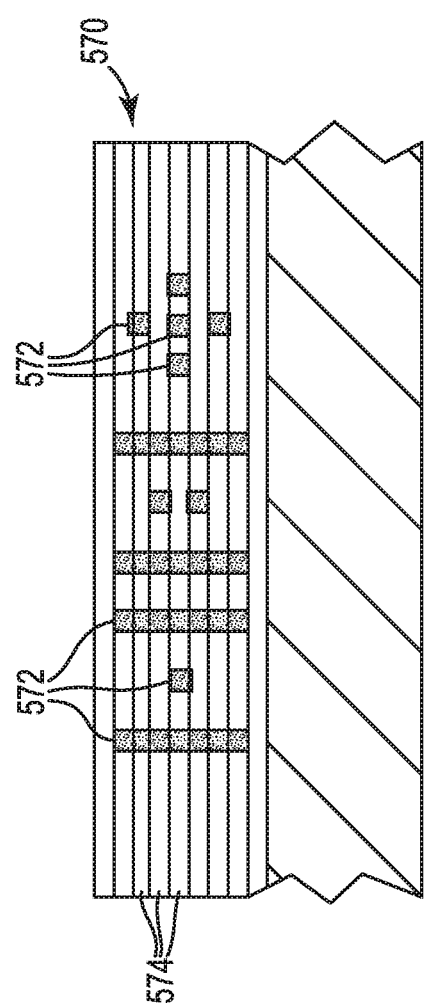

METHOD OF MAKING A FUSION BONDED CIRCUIT STRUCTURE

CROSS-REFERENCE TO RELATED APPLICATIONS

This application claims the benefit of United Provisional Application No. 62/441,617, filed Jan. 3, 2017, entitled High Density, High Performance Electrical Interconnect Circuit Structure, the entire disclosures of which are hereby incorporated by reference.

This application is a continuation in part of U.S. application Ser. No. 15/070,026, filed Mar. 15, 2016, now U.S. Pat. No. 10,506,722, entitled Fusion Bonded Liquid Crystal Polymer Electrical Circuit Structure, which claims the benefit of U.S. Provisional Application No. 62/140,038, filed Mar. 30, 2015, the entire disclosures of which are hereby incorporated by reference.

This application is a continuant-in-part of U.S. application Ser. No. 14/864,215, filed Sep. 24, 2015, now U.S. Pat. No. 10,159,154, entitled Fusion Bonded Liquid Crystal Polymer Circuit Structure, which claims the benefit of a national stage application under 35 U.S.C. 371 of International Application No. PCT/US2014/045856, entitled FUSION BONDED LIQUID CRYSTAL POLYMER ELECTRIC CIRCUIT STRUCTURE, filed Jul. 9, 2014, which claims priority to U.S. Provisional Application Nos. 61/845,088, filed Jul. 11, 2013 and 61/915,194 filed Dec. 12, 2013, the disclosures of which are hereby incorporated by reference.

TECHNICAL FIELD

The present disclosure relates to an electrical circuit structure constructed using a liquid crystal polymer ("LCP") dielectric material, and a corresponding methods that merge processes for printed circuit boards ("PCB") and semiconductor processing.

BACKGROUND OF THE INVENTION

As semiconductor and electronics markets have progressed, several technical factors have emerged that have significant impact to the electrical interconnects for "systems" whether they be computer, handset, tablet, automotive, medical, telecomm, data centers. Extreme increases in data traffic driven by internet, streaming video, smart phone, tablet and cloud computing are driving need for significant increases in bandwidth. Increases in data rate and functionality are driving significant wide scale architecture evolution. Advances in semiconductor packaging are driving significant density and routing challenges. Power and thermal management are challenges with low voltage systems to preserve battery life. Advances in semiconductor geometries have outpaced printed circuit geometries.

Traditional printed circuits are often constructed in what is commonly called rigid or flexible formats. The rigid versions are used in nearly every electronic system, where the printed circuit board (PCB) is essentially a laminate of materials and circuits that when built is relatively stiff or rigid and cannot be bent significantly without damage.

Flexible circuits have become very popular in many applications where the ability to bend the circuit to connect one member of a system to another has some benefit. These flexible circuits are made in a very similar fashion as rigid PCB's, where layers of circuitry and dielectric materials are laminated. The main difference is the material set used for construction. Typical flexible circuits start with a polymer film that is clad, laminated, or deposited with copper. A photolithography image with the desired circuitry geometry is printed onto the copper, and the polymer film is etched to remove the unwanted copper.

Flexible circuits are processed similar to that of rigid PCB's with a series of imaging, masking, drilling, via creation, plating, and trimming steps. The resulting circuit can be bent, without damaging the copper circuitry. Flexible circuits are solderable, and can have devices attached to provide some desired function. The materials used to make flexible circuits can be used in high frequency applications where the material set and design features can often provide better electrical performance than a comparable rigid circuit. Flexible circuits are very commonly used in many electronic systems such as notebook computers, medical devices, displays, handheld devices, autos, aircraft and many others.

Flexible circuits are connected to electrical system in a variety of ways. In most cases, a portion of the circuitry is exposed to create a connection point. Once exposed, the circuitry can be connected to another circuit or component by soldering, conductive adhesive, thermo-sonic welding, pressure or a mechanical connector. In general, the terminals are located on an end of the flexible circuit, where edge traces are exposed or in some cases an area array of terminals are exposed. Often there is some sort of mechanical enhancement at or near the connection to prevent the joints from being disconnected during use or flexure.

In general, flexible circuits are expensive compared to some rigid PCB products. Flexible circuits also have some limitations regarding layer count or feature registration, and are therefore generally only used for small or elongated applications.

Rigid PCBs and package substrates experience challenges as the feature sizes and line spacing are reduced to achieve further miniaturization and increased circuit density. The use of laser ablation has become increasingly used to create via structures for fine line or fine pitch structures. The use of lasers allows localized structure creation, where the processed circuits are plated together to create via connections from one layer to another. As density increases, however, laser processed via structures can experience significant taper, carbon contamination, layer-to-layer shorting during the plating process due to registration issues, and high resistance interconnections that may be prone to result in reliability issues. The challenge of making fine line PCBs often relates to the difficulty in creating very small or blind and buried vias.

The printed circuit industry has been driven by the mobile and handset market to achieve finer lines and spaces with higher density. The domestic circuit market has adopted laser direct imaging systems and laser drilled micro-vias over the last several years as advancements in fabrication techniques. In general, domestic suppliers can supply 75 micron lines and spaces with multi-layer construction, with the availability of 50 micron lines and spaces in some cases. The supplier pool is dramatically reduced below 50 micron lines and spaces, with blind and buried vias likely required.

Material sets available to traditional fabrication combined with the line and space capabilities drive the overall stack up for impedance control. For high speed applications, loss associated with glass weave and solder mask are an issue, and conventional via technology has become a major source of impedance mismatch and signal parasitic effects.

In general, signal integrity, high aspect ratio vias and line and space requirements limit the relationship between semiconductor packaging and the printed circuit board the chips are mounted to. Whether the application is a multi-layer rigid PCB, a flex circuit, or rigid flex there is a need for a high speed high density alternative.

BRIEF SUMMARY OF THE INVENTION

The present disclosure uses a liquid crystal polymer ("LCP") material as a circuit bearing dielectric material. The LCP can be used in several forms, such as a cast film, an injection molded coupon or wafer as well as in liquid resin form or a composite liquid material that includes LCP particles.

The present disclosure is directed to creating a circuit architecture that uses LCP material in ways that can be processed with the same equipment used to produce conventional circuits, as well as the laser system used to produce connector and socket products. LCP has properties that make it ideal for high speed circuit fabrication. LCP have a low dielectric constant of 2.9 and is virtually impermeable to moisture. The ablation point is well suited for UV laser processing, and it has the unique availability of multiple melting temperatures. The present disclosure leverages those properties to create a method of creating circuits where the LCP material can either be pre-clad with copper or processed to accept electro-less copper deposition and fusion bonded using conventional lamination techniques.

The present disclosure is directed to a method of making a fusion bonded circuit structure. First and second major surface of a substrate are provided with first and second seed layers of a conductive material about 5 microns or less thick. First and second resist layers are deposited on the first and second major surfaces of the first LCP substrate, respectively. The first and second resist layers are processed to create a plurality of first and second recesses corresponding to a desired first and second circuitry layers. The first and second recesses expose portions of the first and second seed layers of conductive material, respectively. The first and second major surfaces of the substrate are simultaneously electroplated to create first and second conductive traces defined by the first and second recesses, respectively. The first and second seed layers of conductive material act as an electrical bus for the electroplating process. The first, and second resist layers are removed to reveal the first and second conductive traces. The first LCP substrate is etched to remove exposed portions of the first and second seed layers of conductive material adjacent the first and second conductive traces, respectively. Unetched portions of the first and second seed layers of conductive material remain between the first and second conductive traces and the first LCP substrate. First and second LCP layers are fusion bonded to the first and second major surface of the first LCP substrate to encapsulate the first and second conductive traces in an LCP material.

A first resist layer is deposited on the seed layer of conductive material that serves as an electrical bus for the electroplating process. The first resist layer is processed to create first recesses corresponding to a desired first circuitry layer. The first recesses expose portions of the seed layer of conductive material. The substrate is electroplated to create first conductive traces defined by the first recesses. The first resist layer is removed to reveal the first conductive traces. The substrate is etched to remove exposed portions of the seed layer of conductive material adjacent the first conductive traces. A portion of the seed layer of conductive material remains between the first conductive traces and the substrate. A first layer of LCP is fusion boned to the first major surface of the substrate to encapsulate the first conductive traces in an LCP material.

In an alternate embodiment, the first layer is an alternate fusion bonding material that encapsulates the first conductive traces. The first substrate and the first fusion bonding layer preferably have dielectric constants that differ less than about 20%, and more preferably differ less than about 10%.

The first resist layer is preferably deposited as a liquid and imaged to create the first recesses. The first conductive traces can have a pitch in the range of about 25 microns and a thickness of about 0.001 inches. The first conductive traces have a generally rectangular cross-sectional shape, with minimal undercuts. In one embodiment, the first conductive traces are planarized before the step of removing the first resist layer.

In some embodiments, a laser is used to drill a plurality of first vias through the first layer of LCP to the first conductive traces. Bulk plating is deposited in the plurality of first vias to form a plurality of conductive pillars of solid metal that substantially fill the vias. In one embodiment, electro-less plating is applied to the first vias before the electrolytic plating is deposited. A second circuitry layer is optionally attached to the first major surface of the substrate. The conductive pillars are used to electrically couple to the second circuitry layer.

The nature of the present process provides the potential for significant enhancement to traditional circuit techniques not generally possible with the normal circuit fabrication process alone. By combining methods used in the PCB fab and semiconductor packaging industries, the present disclosure enables fine line high density circuit structures not currently produced with attractive cost of manufacture. In addition, the high density circuit can be treated as a system of its own by incorporating printed transistors or other passive and active function.

The present disclosure permits the creation of circuit structures with lines and spaces below 50 micron, and preferably below 20 microns, and supports signal integrity beyond 40 GHz. The material sets can be processed with conventional circuit fabrication techniques and equipment. The solid metal vias provide superior electrical performance over conventional barrel plated or micro vias. The present disclosure is applicable to rigid, flexible and rigid flex circuits, as well as semiconductor packaging.

The present disclosure permits bulk conductive material to be added to create a very small low resistance vias to increase density and reduce line and feature pitch of the high density circuit. The printed circuit can be produced to replicate a traditional circuit, or it can be an interconnect to one or more members of a system embedded or incorporated.

BRIEF DESCRIPTION OF THE SEVERAL VIEWS OF THE DRAWING

FIG. 1 is a side-sectional view of a method of making a high density circuit structure in accordance with an embodiment of the present disclosure.

FIG. 2 is a side-sectional view of the high density circuit structure of FIG. 1 with a full metal via in accordance with an embodiment of the present disclosure.

FIG. 7 is a side-sectional view of an alternate discrete layer to be added to the high density circuit structure in accordance with an embodiment of the present disclosure.

FIG. 8 is a side-sectional view of the discrete layer of FIG. 5 fused to the high density circuit structure in accordance with an embodiment of the present disclosure.

FIGS. 16A and 16B are top and side views of a plurality of high density circuit structures combined with a low density PCB in accordance with an embodiment of the present disclosure.

FIG. 16C is a side view of the PCB merged with the high density circuit structures in accordance with an embodiment of the present disclosure.

FIGS. 17A through 17G are side sectional views of an alternate method of constructing an alternate high density circuit structure in accordance with an embodiment of the present disclosure.

FIGS. 18A through 18D are side sectional views of another alternate method of constructing an alternate high density circuit structure in accordance with an embodiment of the present disclosure.

FIG. 19 is a side sectional view of a method of fusion bonding a plurality of circuit layers in accordance with an embodiment of the present disclosure.

FIGS. 25A through 25C illustrate various coaxial conductive structures in a circuit structure in accordance with an embodiment of the present disclosure.

DETAILED DESCRIPTION OF THE INVENTION

Figure 3:
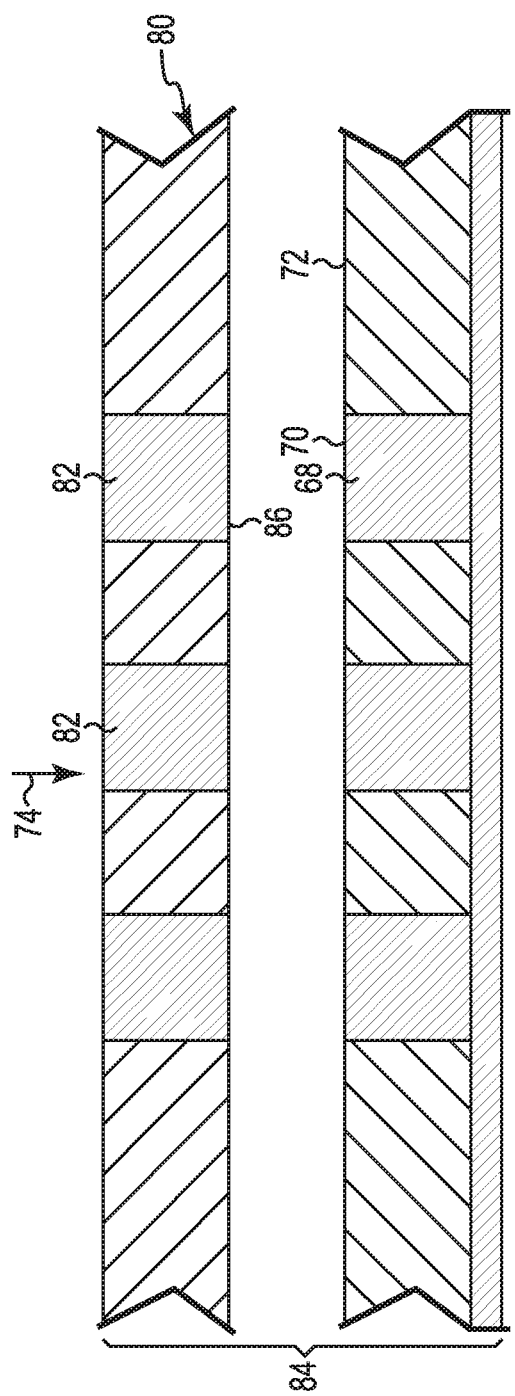
FIG. 3 is a side-sectional view of a discrete layer to be added to the high density circuit structure of FIG. 2 in accordance with an embodiment of the present disclosure.

The present high density high performance circuit structure can be configured as a low cost, high signal performance electrical interconnect assembly, which has a low profile that is particularly useful for desktop and mobile PC applications. In another embodiment, the high density circuit structure can also be a portion of a socket or semiconductor package.

Liquid crystal polymers ("LCP") are a preferred dielectric material of producing the high density, higher performance multi-layer electrical circuits of the present disclosure. The LCP has favorable properties for directly attaching bare die silicon devices, integrated circuits, antenna, and other electrical components ("IC device") on a very fine termination pitch. LCP can be used in applications with a method called fusion bonding where the base LCP material is laminated with sufficient heat and pressure to cause multiple layers of LCP to bond to each other or fuse to resemble a contiguous material set consisting of LCP. The lamination control of these structures is critical such that the material is processed close to melt temperature without escaping into the liquid phase and a resulting loss of definition, material movement, circuit movement and circuit embossing. Several variants of LCP are available with multiple melt temperatures providing some latitude in lamination temperature and pressure ranges. LCP also has optical properties that allow subsequent layers to registered to circuit geometry in previous layers.

A limitation of this use of LCP is reached when a circuit stack beyond 4 to 5 layers is desired with fine circuit geometry contained within the stack. The sequential lamination required to build multi-layer constructions challenges the material set where previously created fusion bond interfaces weaken and embedded circuitry is disrupted. The physical bond of the LCP to LCP can be disrupted, and in general the bond of LCP to copper is inadequate to survive required reliability in many cases resulting in delamination.

The disclosure is directed to using a liquid crystal polymer material as a circuit bearing dielectric material. The disclosure proposed a combination of LCP films, dielectric material either in liquid form (and subsequently cured) or sheet form, and a series of additive and subtractive steps to create very thin high performance circuit structures that can replicate or replace conventional technologies as well as provide opportunity for increased circuit density. LCP material has many benefits from an electrical and mechanical standpoint. It has a lower dielectric constant than traditional materials, can be processed to accept direct metal deposition, does not absorb moisture, and has low loss at high frequency.

Another aspect of this disclosure is the ability to precisely control the dielectric separation between layers by adding a feature or material supporting member outside of the desired circuit pattern region such that a specific thickness control or hard stop is created to prevent lamination variance. This thickness control feature can be external to the field of circuit creation or it can be a component that becomes embedded within the circuit stack but not in the circuit regions and is cut away when the finished circuit stack is routed.

Another aspect of the disclosure is the ability to start with a given thickness of LCP and apply heat and controlled pressure to reduce the thickness of the base LCP to a specific desired dielectric thickness prior to incorporating into a circuit stack in an effort to precisely control the separation relative the circuit patterns for impedance match. The resultant thinning can also be accomplished with a plasma removal of excess material.

FIG. 1 is a side cross-sectional view of a method of making the circuit structure 50 in accordance with an embodiment of the present disclosure. A copper foil 52 is preferably supported by base layer 54. The base layer 54 can be a sacrificial member that is removed at some point later in the process.

If the end product is a flexible circuit, the base layer 54 can be a material such as polyimide or liquid crystal polymer. If the final product is a rigid circuit board, the base layer 54 can be FR4 or one of many high speed laminates or substrates. If the final product is a semiconductor package, the base layer 54 can be a material such as FR4, BT resin of any one of a variety of laminate or substrate materials. In the illustrated embodiment, the copper foil 52 can be preformed circuitry layer 56 or can be formed using a fine line imaging step to etch copper foil as is done with many PCB processes. The circuitry layer 56 can include fine line etching with spacing between copper traces of about 25 microns. It will be appreciated that conventional copper etching may be used to pattern thicker copper sheets (e.g., ¼ ounce to ½ ounce), followed by fusion bonding of layers as discussed herein.

A fusion bonding material 58 is then applied to the surface 60. The fusion bonding material 58 can be a liquid crystal polymer ("LCP"), a derivation of LCP, a thermoplastic material with a melt or extrusion temperature lower than that of the base layer 54 such that the base layer 54 does not flow or extrude significantly during the fusion bonding process. The fusion bonding material 58 preferably has a dielectric constant approximating that of LCP so the resulting high aspect ratio conductive traces and vias are surrounded by a like or common dielectric constant material. In one embodiment, the fusion bonding material 58 has a dielectric constant within about 20%, and more preferably within 10% of the dielectric constant of the base layer 54.

In the illustrated embodiment, liquid crystal polymer 58 is applied to surface 60 such that the circuitry 56 is at least partially in contact with the LCP 58. The LCP layer 58 may be a film or a liquid. The LCP layer 58 can be applied by screen printing, stencil printing, jetting, flooding, spraying etc. The LCP material is then imaged to create the recesses or vias 62 that expose the circuit locations 64. One benefit of imaging the LCP 58 is that the vias 62 do not need to be round as with traditional drilled vias. Any shape that can be imaged and will result in a grown full metal via 68 of the desired shape. Alternatively, the recesses or vias 62 can be formed using a laser direct imaging process known as LDI.

Liquid crystal polymers are a class of aromatic polyester polymers that are extremely unreactive and inert so as to be useful for electrical applications. Liquid-crystal polymers are available in melted/liquid or solid form. In solid form the main example of lyotropic LCPs is the commercial aramid known as Kevlar. In a similar way, several series of thermotropic LCPs have been commercially produced by several companies (e.g., Vectran/Ticona). LCP materials have a dielectric constant (K) of about 2.9 at a frequency of about 20 GHz, a co-efficient of thermal expansion of about 8 to about 17 ppm/degree C., and a dimensional stability of less than about 0.1%.

In one embodiment, the core LCP material 58 is processed to enable electro-less copper plating to adhere to the side walls 66 of the recesses 62, such as by using one or more of plasma treatment, permanganate, carbon treatment, impregnating copper nano-particles to activate the surfaces 66 to promote electroplating. The electro-less copper plating applied to the side walls 66 creates conductive structures 67 that are electrically coupled to the circuit layer 56. Additional discussion of the use of electro-less plating of the dielectric structure is disclosed in Ser. No. 14/238,638, filed Feb. 12, 2014, and entitled DIRECT METALIZATION OF ELECTRICAL CIRCUIT STRUCTURES, the entire of disclosure of which is hereby incorporated by reference.

As illustrated in FIG. 2, higher deposition rate electroplate copper can be used to fill the recess 62 with bulk copper to grow a full metal, solid copper pillar or via structure 68 within the recesses 62. The conductivity of the bulk copper pillar 68 is on the order of about $1.68 \times 10^{-6}$ ohm-cm. Additional discussion of the full metal, solid copper pillars is found in Ser. No. 13/413,724, entitled Copper Pillar Full Metal Via Electrical Circuit Structure filed Mar. 7, 2012, which is hereby incorporated by reference.

In another embodiment, the circuitry layer 56 is used to electroplate the circuit locations 64. The copper plating 68 adheres primarily to the base copper 58 at the locations 64. The LCP 58 and base layer 54 act as a resist to prevent copper plating except in the recesses 62. The resulting copper pillar 68 is preferably a solid copper structure, without voids.

The plating process can be controlled to a certain degree, but in some cases with fine pitch geometries and high speed circuits, the upper surfaces 70 of the copper pillars 68 may vary in topography or height relative to the exposed surface 72 of the LCP. Also, the LCP may vary in thickness slightly especially if liquid material is used. The copper pillars 68 are preferably planarized and the thickness of the LCP controlled between steps if needed to create a controlled dimension and flat reference plane 73 for the subsequent processing steps and layers.

For higher aspect ratio via connections 68, the process can be performed in a number of steps. For example, another layer of LCP 58 can be applied and imaged to expose the upper surfaces 70 of the previous copper pillars 68, with the next plating step increasing the height of the copper pillar 68 incrementally. Planarization is preferably performed between each layer.

FIG. 3 illustrates another embodiment for creating higher aspect ratio via connections. Discrete LCP layer 80 is imaged and plated to create an array of copper pillars 82, as discussed herein. The layer 80 is then registered so the lower surfaces 86 of the copper pillars 82 are aligned with the upper surfaces 70 of the copper pillars 68. The stack 84 is then fusion bonded using heat and pressure 74.

Figure 4:
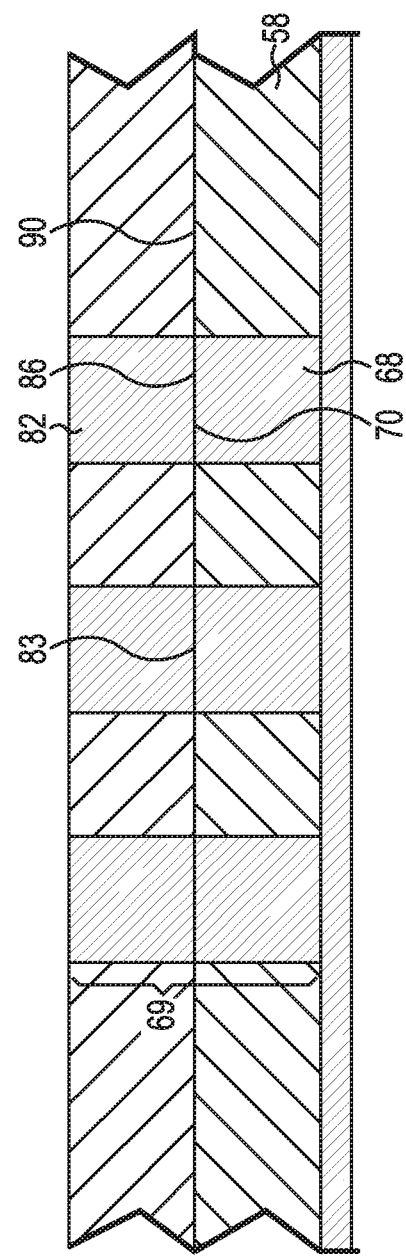
FIG. 4 is a side-sectional view of the discrete layer of FIG. 3 fused to the high density circuit structure in accordance with an embodiment of the present disclosure.

As best illustrated in FIG. 4, upper surfaces 70 of the copper pillars 68 are held in intimate contact with lower surfaces 86 of the copper pillars 82 by the fusion bond 90 of the LCP layers 58, 80. This mechanical connection can be augmented by the addition of a deformable conductive material, such as a conductive paste, located at interface 83 of the surfaces 70, 86.

Figure 5:
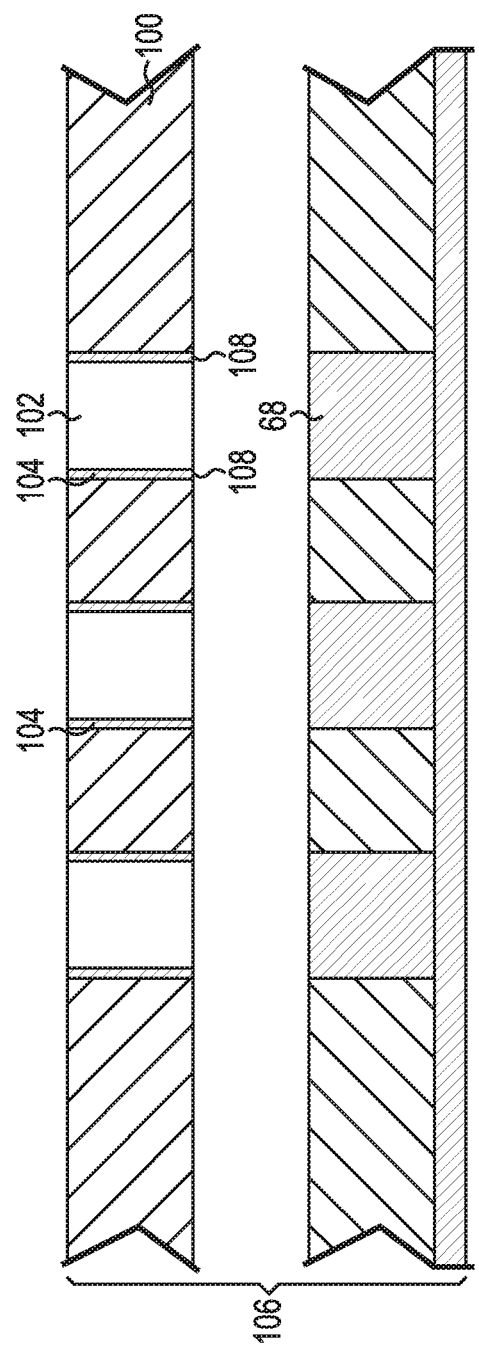
FIG. 5 is a side-sectional view of an alternate discrete layer to be added to the high density circuit structure in accordance with an embodiment of the present disclosure.

FIG. 5 illustrate an alternate discrete LCP layer 100 with barrel plated vias 102 to form conductive structure 104 in accordance with an embodiment of the present disclosure. The conductive structures 104 are registered and aligned with the copper pillars 68. The stack 106 is then fusion bonded using heat and pressure as discussed herein.

Figure 6:
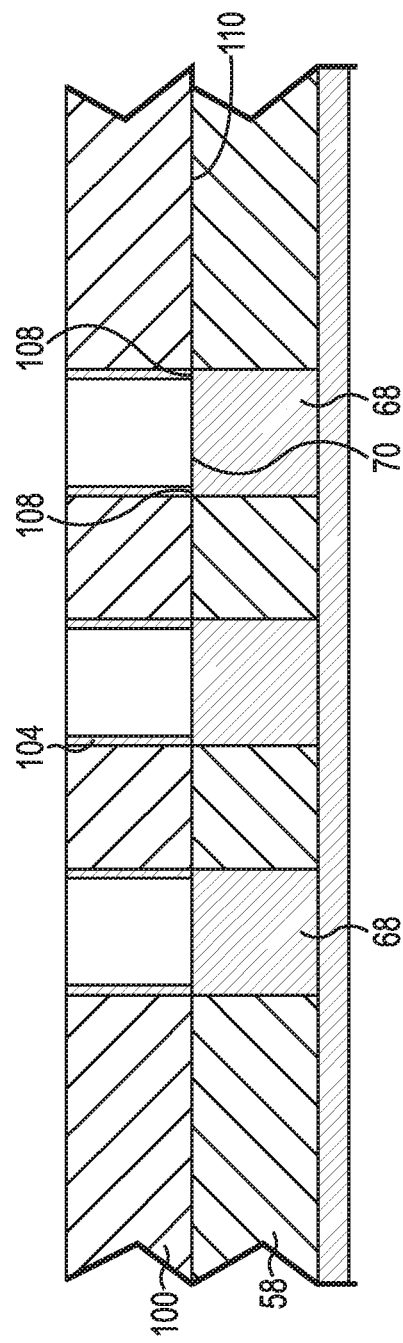
FIG. 6 is a side-sectional view of the discrete layer of FIG. 5 fused to the high density circuit structure in accordance with an embodiment of the present disclosure.

As illustrated in FIG. 6, the copper pillars 68 are held in intimate contact with lower surfaces 108 of the copper structures 104 by the fusion bond 110 of the LCP layers 58, 100. In one embodiment, the vias 102 are then filled with bulk copper plating after the fusion bonding step to create the solid metal pillar 69 generally shown in FIG. 4. The plating bonds directly to the upper surfaces 70 of the copper pillars 68, as well as the exposed surfaces of the conductive structures 104 in the layer 100, resulting in a mechanical and electrical connection between the copper pillars 68 and the conductive structures 104.

FIGS. 7 and 8 illustrate another variation of the embodiment of FIGS. 5 and 6 in which the vias 62, 102 on both layers 58 and 100 are barrel plated. The subsequent bulk copper pillar extends between the layers 58, 100 across the plane of the fusion bond 110 to create the solid metal pillar 69 generally illustrated in FIG. 4.

Figure 26A:
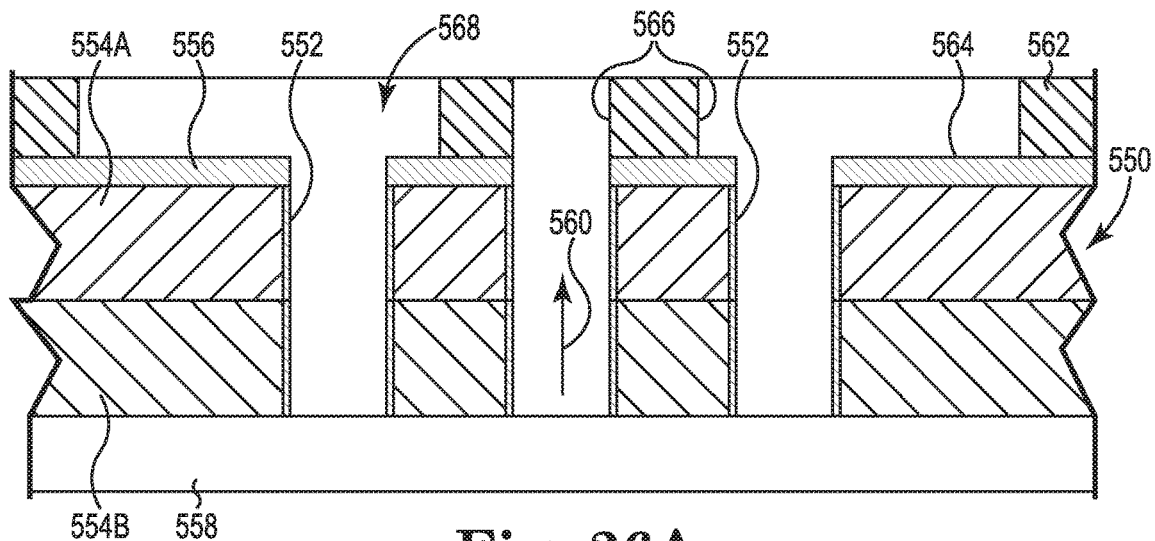
FIGS. 26A through 26C illustrate alternate circuit structures in accordance with an embodiment of the present disclosure.
Figure 26B:
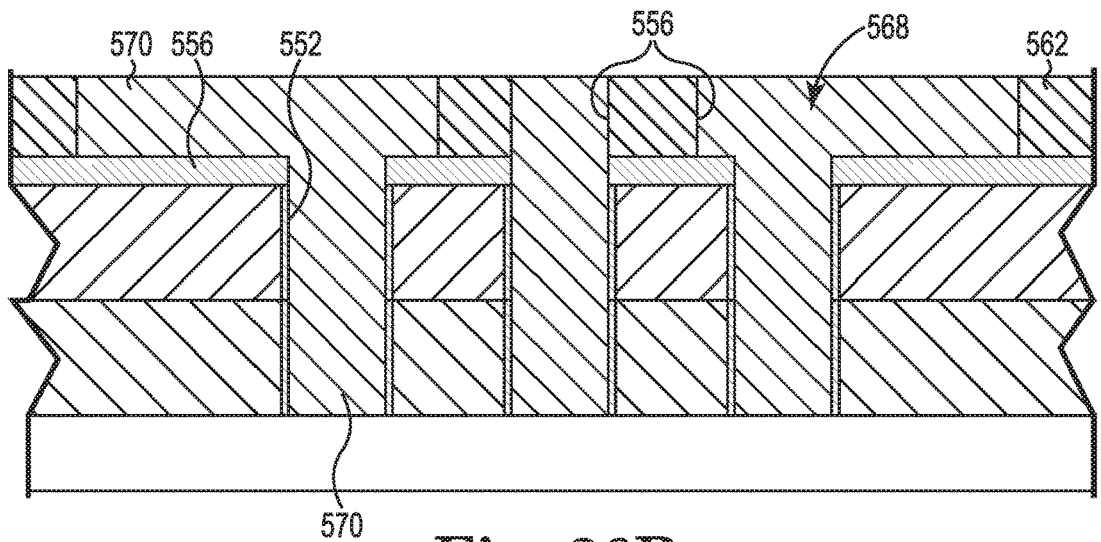
Figure 26C:
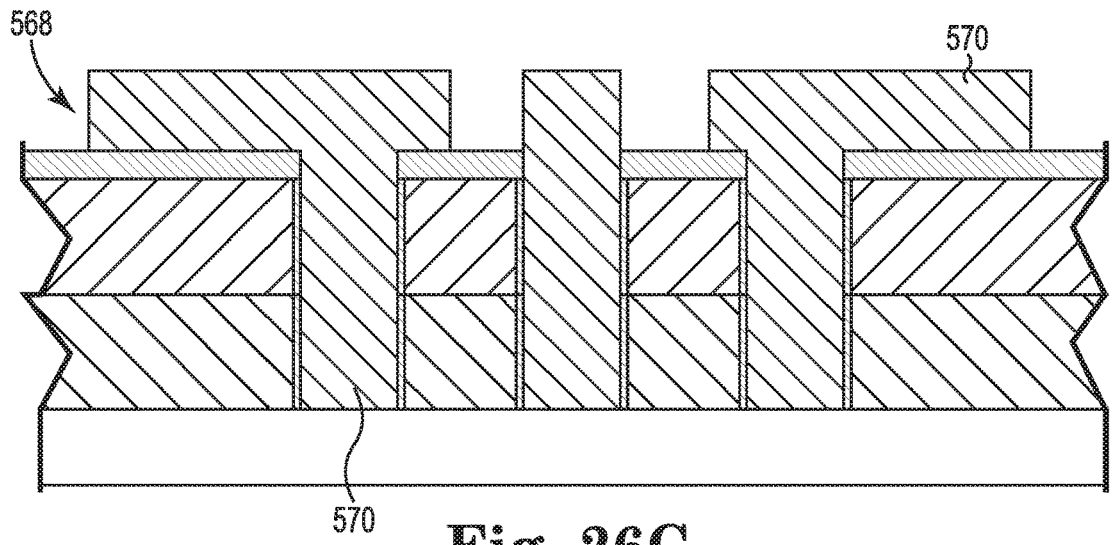

FIGS. 26A through 26C illustrate alternate circuit structures 550 in accordance with an embodiment of the present disclosure. Barrel plated vias 552 are formed in one or more layers of LCP 554A, 554B as discussed herein so the vias 552 electrically couple copper seed layer 556 to base metal layer 558. Electrolytic plating to the seed layer 556 causes copper plating to initiate at the base layer 558 and grow in direction 560 toward the seed layer 556.

In one embodiment, resist layer 562 is applied to exposed surface 564 of the seed layer 556 and imaged to create recesses 566 corresponding to a desired circuit pattern 568. The electrolytic plating operation to the seed layer 556 first fills the vias 552 with plating 570 and then the recesses 566 to create circuit pattern 568. FIG. 26C illustrates the circuit pattern 568 with the resist layer 562 removed.

Figure 9:
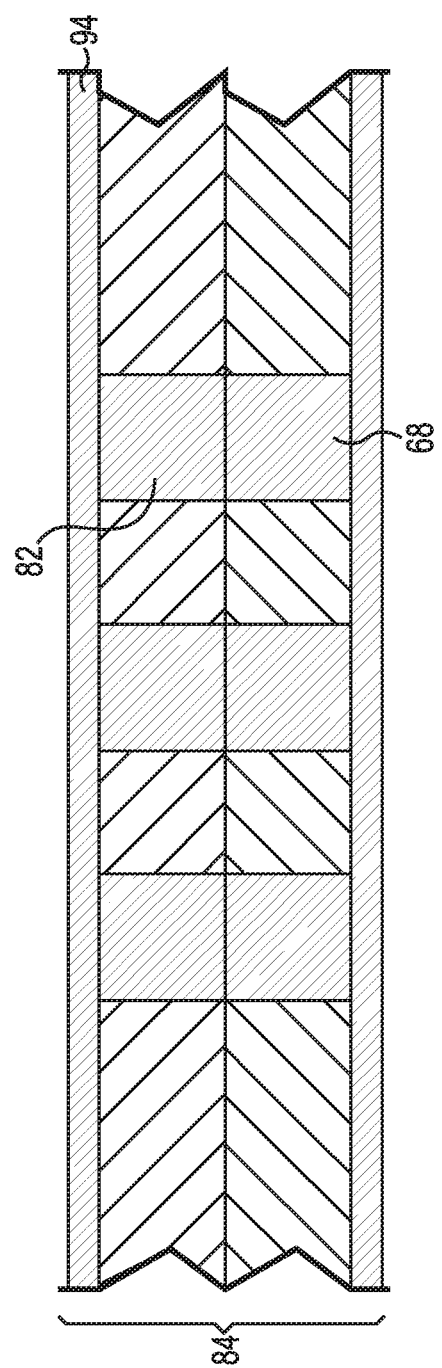
FIG. 9 is a side-sectional view of a circuitry layer added to the high density circuit structure of FIG. 4 in accordance with an embodiment of the present disclosure.

FIG. 9 illustrates an optional copper layer 94 added to create the base for additional routing layers and to facilitate vertical via connection to subsequent layers in the stack 84. The copper layer 94 can be processed using conventional techniques to create a circuitry layer. The present process creates the ability to stack full metal vias 68, 82 in subsequent deposition steps and/or layers to create a high aspect ratio via without the need to drill through the entire stack in one operation.

Figure 10:
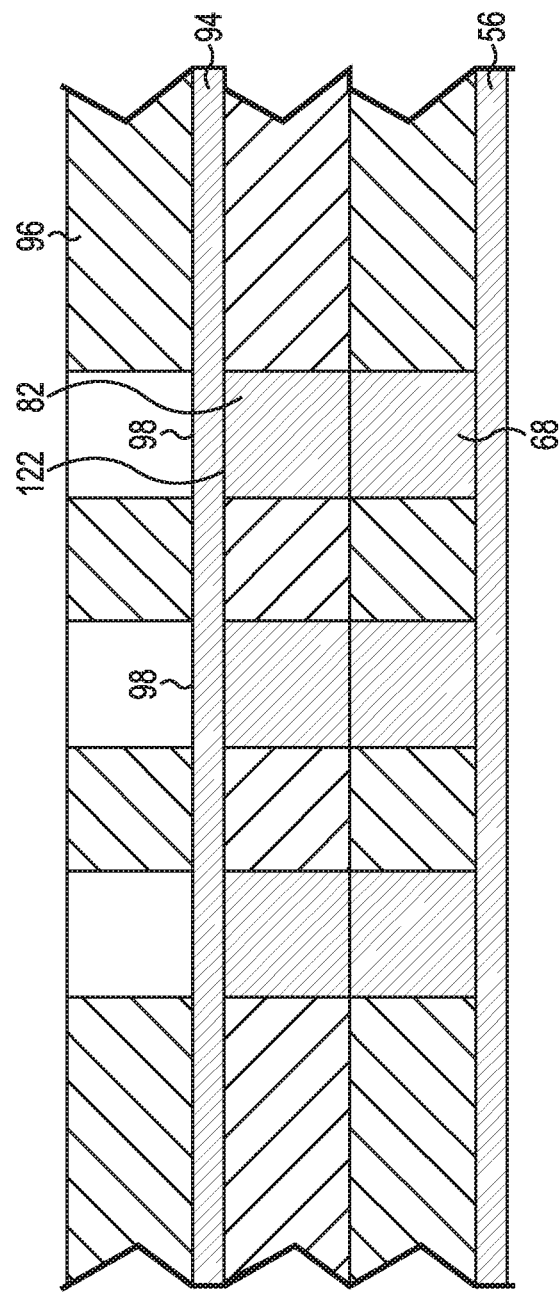
FIG. 10 is a side-sectional view of a dielectric layer added to the high density circuit structure of FIG. 9 in accordance with an embodiment of the present disclosure.

As illustrated in FIG. 10, resist layer 96 can be added to the subsequent copper foil 94 and imaged to expose circuit locations 98. The LCP 96 flows and fills any recessed regions within a previous circuit landscape 94. The present process can also be used in combination with existing dry film techniques. For example, one or more of the layers can be a preformed films to leave air dielectric gaps between traces in the circuit layer 94.

In the illustrated embodiment, the circuit locations 98 are electrically coupled with the tops surfaces 122 of the pillars 82 and connect to the circuit layer 94. The resist layer 96 protects circuit layers 56, 94 that are not to be etched and provides contact points to the previous pillar 68, 82.

Figure 11:
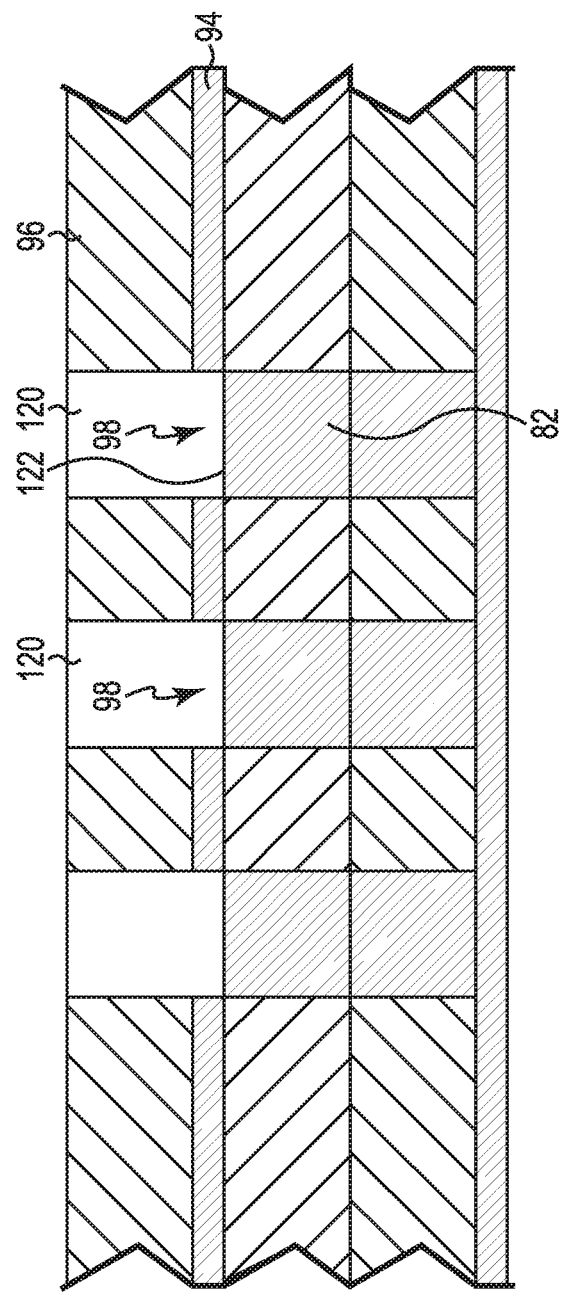
FIG. 11 is a side-sectional view of a modification to the circuitry layer of FIG. 10 in accordance with an embodiment of the present disclosure.

FIG. 11 illustrates a subsequent etch process that removes the copper foil 94 at the locations 98 in the recesses 120 to provide access to top surfaces 122 of the pillars 82 to allow access for the next plating step to join the layers together in accordance with an alternate embodiment of the present disclosure. Depending on the material 96 and the desired final construction, the layer 96 can be stripped to provide a level to be planarized as the base for subsequent layers or the layer 96 can be left in place. In an embodiment where the layer 96 is LCP or other fusion layer material, subsequent layers can be registered off of the circuit layer 94 or the exposed circuit locations 98.

Figure 12:
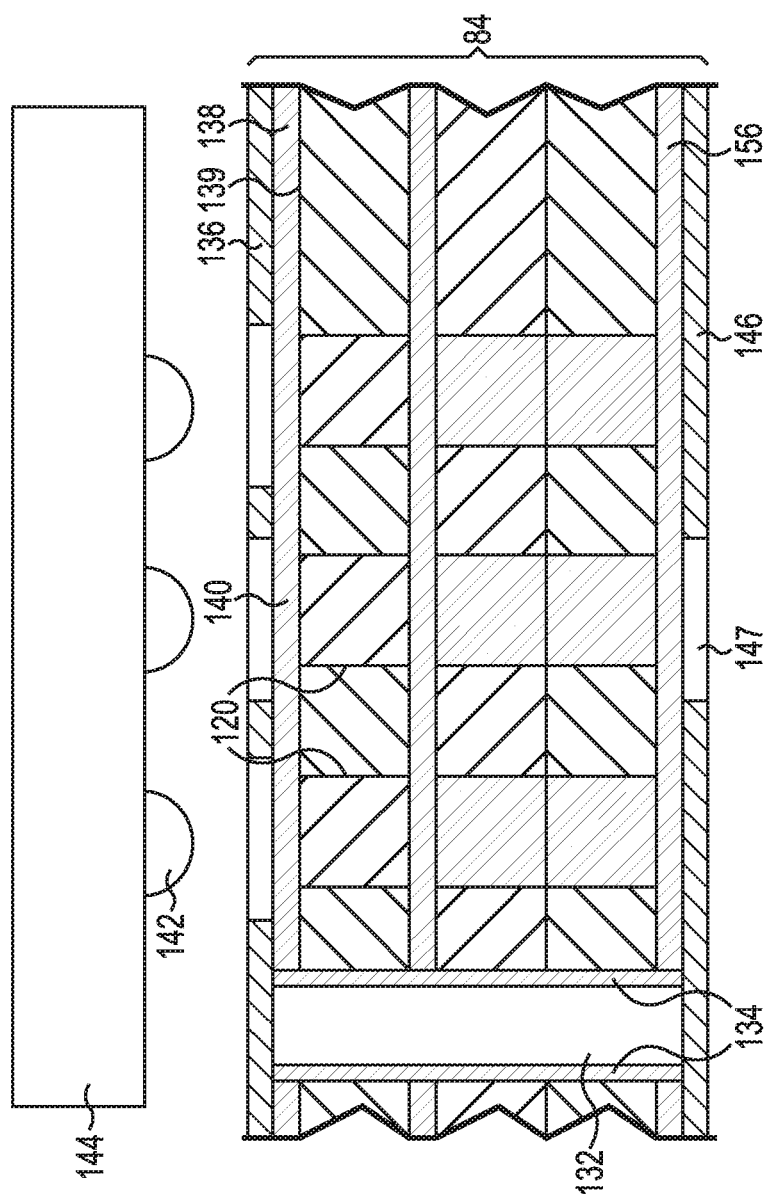
FIG. 12 illustrates an electrical interconnect interfaced with a BGA device in accordance with an embodiment of the present disclosure.

As illustrated in FIG. 12, the recesses 120 can optionally be filled with similar LCP material 130, followed by a planarization step. A circuitry layer 138 is then added to the planarized surface 139. The stack 84 can be further processed with conventional circuit fabrication processes to add larger diameter through vias or through holes 132 with optional plating 134 as needed.

A solder mask 136 can be applied on circuitry layer 138 and imaged to expose device termination locations 140. The solder mask 136 can also be laser direct imaging. In one embodiment, the solder mask 136 is a LCP. The locations 140 are configured to correspond to solder balls 142 on BGA device 144. In the illustrated embodiment, bottom dielectric layer 146 is optionally deposited on circuitry layer 56 in a manner to expose selective regions 147.

Figure 13:
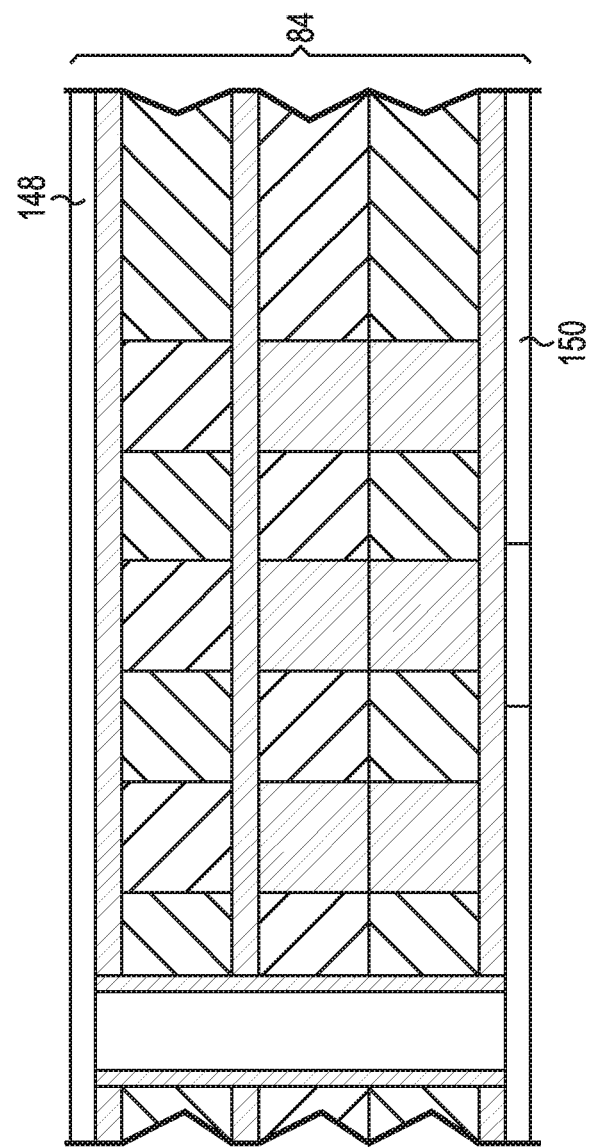
FIG. 13 illustrates an electrical interconnect for a flexible circuit in accordance with an embodiment of the present disclosure.

As illustrated in FIG. 13, for flexible circuit applications the stack 84 is laminated with ground planes, cover layers, final finish 148, 150. In some applications the insulating areas can be applied by jet printing of polyimide or LCP as a final layer or as a combination of laminated film and jetted material.

Figure 14:
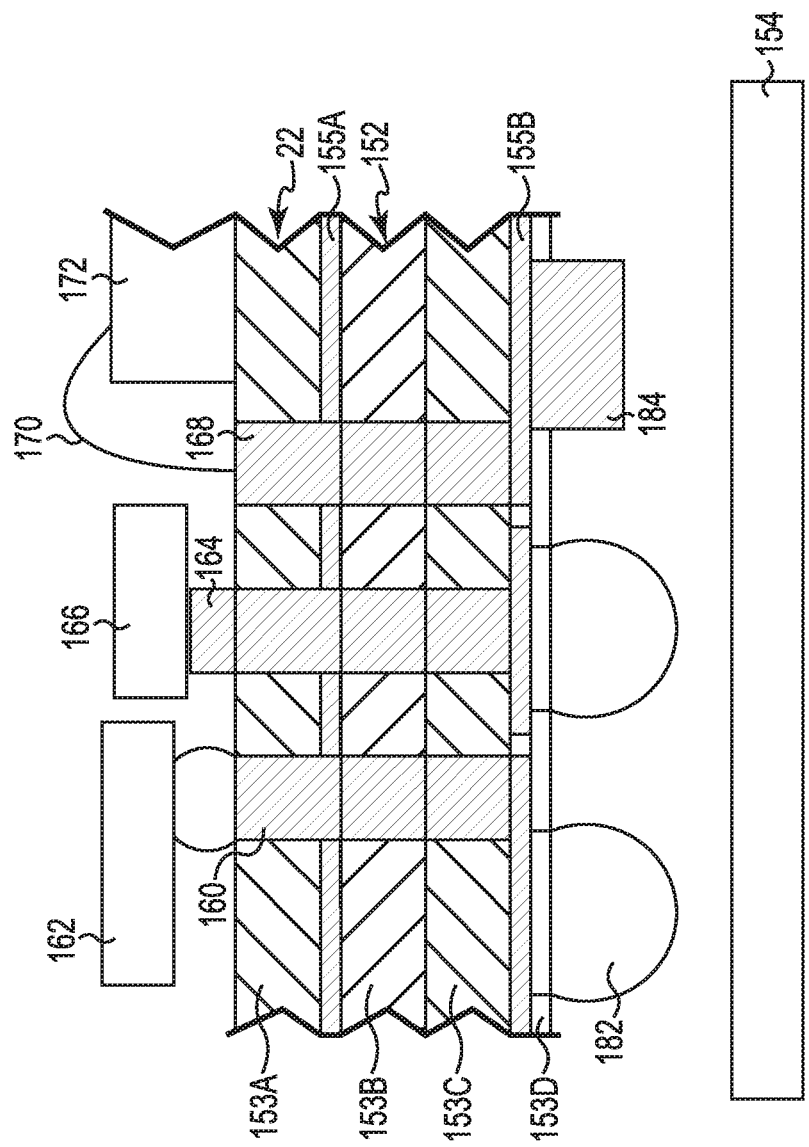
FIG. 14 illustrates an electrical interconnect for an IC package in accordance with an embodiment of the present disclosure.

FIG. 14 illustrates an embodiment for semiconductor packaging applications in accordance with an embodiment of the present disclosure. The circuit structure 152 includes dielectric layers 153A-153D and circuit layers 155A, 155B. The circuit structure 152 can be final processed with a variety of options to facilitate attachment of IC devices 162, 166, 172, as well as system level attachment to a PCB 154.

In one embodiment, the pillar 160 is planarized to facilitate flip chip attach to the structure directly (see e.g., FIG. 2) or to receive BGA device 162. In another embodiment, plating 164 is extended to facilitate direct soldering of IC device 166 with paste. In yet another embodiment, pillar 168 is wire bonded 170 to the IC device 172.

In another embodiment, the layers 153A, 153D can be LCP or fusion layer or combination of LCP plus fusion layer as final mask of the circuit structure 152. These layers 153A, 153D act as the solder mask when growing the copper pillars 160, 168. The IC devices 162, 166, 172 can optionally be attached directly to the LCP layer 153A.

On the system interconnect side the structure can be processed to accept a traditional ball grid array attachment 182 for an area array configuration or plated with solder/tin etc. for a no lead peripheral termination. The structure can also be fashioned to have pillar or post extensions 184 to facilitate direct solder attach with paste and to provide a natural standoff.

Figure 15:
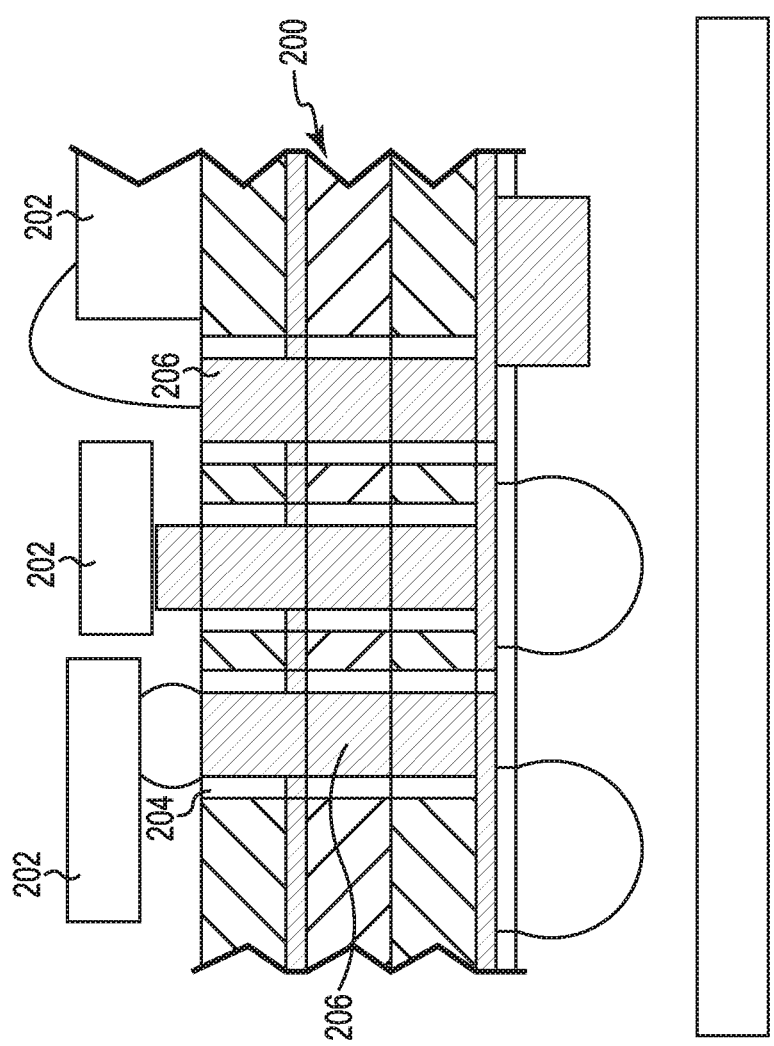
FIG. 15 illustrates an alternate electrical circuit for an IC package in accordance with an embodiment of the present disclosure.

FIG. 15 illustrates an electrical circuit 200 for a semiconductor packages 202 with LCP dielectric materials 204 surrounding the solid copper vias, internal circuits, terminations, and conductive structures 206 in accordance with an embodiment of the present disclosure. Internal circuits and terminations may also be added by imaging or drilling the core material with a larger opening than needed and filling those openings with an LCP material and imaging the desired geometry to facilitate conductive structure formation.

FIGS. 16A and 16B schematically illustrate the merger of a lower density circuit 220 with one or more liquid crystal polymer circuit structures 222A, 222B, 222C, 222D ("222") into the contiguous assembly of FIG. 1C. The lower density circuit 220 may be a printed circuit board, a flexible circuit, or the like. The circuit structure 222 can be coupon or wafer configured as an IC socket, a semiconductor package, or the like.

Dielectric material 224, such as a LCP, is optionally applied to the surface 226 of the low density circuit 220 so the location of the high density circuits 222 is at least partially defined and isolated. The dielectric material 224 may be a film or a liquid dielectric, such as a liquid crystal polymer. The dielectric material 224 can be a preformed structure or printed to expose the circuit locations 228 for the high density circuits 222, improving alignment of vias on the lower density main core 220 with the high density circuits 222. In embodiments where the surface 226 includes a LCP, the LCP circuit structures 222 can be bonded using heat and pressure, as discussed herein.

If the circuit assembly 230 is a flexible circuit, the base layer can be a material such as polyimide or liquid crystal polymer. If the circuit assembly 230 is a rigid circuit board, the base can be FR4 or one of many high speed laminates or substrates. If the circuit assembly 230 is a semiconductor package, the base can be a material such as FR4, BT resin of any one of a variety of laminate or substrate materials. If the circuit assembly 230 is an electrical connector or socket, the base can be molded LCP, machined plastic, or a variety of films or substrate materials.

The liquid, crystal polymer circuit structures 222 (also referred to as "coupons") are preferably made using the process described below. The liquid crystal polymer circuit structures 222 are then optionally merged with the low density circuit 220. In another embodiment, the liquid crystal polymer circuit structures 222 can be fabricated in-situ directly on the low density circuit 220 using the processes described herein. The present method permits the liquid crystal polymer circuit structures 222 to be formed directly in the circuit locations 228, without having to extend the processing across the entire low density circuit 220. Additional discussion of such structures is found in U.S. patent application Ser. No. 14/408,205, entitled HYBRID PRINTED CIRCUIT ASSEMBLY WITH LOW DENSITY MAIN CORE AND EMBEDDED HIGH DENSITY CIRCUIT REGION, filed Dec. 15, 2014, and U.S. patent application Ser. No. 14/408,039, entitled HIGH SPEED CIRCUIT ASSEMBLY WITH INTEGRAL TERMINAL AND MATING BIAS LOADING ELECTRICAL CONNECTOR ASSEMBLY, filed Dec. 15, 2014, which are hereby incorporated by reference.

FIGS. 17A-17G illustrate an alternate method of making a circuit structure 250 using a LCP dielectric material 252 in accordance with an embodiment of the present disclosure. The LCP material 252 provides enhanced electrical performance, reduces the overall thickness 254 of the circuit structure 250. The resulting circuit structures can have $\frac{1}{10}$ the thickness of a conventional PCB with comparable features.

Base layer 252 has a thickness of about 0.002 inches and is coated with ¼ ounce copper layer 258. The copper layer 258 can be etched using conventional techniques to create the desired circuitry layer. The base layer 252 can optionally have copper foil located on both sides. In another embodiment, the base layer 252 can be a bare sheet of LCP that is processed to accept electro-less.

In one embodiment, the LCP layer 260 is clad with about 3 micron to about 5 micron thick copper on the top surface. The laser ablation used to create vias 262 penetrates the about 3-5 micron thick copper and the LCP 260 without damaging the base copper layer 258. In an alternate embodiment, a top copper layer is electro-lessly plated onto the LCP layer 260 during a subsequent operation. Additional flash copper plate can be added to increase the thickness of the copper layer 268 as needed.

LCP layer 260 is located on the circuitry layer 258. Laser ablation is used to create via 262, without damaging the circuit structure 264 at the base of via 262. The vias 262 preferably has a diameter of about 0.0005 inches to about 0.005 inches. The vias 262 preferably have an aspect ratio (height:diameter) of about 2:1 to about 1:1.

As shown in FIG. 17B, electroplating is used to fill the opening 262 with solid copper 266 using the copper 258 as the electroplating buss. The fill metal via 266 is electroplated up to surface 268. Over-plate can be removed using planarization techniques.

The present method permits the creation of solid or nearly solid filled, blind, or buried via 266 on very tight pitch of 25 micron or below. The LCP process permits via stacks that are 50 micron, 100 micron, and 150 micron high, about 25 times shorter than conventional PCB. The nature of the dielectric application and imaging structure allows for variable material content by position, by layer, and within various points on a given layer. The stack may be partly or completely produced digitally without tooling. Terminal shapes can be created in a variety of geometries depending on the terminal connected. Multiple interface points can be implemented to provide increased reliability or lower contact resistance. Electrical enhancements can include internal intelligence, test functions, data storage, shielding, RF antennae, power or signal management, capacitive coupling, analog to digital conversion, decoupling, Led indicators, display functions, battery capability, and the like.

As shown in FIG. 17C, upper surface 268 of the LCP layer 260 is electro-less plated to create seed layer 270 for signal pad and ground plane bulk electrolytic build-up plating. The seed copper layer 270 can be removed with differential etch process, leaving the desired circuit pattern intact.

Figure 17D:
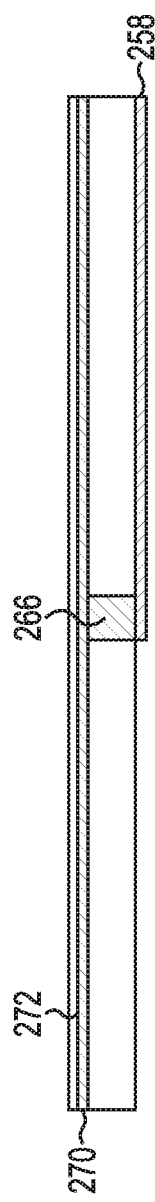

FIG. 17D shows an embodiment in which resist layer 272 is applied to copper layer 270. The resist layer 272 is imaged to define the circuit pattern. The circuit pattern is electroplated restricted by the resist layer 272. In one embodiment, the circuit pattern and the vias 266 are plated at the same time.

Also illustrated in FIG. 17D, the copper layer 258 is processed to create the desired circuit structure using conventional techniques. The circuit structure in the layer 258 is bulk plated as needed.

Figure 17E:
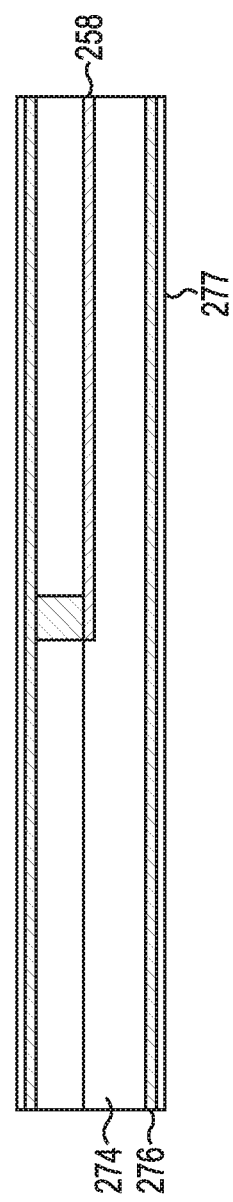

As shown in FIG. 17E, LCP layer 274 is applied to exposed lower circuit layer 258 of FIG. 17D. One of the beneficial properties of the LCP material is it is available in multiple melting temperatures. A lower melt temperature LCP is used to level the circuit patterns with a fusion bonding process that fills in the regions between the circuit structures 258, as well as serves as the bonding agent for the next LCP layer as needed. The resulting structure has many advantages with solid copper full metal vias and traces that are surrounded by LCP with a common dielectric constant. The LCP material can also act as solder mask which is a significant benefit for high speed signals since solder mask is a lossy material. In the illustrated embodiment, LCP layer 274 also includes circuitry layer 276 covered by dielectric layer 277.

FIG. 17F illustrates the formation of through holes or vias 278 drilled in the circuit structure 250. Plating 262 is added to the vias 278 to electrically couple the circuitry layers 270 and 276. As illustrated in FIG. 17G, final finish and solder mask operations are then performed to create a LCP based circuit stack 250 that represents a thinner higher performance replica of a conventional circuit structure.

The present processing encompasses many variations depending on the intended design and results can be used directly as a flexible circuit or a rigid flex with a bonded stiffening member as appropriate. Multi-layer constructions with blind and buried vias basically combine layer stacks with some limitations regarding sequential build up with stacked vias. More complicated multi-layer constructions are also possible. The first uses the LCP layers for the fine lines and signal integrity, while the center region is a conventional rigid PCB constructed using conventional methods. A second method is a mother board—daughter card approach where the high density regions are fabricated with the LCP circuit stack and then merged with a larger format board built with conventional construction.

Figure 18A:
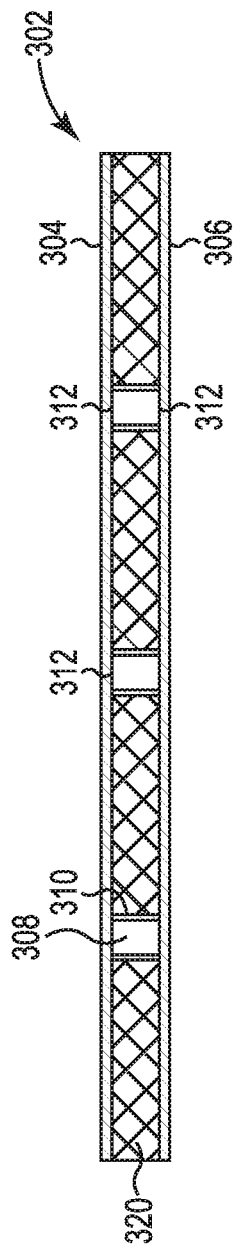
Figure 18B:
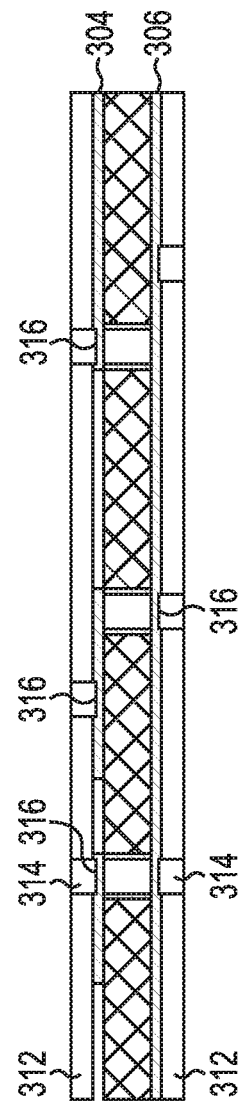
Figure 18C:
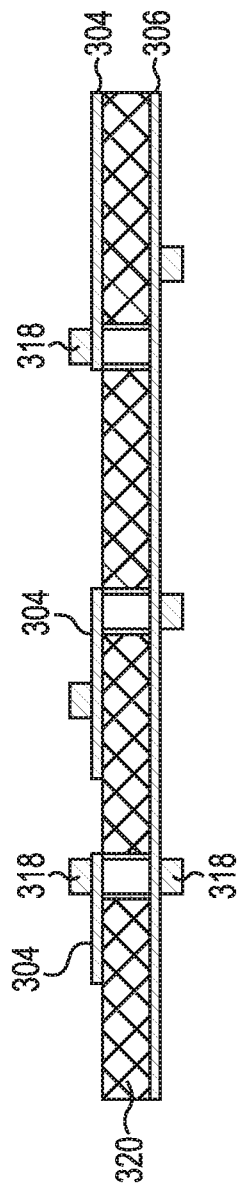

FIGS. 18A-18C illustrate alternate circuit structure 302 built using LCP layers 320 in accordance with an embodiment of the present disclosure. The illustrated embodiment is a 12-layer PCB is assembled with three lamination cycles.

FIG. 18A illustrates a circuitry structure 302 that is about 0.021 inches thick with a copper layer 304, 306 about 18 micron thick on the opposite surfaces. Vias 308 about 0.001 inches to about 0.004 inches in diameter are laser drilled through the center core 302. The vias 308 are barrel plated to add plating layer 310. The vias 308 are then filled with a conductive or non-conductive material and cap plated 312.

As illustrated in FIG. 18B, power and ground circuitry are imaged in the copper layers 304, 306 and partial etched to leave about 3-5 microns of background copper between the traces to act as electrolytic plating buss. Resists layers 312 are applied and imaged to create vias 314 that expose locations 316 in the circuitry layers 304, 306. The vias 314 are plate to create solid metal pillars and/or circuit traces 318, simultaneously creating circuit structures on opposing surfaces of circuit structure 302 during the same electrolytic plating process step. The resist layers 312 is then are removed.

Patterning of the resist layer 312 to define pattern plating structures, such as vias 314, with fine definition can be accomplished with laser direct imaging in either a developed film process or direct ablation of cured resist.

As illustrated in FIG. 18C, the plated vias 314 result in solid copper pillars 318 that extend above the circuitry layers 304, 306. In the illustrated embodiment, the solid copper pillars 318 have diameters of about 0.003 inches. A differential etch is used to remove the about 3-5 micron copper buss discussed above. The resist layer 312 constrains subsequent plating to create solid copper pillars 318 having a fine definition of about 100 micron on about a 300 micron pitch to be used for layer to layer interconnect.

FIG. 18D illustrates upper and lower LCP circuit stack layers 330, 332 created with vias 334 configured to receive the copper pillars 318 on the center core 302. In one embodiment, the vias 334 include barrel plating 335. The layers 330, 332 are created using the process discussed on connection with the center core 302. In particular, the layers 330, 332 are a sheet of LCP 336 about 0.002 inch thick with copper 338, 340 about 3 microns to about 5 microns thick on both sides. The vias 334 are laser drilled with a diameter of about 0.003 inches. A resist is applied and patterned so the bottom side signal circuitry 340 can be pattern plated to the proper thickness, the resist is stripped and differential etched to remove background copper. In another embodiment, conventional etching can be used to define circuitry 340.

In an alternate embodiment, one or more of the layers 302, 330, 332 are fabricated using conventional means. For example, the core layer 302 may be a conventional PCB, while the layers 330, 332 are fabricated using the techniques disclosed herein. In another embodiment, the ground and power layers can be located on a conventions circuit structure, with the signal layers located on LCP layers fabricated as discussed herein.

In another embodiment, the LCP film 320 has a thickness of about 1 mils to about 4 mils. Subsequent layers of LCP can be selected with a thickness to achieve impedance targets. By combining various film thicknesses the proper dielectric separation can be achieved.

One or both of the layers 304, 306 are a copper seed layer about 3 microns to about 5 microns thick, for example, applied using electro-less deposition. A circuit structure including circuit traces and vias is imaged in the resist 312. In one embodiment, the resist 312 is about 1 mils thick. The very thin copper seed layer 304, 306 are used as a base for circuit pattern 318 electrolytic build-up using a resist 312 defined pattern plate technique. The circuit pattern is plated to the top of the resist 312 resulting in circuit traces 304, 306, 318 that are about 28 microns thick. The resist 312 is then stripped and a differential etch process is used to remove some or all of the base copper 304, 306, leaving the circuit patterns 318 intact with nearly vertical sidewalls. The resulting circuit traces 304, 306, 318 are about 25 microns wide, about 25 microns thick, and have a pitch of about 25 microns. Full metal vias with a diameter of about 25 microns to about 50 microns can also be created during this process.

Applicant has determined circuit traces 318 about 25 micron wide with about 25 micron spacing between adjacent traces 318 that are surrounded by about 25 microns of LCP provide almost exactly 50 ohms single ended impedance. Using full metal copper vias with a diameter of about 25 microns results in a very high speed, high dentistry circuit structure.

A fusion bonding process is used to encapsulate the circuit patterns 318 in a manner that provides dielectric separation, leveling of the circuit pattern where spaces between circuits are filled, as well as a dielectric bond to a substrate or previous dielectric layer. In one embodiment, the LCP covering layer is fusion bonded to the circuit traces 304, 306, 318 (see e.g., LCP film 350 in FIGS. 19 and 402 in FIGS. 22A/22B) with a net dielectric thickness roughly 70-80% of pre-bonding thickness.

The embodiments disclosed herein achieve fine line low loss signal performance beyond 40 GHz. The use of thin sections of LCP material allows for a very tight control of impedance profiles (1-3%) with geometries 318 in the range of about 25 microns, and more preferably, about 10 microns to about 15 microns on rigid, flexible and semi-rigid printed circuits and package substrates. The process results in very well defined fine line circuit patterns with vertical sidewalls that are completely surrounded with a homogenous, near hermetic low dielectric constant material, with solid copper via options providing vertical interconnect.

A final LCP fusion layer is optionally used to complete external circuit layers, with final metal layer exposure for component mounting. The final LCP layer is used in place of conventional solder mask (which is very lossy from a signal integrity standpoint). That is, the final LCP surface acts as the solder mask, providing a high speed path through the circuit all the way to the device terminal. The present embodiment provides increased circuit density at very well defined 15-50 micron lines and spaces and a material set that allows for very tight impedance control (1-3%), 20-75 micron solid copper vertical interconnects, and omission of solder mask with a final circuit stack often much thinner than comparable conventional circuits.

The present embodiment provides a number of benefits. The circuit stack includes solid copper vias grown and, stacked along with pattern plate. Internal capture pads are not needed. Drilled and barrel plated through holes can be added as needed, as can solid copper full metal blind and buried vias. The traces and vias are completely surrounded by common dielectric. The stack up is thinner than conventional fabrication, providing better aspect ratios for plating. The final LCP layer acts as solder mask and is optically translucent with circuits visible for alignment.

FIG. 19 illustrate a process for laminating the layers 302, 330, 332 in accordance with an embodiment of the present disclosure. A film 350 of LCP or suitable alternate is pre-drilled with clearance holes 352 and aligned with the solid copper pillar 318 on the top surface of the center core 302 and the plated vias 334 in the upper LCP layer 302. A similar film 354 with pre-drilled holes 356 is aligned with the copper pillars 318 on the bottom of the center core 302 and the plated vias 334 on the lower LCP layer 332. The films 350, 354 are preferably a low melt point LCP material.

The current embodiment is also applicable to a hybrid high density/low density base board structure illustrated in FIGS. 16A-16C. With this design, the lower density PCB 302 is built with conventional technology. The solid copper pillars 318 of the present disclosure are added to the PCB 302 and configured to mate with corresponding vias 334 on the high density LCP circuit structures 330, 332. In this embodiment, the layers 330, 332 correspond with LCP circuit structures 222 in FIG. 16C. The layers 302, 330, 332 are then bonded using heat and/or pressure as discussed herein. A similar example is a probe card or ATE board construction where the high density region in the center of the board is accomplished by merging a daughter card with appropriate routing to fan out the die patterns. Further discussion of such hybrid high density/low density circuit structures is found in PCT/US2013/030856 entitled Hybrid Printed Circuit Assembly with Low Density Main Core and Embedded High density Circuit Regions, filed Mar. 13, 2013, which is hereby incorporated by reference.

The layers 330, 350, 302, 354, 332 are laminated and the LCP layers 350, 354 are fusion bonded to the adjacent layers. The copper pillars 318 are inserted into the plated vias 334 to form a mechanical and an electrical connection. The low melt temperature material in the layers 350, 354 fills the spaces between the traces of the circuitry layers 340, 304, 306 as it semi-flows in the fusion bonding process. The present process eliminates air entrapment that can cause blisters or bubbles during lamination. The process is self-leveling so planarity of the adjacent layers 330, 302, 332 is maintained. Surrounding the circuitry layers 340, 304, 306 in a common dielectric LCP provides a significant benefit from a signal integrity standpoint.

Figure 20:
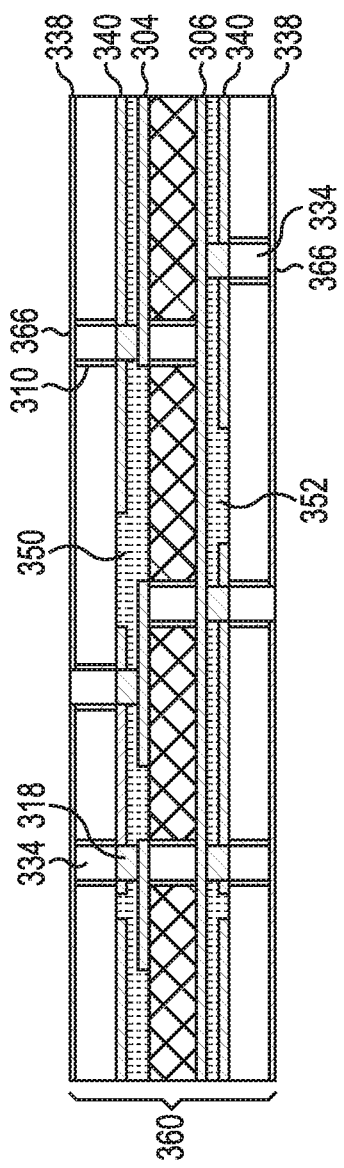
FIG. 20 is a side sectional view illustrated the plurality of circuit layers of FIG. 19 after fusion bonding in accordance with an embodiment of the present disclosure.
Figure 21:
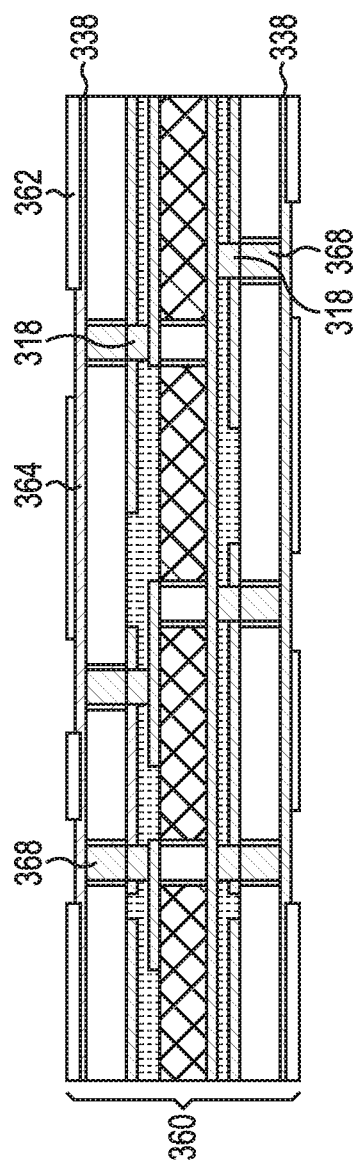
FIG. 21 is a side sectional view of solid metal vias added to the high density circuit structure of FIG. 20 in accordance with an embodiment of the present disclosure.

FIGS. 20 and 21 illustrate circuit stack 360 fused together by the LCP layers 350, 354. Signal integrity is greatly enhanced due to the circuitry 304, 306, 340, the plated vias 310 and the copper pillars 318 being surrounded by a LCP material with a similar dielectric constant. The exposed electrolytic copper plating bus 338 is coated with resist 362 and imaged to expose the desired circuitry pattern 364 and to remove any cap plating 366 covering the vias 334 (see FIG. 20).

The outer layer circuitry 364 is pattern plated to the proper thickness. During this plating process the vias 334 are preferably filled with bulk copper 368 that mechanically and electrically couples with the copper pillars 318. In an alternate embodiment, the barrel plating 310 is eliminated in favor of the bulk copper 368 deposited in the vias 334.

Any through holes are drilled and barrel plated as well. Solder mask is applied and final finish and legend print completes the construction. Any via locations that are not 100% filled with copper during the pattern plate operation are typically capped by solder mask.

The present disclosure enables circuit structures that are about 0.008" thick compared to 0.125" thick for the conventional back-drilled construction. The resulting performance is 60% improved over conventional construction beyond 20 GHz with equivalent design rules. Patterning of thin resist to define pattern plating structures with fine definition is accomplished with laser direct imaging in either a developed film process or direct ablation of cured resist. Fine definition of 25 micron traces with 37 micron spaces with base LCP material are possible. Very fine definition of 100 micron copper pillar metal via formations on 300 micron pitch can be used for layer to layer interconnect.

Other circuit structures to which the present disclosure applies are disclosed in Ser. No. 13/410,943 entitled Area Array Semiconductor Device Package Interconnect Structure with Optional Package-to-Package or Flexible Circuit to Package Connection, filed Mar. 2, 2012; and Ser. No. 13/700,639 entitled Electrical Connector Insulator Housing, filed Nov. 28, 2012, which are hereby incorporated by reference.

Figure 22A:
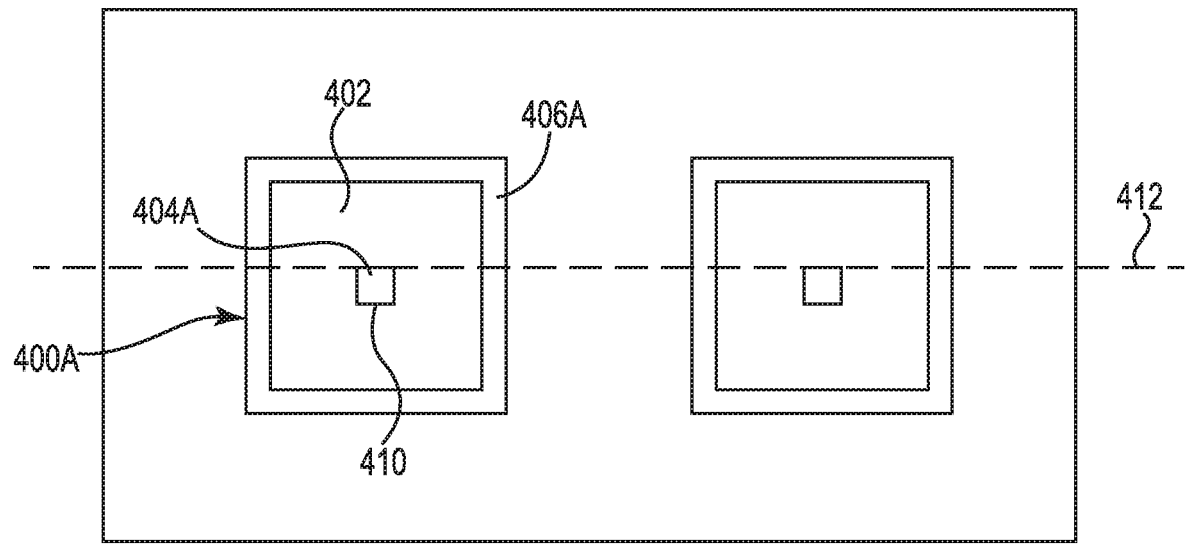
FIGS. 22A and 22B are sectional views of co-axial circuit structures in accordance with an embodiment of the present disclosure.
Figure 22B:
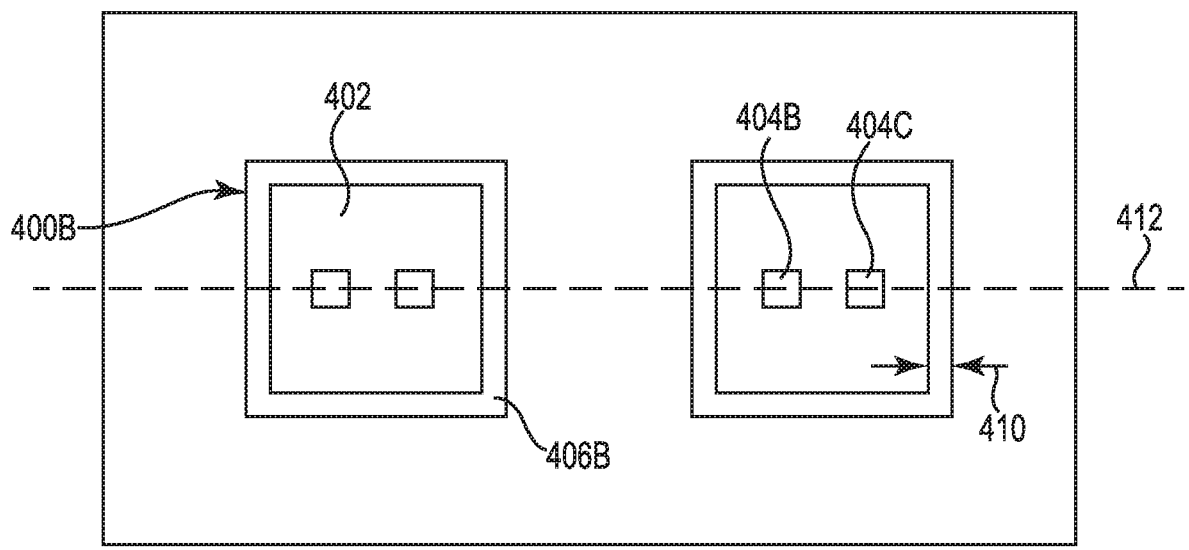

FIGS. 22A and 22B are a sectional view of co-axial structures 400A, 400B embedded in LCP material 402 in accordance with an embodiment of the present disclosure. The center conductors 404A, 404B, 404C ("404") are solid metal structures, preferably with a generally square cross-sectional shape. As discussed above, differential etching of the copper base layer and subsequent plating restrained by an imaged resist layer permits the fabrication of conductive traces with a substantially rectangular cross-sectional shape. Surrounding the center conductors 404 in the LCP material 402 provides greatly enhance signal integrity.

In one embodiment, the center conductors 404 have cross-sectional side dimensions of about 25 micrometers. The center conductors 404B, 404C are preferably separated by about 25 micrometers of LCP material. The co-axial conductors 406A, 406B also preferably have a width 410 of about 25 micrometers and are separated from the center conductors by about 25 micrometers of LCP material.

The center conductors 404 are optionally fabricated by creating a metalized layer 410 on the LCP to permit bulk copper plating to be formed in the channel formed by either a resist or the LCP material, as discussed herein. In one embodiment, the co-axial structures 400 are fabricated as two components that are subsequently fused along bonding lines 412.

Figure 23A:
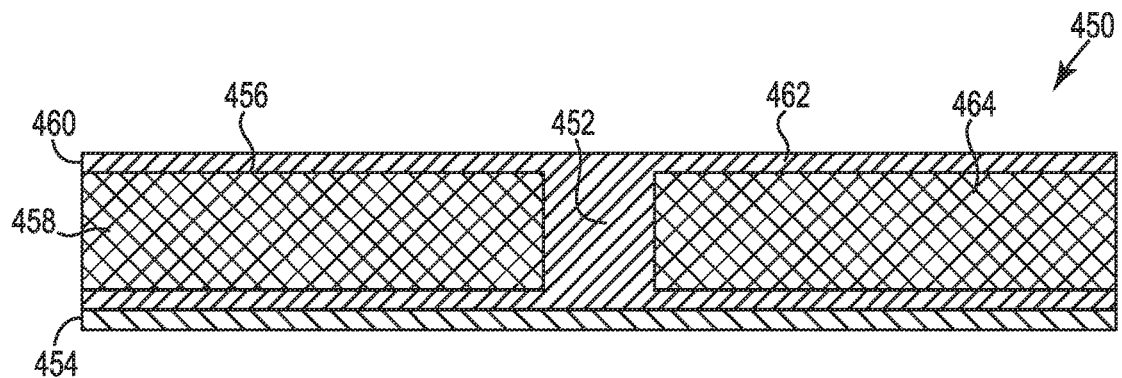
FIGS. 23A through 23C illustrate an alternate method of making a circuit structure in accordance with an embodiment of the present disclosure.
Figure 23B:
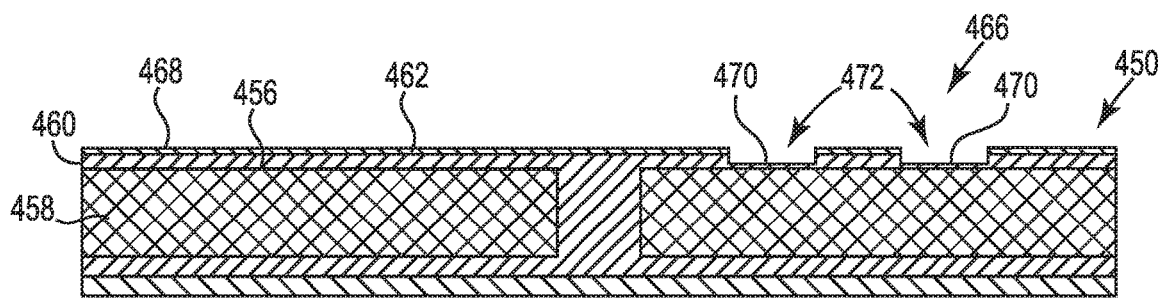
Figure 23C:
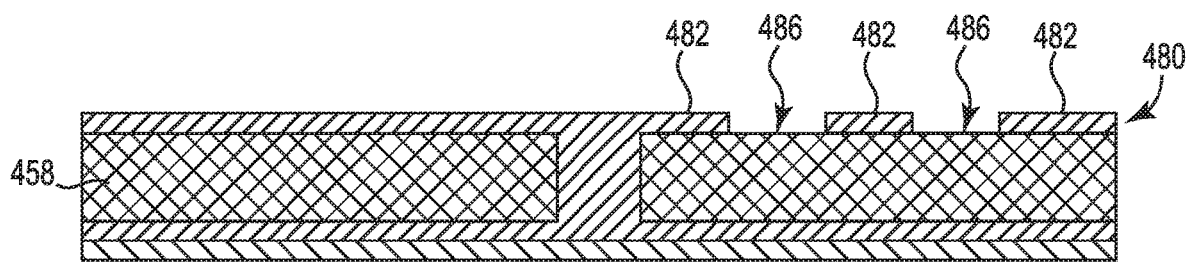

FIGS. 23A-23C illustrate an alternate method of making a circuit structure 450 in accordance with an embodiment of the present disclosure. This embodiment is particularly applicable to creating fine lines and spaces using thicker standard ½ ounce or ¼ ounce thickness copper. FIG. 23A illustrates full metal via 452 extending from base copper layer 454 up to top surface 456 of the LCP 458. Copper layer 460 deposited on top surface 456 of the LCP 458 is thicker than in other embodiments, on the order of about at 0.007 inches thick.

The challenge for normal etching of thicker copper, such as the copper layer 460, is that the resulting circuit traces have a taper or trapezoidal cross-section due to the fact that upper surface 462 of the copper layer 460 etches faster than the lower surface 464. In order to etch down to the top surface 456 of the LCP layer 458, the spacing between adjacent circuit traces is usually larger than the actual trace, limiting the effective line and spacing between traces.

FIG. 23B illustrates a resist pattern 466 created with resist layer 468. In the illustrated embodiment, the resist layer 468 is about 0.005 inches thick. In the preferred embodiment, the image 466 is created using a laser to ablate the resist layer 468 and a portion of the copper layer 460 to just above top surface 456 of the LCP layer 458. Using the laser to ablate the copper layer 460 creates substantially rectangular copper traces 482 (see FIG. 23C). An UV laser vaporizes the resist 468 and the copper 460 without leaving deposits behind. In the present embodiment, a thin layer of copper 470 remains in the recesses 472 to prevent the laser from cutting through the LCP layer 458. In one embodiment, the thin copper 470 is on the order of about 3 microns to about 5 microns thick.

Basically, the copper layer 460 is ablated down to a very thin layer 470 at the same time as the resist layer 468 is ablated. This approach allows starting with the thicker copper layer 460 and ablating down to the thin layer 470 using the laser to define the resist pattern 466, as well as give the etching a head start by removing most of the copper 460 that would normally need to be etched away. The present embodiment is able to define a circuit structure 480 (see FIG. 23C) with the resolution and definition of the laser, rather than the resolution of conventional image and develop process used by conventional resist imaging.

After processing with the laser, the circuit structure 450 is etched to remove the remaining copper 470 in the recesses 472. The resist layer 468 protects the upper surface 462 of the copper layer 460 during the etching. The about 3 microns to about 5 microns copper 470 at the base of the recesses 472 is etched away very quickly during the differential etch, without degrading the remaining circuit pattern excessively.

As illustrated in FIG. 23C, the resist layer 468 has been stripped and the circuit structure 480 remains. The copper 470 at the base of the recesses 472 is also gone. One of the benefits of the present embodiment is that resist ablation and pattern definition is done on the same machine as the full metal via 452 drilling so there is no registration issue as there is with conventional methods where the resist is imaged using a low power source that can expose photo sensitive material, but cannot ablate or vaporizes the resist layer 468 or the copper layer 460. The present method uses the laser to ablate the resist and the copper at the same step (although with a different power setting for copper). The same laser can also be used to drill the vias 452 in the same set-up.

When the fusion bond layer is applied, the space 486 between the traces 482 and any undercut adjacent to the traces 482 created during etching of the thin copper layer 470 are filled with LCP. Additionally, the circuit traces 482 are relatively thick (about 0.0007 inches to about 0.007 inches) with very straight, rectangular side walls 486 and little or no taper. The traces 482 preferably have an aspect ratio (height:diameter) of about 2:1 to about 1:1.

FIGS. 24A-24F illustrate an alternate method of making a circuit structure 500 in accordance with an embodiment of the present disclosure. Copper seed layer 502 about 3 microns to about 5 microns thick is located on substrate 504. The copper seed layer 502 can be created by electro-less deposition, lamination, or a variety of other techniques. In one embodiment, the layer 502 is initially thicker (e.g., 0.001 inches) and then subsequently etched to the desired thickness of about 3-5 microns. The substrate 504 can be an LCP material, a conventions PCB or a variety of rigid or flexible materials.

A series of recesses 508 corresponding to a desired circuit pattern 512 (see FIG. 24C) is imaged in the resist 506. The circuit pattern 512 may include circuit traces, vias, solid copper pillars, and a variety of other structures, referred to herein collectively as "conductive traces". In one embodiment, the resist 506 is about 1 mils thick. Portions of the copper seed layer 502 are exposed at the bottoms 510 of the recesses 508.

Figure 24A:
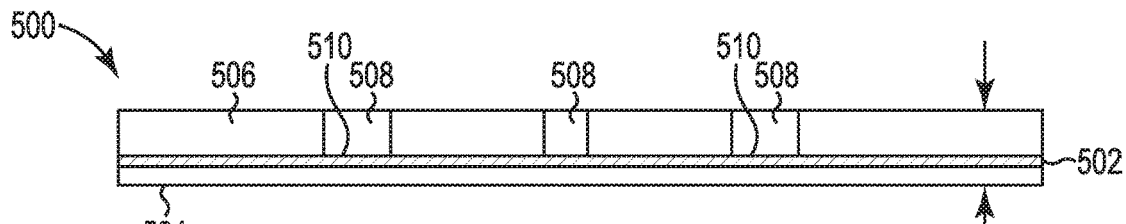
FIGS. 24A through 24F illustrate an alternate method of making a circuit structure in accordance with an embodiment of the present disclosure.
Figure 24B:
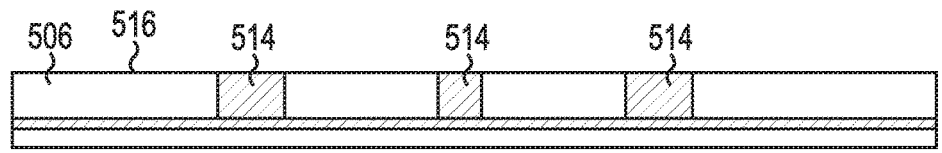

As best illustrate in FIG. 24B, the copper seed layer 502 is used as an electrical bus for electrolytic build-up of conductive traces 514 using the resist 506 to define the pattern. The circuit pattern 512 is plated to top surface 516 of the resist 506 resulting in conductive traces 514 that are about 20 microns to about 50 microns thick. In an alternate embodiment, electro-less copper is applied to the sidewalls of the recesses 508 to aide in the electrolytic build-up process. (See e.g., FIG. 1).

Figure 24C:
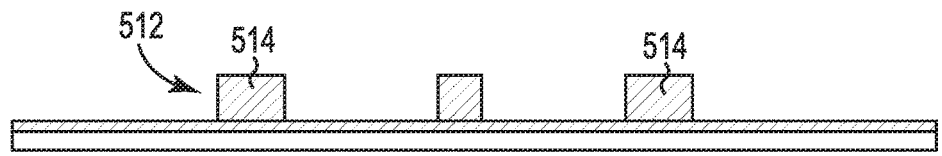
Figure 24D:
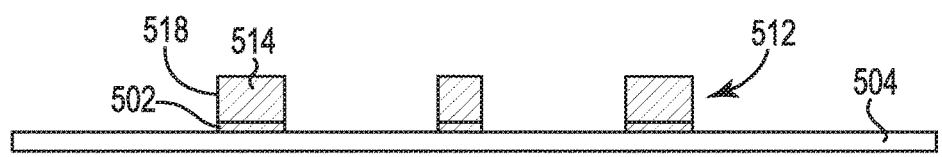

As illustrated in FIG. 24C, the resist 506 is then stripped, exposing the conductive traces 514. As illustrated in FIG.

24D a differential etch process is used to remove some or all of the copper seed layer 502, leaving the circuit patterns 512 intact with nearly vertical sidewalls 518. Residual portions of the seed layer 502 are left interposed between the conductive traces 514 and the substrate 504. The present method permits the conductive traces 514 to be about 25 microns wide, about 25 microns thick, and have a pitch of about 25 microns. Full metal vias with a diameter of about 25 microns to about 50 microns can also be created during this process.

Figure 24E:
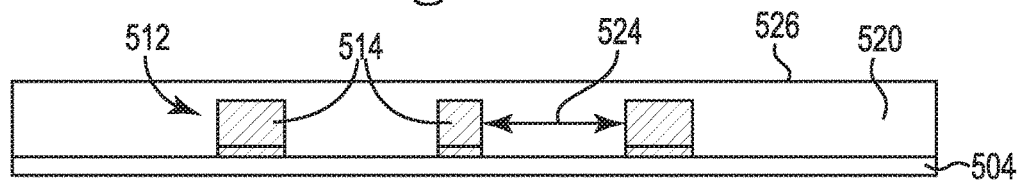

As illustrated in FIG. 24E, LCP layer 520 is fusion bonded to the circuit pattern 512 to encapsulate the conductive traces 514. The LCP layer 520 provides dielectric separation, leveling of the circuit pattern 512 where spaces 524 between the conductive traces 514 are filled. If a subsequent circuit layer will be attached to top surface 526 of the LCP layer 520, the surface 526 is typically planarized.

The present embodiment discloses a fine line, low loss signal performance beyond 40 GHz. The use of thin sections of LCP material allows for a very tight control of impedance profiles (1-3%) with geometries of the conductive traces 514 in the range of about 25 microns, and more preferably, about 10 microns to about 15 microns on rigid, flexible or semi-rigid printed circuits and package substrates. The process results in very well defined fine line circuit patterns with vertical sidewalls that are completely surrounded with a homogenous, near hermetic low dielectric constant material, with solid copper via options providing vertical interconnect.

Figure 24F:
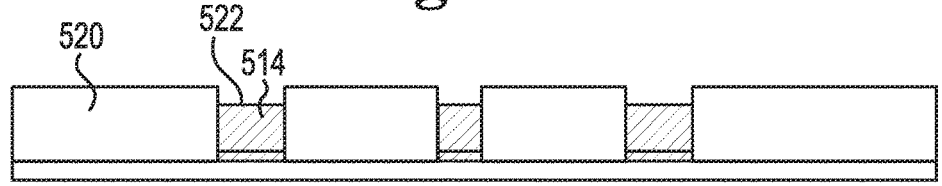

In one embodiment illustrated in FIG. 24F, the LCP layer 520 is used in place of conventional solder mask (which is very lossy from a signal integrity standpoint). The LCP layer 520 may be processed, such as by laser drilling, to create openings 522 that provide access to the circuit pattern 512. The present embodiment provides increased circuit density at very well defined 15-50 micron lines and spaces and a material set that allows for very tight impedance control (1-3%), 20-75 micron solid copper vertical interconnects, and omission of solder mask with a final circuit stack often much thinner than comparable conventional circuits.

The present embodiment provides a number of benefits. The circuit stack includes solid copper vias grown and stacked along with pattern plate. Internal capture pads are not needed. Drilled and barrel plated through holes can be added as needed, as can solid copper full metal blind and buried vias. The traces and vias are completely surrounded by common dielectric. The stack up is thinner than conventional fabrication, providing better aspect ratios for plating. The final LCP layer acts as solder mask and is optically translucent with circuits visible for alignment.

The present process can be used to create vertical or 3-D like structure to simulate the principle of a rectangular or square cross section coax like construction. The 3-D structures can be created on a single substrate or as separate assemblies that are subsequently stacked and fusion bonded as discussed herein.

Figure 25A:
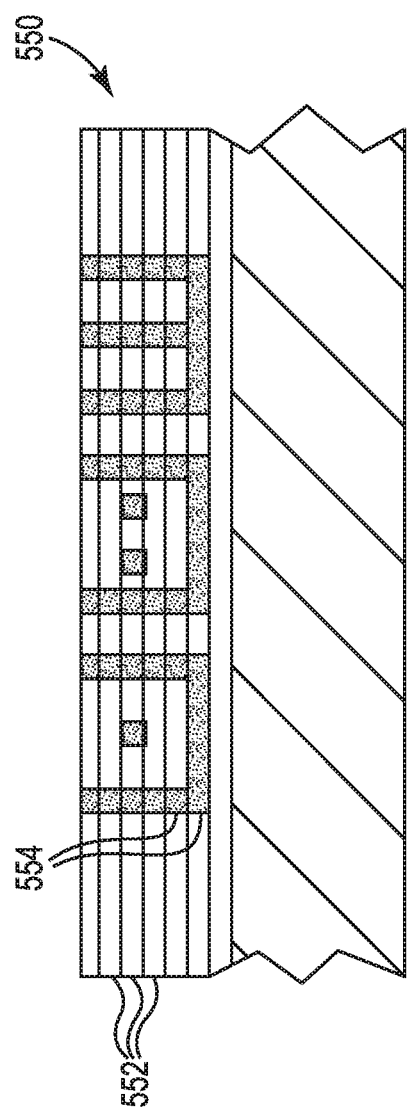

FIG. 25A illustrates a method of making circuit structure 550 with a plurality of LCP layers 552 in accordance with an embodiment of the present disclosure. The LCP layer 552 are applied sequentially and each layer 552 is applied or processed so the underlying conductive structure 554 is exposed before the next layer 552 is applied.

In one embodiment, a temporary resist layer is applied to create the next layer of conductive structures 554 (See e.g., FIGS. 24A and 24B). The resist layer is removed and the subsequent LCP layer 552 is fused to the underlying LCP layer 552 as discussed herein.

In another embodiment, each LCP layers 552 is processed to create recesses, such as by laser drilling, into which the metal is deposited to create the next layer of conductive structures 554. The LCP layers 552 can be processed to create the recesses before or after being fused with the underlying LCP layer. The surfaces of the recesses in the resist or LCP are optionally metalized with electro-less plating to facilitate the bulk copper deposition.

As best illustrated in FIG. 25B, center trace 562 provide a coaxial line surrounded by conductive material 563. Traces 564A, 564B are configured to provide twin axial lines, also surrounded by conductive material 563. The third structure is a coaxial/twin axial via structure 566 within the stack of LCP layers 552. The structures are preferably capped with a top layer of LCP 568. The resulting electrical structures 562, 563, 564, 655 are surrounded by LCP. In one embodiment, the dimensions and the spacing of the electrical structures 562, 563, 564, 655 are the same or similar to those discussed in connection with FIGS. 22A and 22B.

FIG. 25C illustrates alternate an alternate circuit structure 570 with various alternate coaxial conductive structures 572 embedded in fused LCP layers 574 in accordance with an embodiment of the present disclosure.

Figure 27A:
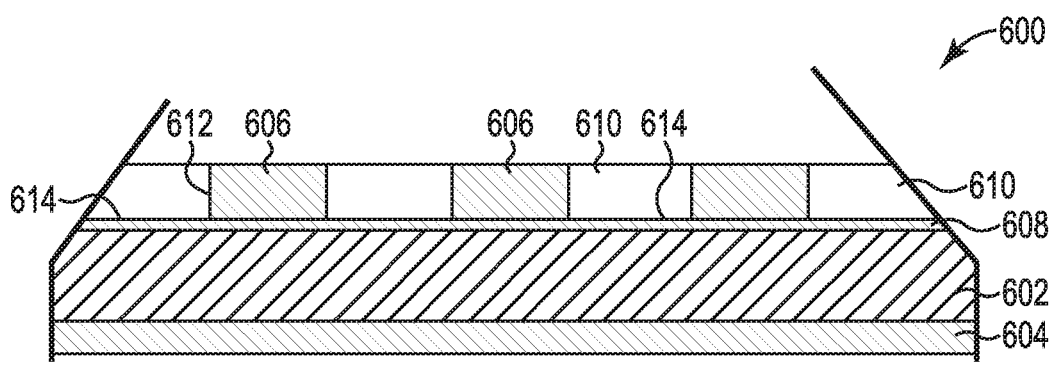
FIGS. 27A through 27C illustrate an alternate circuit structures in accordance with an embodiment of the present disclosure.
Figure 27B:
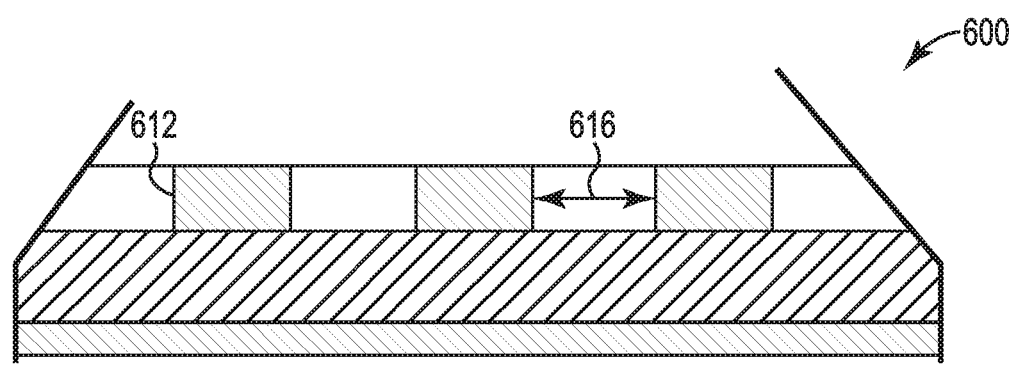
Figure 27C:
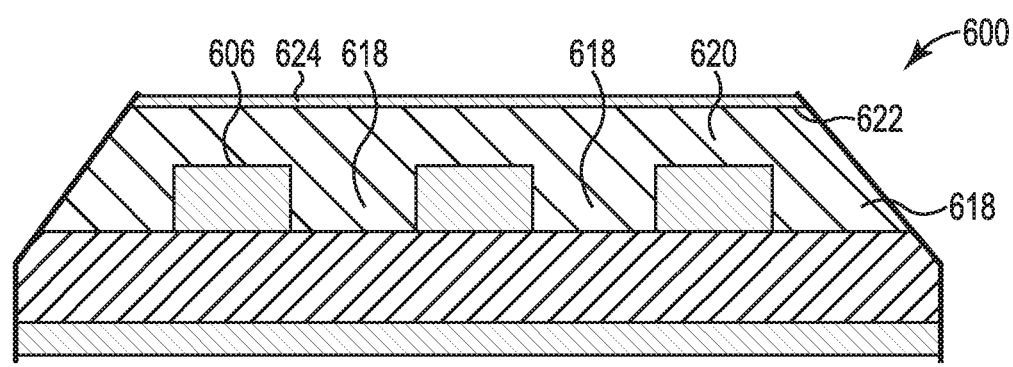

FIGS. 27A-27C illustrate a method of making circuit structure 600 that relies on a base LCP layer 602 with copper clad 604, deposited or laminated as a starting medium. The LCP layer 602 can be in film form, injection molded, or compression molded to create a desired thickness or dielectric property. The LCP layer 602 is processed in such a way to create fine resolution circuit traces 606 by patterning a very thin layer of copper 608 in the range of about 3 to about 5 microns to create a plating buss 614. Plating resist 610 is imaged to permit bulk electroplating of copper 612 restrained by the resist 610 to define the circuit patterns.

As illustrated in FIG. 27B, the resist 610 is stripped away after circuit definition, and the residual plating buss 614 is etched away while leaving the vast majority of the bulk copper 612 in place. This approach is basically opposite of traditional circuit fabrication, where thick copper is patterned and etched to remove the unwanted copper. The present method allows for finer resolution with higher aspect ratio of thickness to width of the traces 606 and low trace separation 616.

As illustrated in FIG. 27C, dielectric material 620 (LCP or other materials) is applied in liquid, film, or cast form with sufficient flow properties to fill the regions 618 between the circuit traces 606 patterns which may trap air if laminated in a normal process. The dielectric material 620 between the circuit traces 606 provides a planar interface 622 for a subsequent circuit layer 624 or an LCP layer while encapsulating the traces 606. This technique also provides the opportunity to alter the electrical properties of the material surrounding the traces 606 to provide signal conditioning or impedance tuning.

Figure 28:
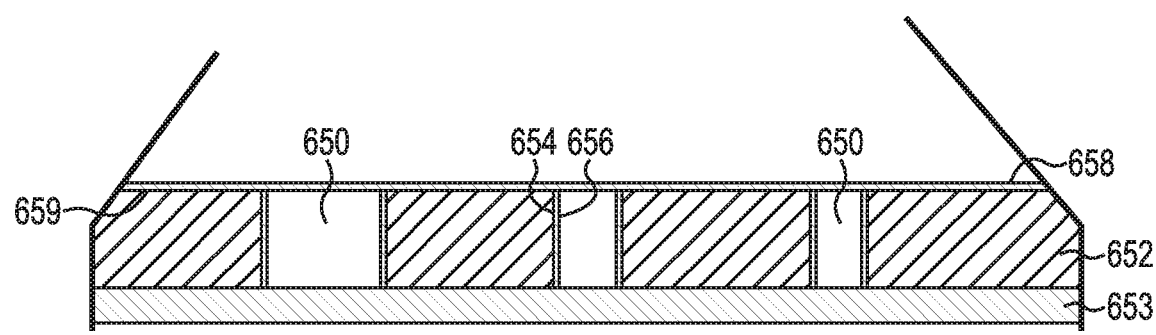
FIG. 28 illustrates an alternate circuit structure in accordance with an embodiment of the present disclosure.

FIG. 28 illustrates a method for creating full metal or solid copper vias as part of a bulk electrolytic plating process in accordance with an embodiment of the present disclosure. With conventional vias, a hole is drilled from one layer to another or to multiple layers and the hole is plated in what is called a barrel as the side walls of the hole plate to connect the exposed copper at the intersection of the hole wall. These vias are often filled with material to improve the reliability or prevent trapped air which can expand during reflow.

The embodiment of FIG. 28 involves creating holes 650 in LCP film 652 either by etching, photo imaging or laser ablation. LCP film 652 optionally includes copper clad 653 deposited or laminated as a starting medium. Side walls 654 of the holes 650 are directly metalized to create barrel plating 656. Circuit layer 658 is located on surface 659 and connected to the plating 656 to act as an electrolytic buss for bulk electrolytic plating of a copper pillar that grows from circuit layer 653 to bus 658 restricted by the geometry of the hole 650 in the LCP 652, which acts as a plating resist. A full metal via is grown in the holes 650 (see e.g., FIG. 2) such that when electroplated the metal deposition is initiated at the internal metal target and grows in a controlled manner to the circuit layer 658. In some cases a resist is applied to the circuit layer 658, which is subsequently plated to define a 3D matrix.

Figure 29:
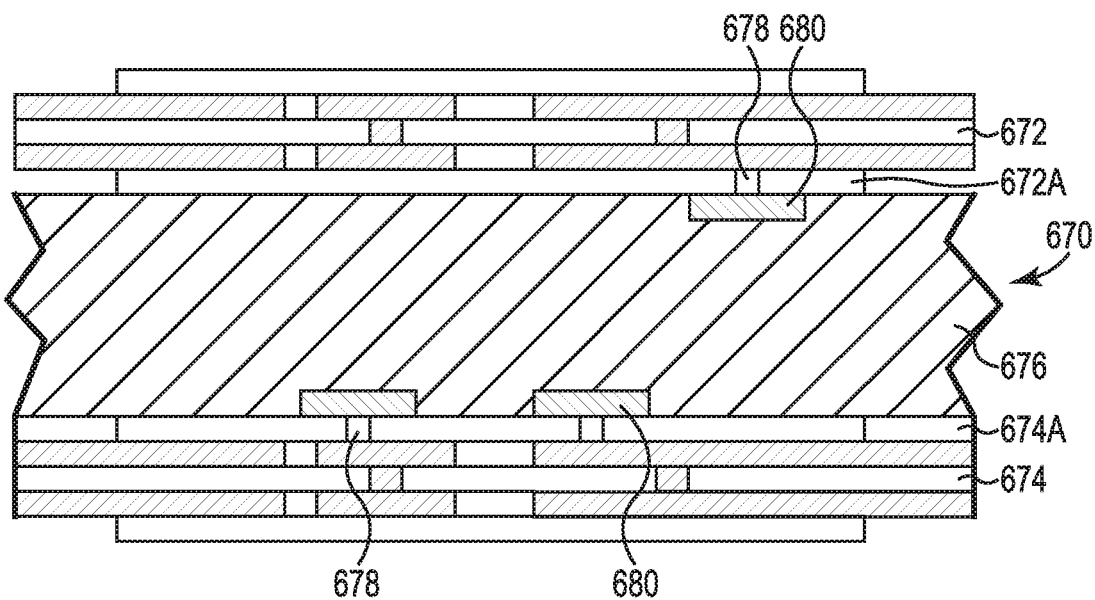
FIG. 29 illustrate circuit structures laminated to a printed circuit board in accordance with an embodiment of the present disclosure.

FIG. 29 illustrates a circuit structure 670 made by mating one or more of the thin LCP circuits 672, 674 disclosed herein to a conventional printed circuit board 676, in accordance with an embodiment of the present disclosure. The LCP circuits 672, 674 are preferably created separate from the PCB 676 and subsequently bonded to one or both sides of the PCB 676. The LCP circuits 672, 674 can be bonded to the PCB 676 by fusing LCP material 672A, 674A using head and/or pressure, as disclosed herein. In one embodiment, the LCP circuits 672, 674 include copper pillars 678 (such as disclosed in FIG. 18C) that mate with corresponding contact pads 680 on the PCB 676. The PCB 676 and the LCP circuits 672, 674 can optionally be electroplated together.

Figure 30:
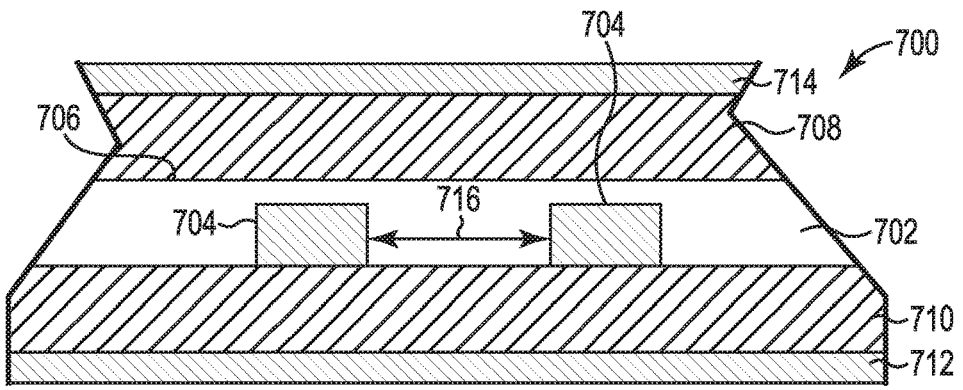
FIG. 30 illustrates an alternate circuit structure in accordance with an embodiment of the present disclosure.

FIG. 30 illustrates circuit structure 700 created with fusion layer 702 that enhances the bond other layers having a mixed topography, such as another LCP layer, copper layer, or circuit structure in accordance with an embodiment of the present disclosure. The LCP or fusion layer 702 provides precise control of trace width, trace thickness, shape, dielectric thickness, dielectric spacing, dielectric properties with outer layer circuits surrounded by LCP or Fusion material rather than solder mask. The fusion layer 702 can be used to level the circuit topography 704 in a controlled manner and provides a leveled surface 706 as the bond plane for the subsequent dielectric layer 708. The fusion layer 702 can also be used as the dielectric separation layer itself, while bonding with adjacent layers 708, 710, such as an LCP layer, circuit layer, etc.

The fusion layer 702 is intended to have a processing window sufficiently different from the adjacent layers 708, 710 such that the fusion layer 702 has an extrusion temperature that is lower adjacent layers 708, 710 and does not disrupt adjacent LCP layers 708, 710 or the circuits 712, 714 they contain. An important aspect of the lamination process is precise control of the very thin dielectric spacing 716 between the circuit traces 704 and circuit layers 712, 714 to achieve extreme impedance control. The fusion layer 702 can also be a different material set varied by layer with similar electrical properties.

Figure 31A:
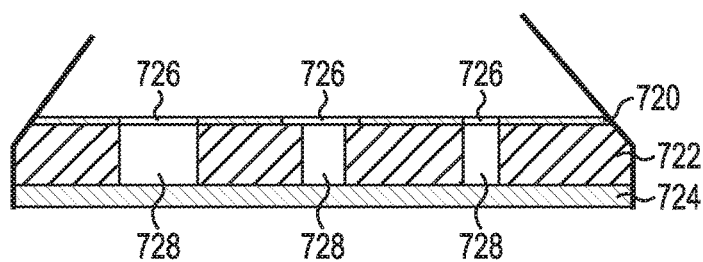
FIGS. 31A through 31C illustrate an alternate circuit structures in accordance with an embodiment of the present disclosure.
Figure 31B:
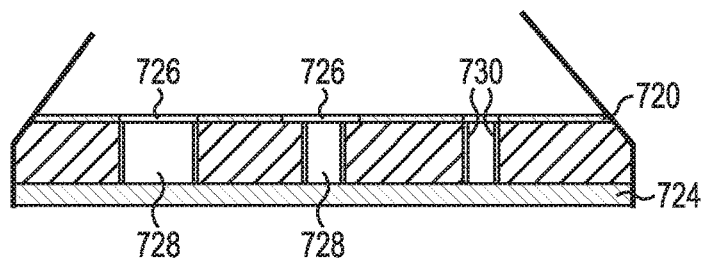
Figure 31C:
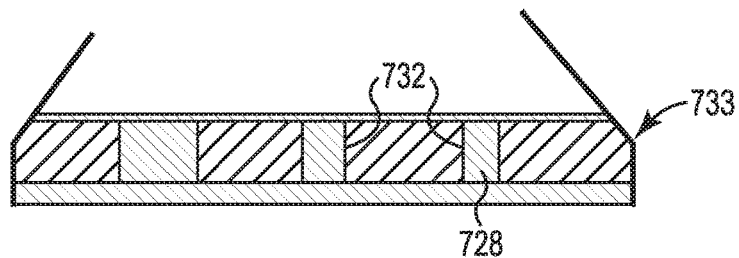

FIGS. 31A-31C illustrate a method of using a thin layer of copper 720 on one surface of an LCP or fusion layer 722. LCP or fusion layer 722 preferably includes copper clad 724. Via openings 726 are etched into the copper 720 to facilitate laser drilling of vertical vias 728 with the remaining copper field 720 acting as an ablation mask. The LCP or fusion layer 722 ablate at a much lower power in a UV laser environment than the copper 720, 724. The via openings 726 in the copper 720 permit vertical via formation that is significantly cleaner and better defined than conventional techniques. The mask effect of the copper 720 allows a via 728 to be drilled with a smaller diameter than the laser beam pattern would otherwise permit, such that only the LCP or fusion layer 722 exposed is ablated and the copper 720 surrounding the via openings 726 remains relatively unaffected by the ablation process.

FIG. 31B illustrates sidewalls of the vias 728 metalized with electroless copper or palladium based direct metalization 730. The metalization is preferably electrically coupled to both copper layers 720, 724. FIG. 31C illustrates sold metal vias 732 formed in the vias 728 of the circuit structure 733 using any of the techniques disclosed herein.

Figure 32:
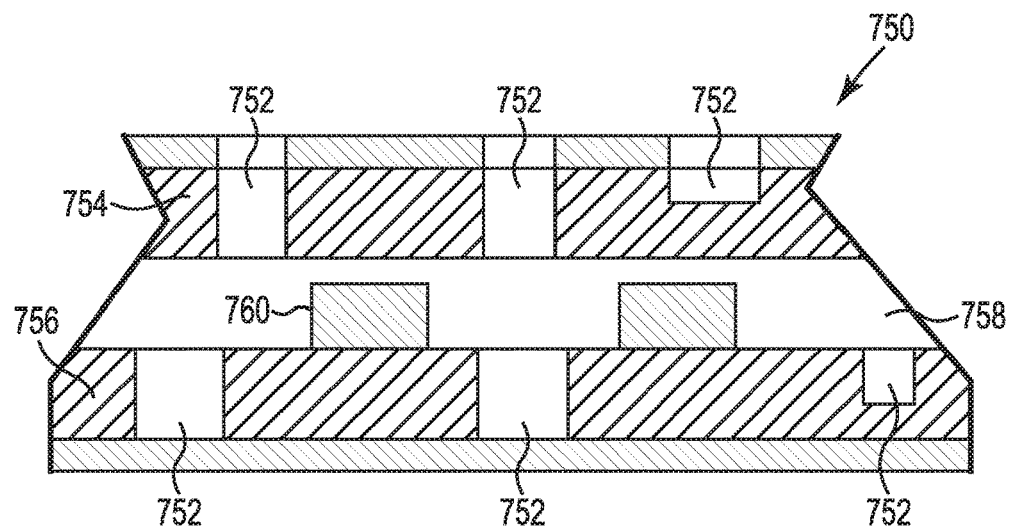
FIG. 32 illustrates an alternate circuit structure with anchor points in accordance with an embodiment of the present disclosure.

FIG. 32 illustrates a circuit structure 750 with a series of features 752 formed in dielectric layers 754, 756, such as protrusions or recesses, to receive the material of the fusion layer 758 in accordance with an embodiment of the present disclosure. During lamination the material of the fusion layer 758 flows or extrudes into and around the features 752 to enhance adhesion with the fusion layer 758 and increase structural integrity for the circuit structure 750. In some embodiments the circuit traces 760 can function as features 752 that enhance engagement with the fusion layer 758. The engagement of the fusion layer 758 with the features 752 acts as mechanical anchor points that function differently than a planar bond line, penetrating LCP and Copper planes.

Figure 33A:
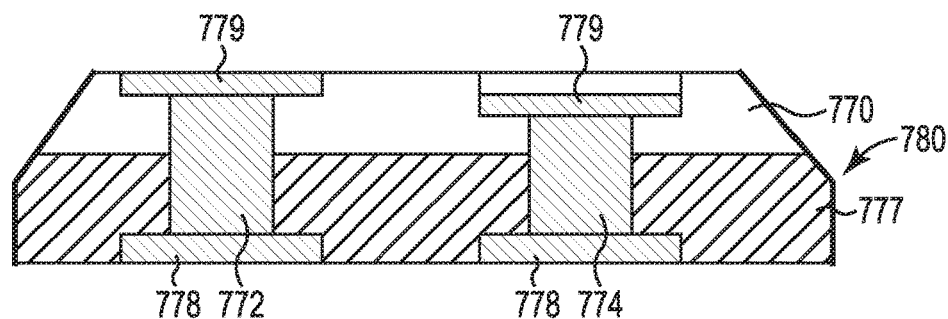
FIGS. 33A and 33B illustrate solid copper vias located circuit structures in accordance with an embodiment of the present disclosure.
Figure 33B:
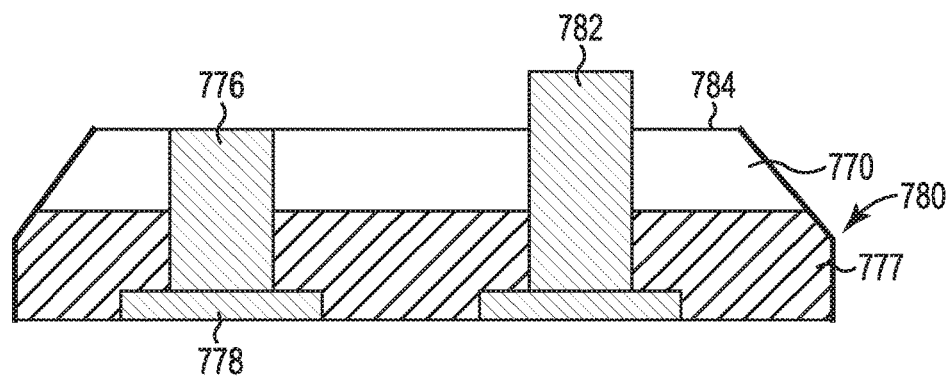

FIGS. 33A-33B illustrate two embodiments that use LCP or a fusion layer 770 or combination of LCP plus fusion layer as the mask to create solid copper vias 772, 774, 776 using the techniques disclosed herein. The LCP or fusion layer 770 can be ablated or drilled to create solid copper pillar via terminals 774 that are defined by the LCP or fusion layer 772. The extended pads 778 secure the vias 772, 774, 776 to base layer 777 of the circuit structure 780. Extended solid copper via 782 is optionally created by applying a mask layer to the surface 784, plating extended solid copper via 782 and removing the mask, as discussed herein. In one embodiment, extended pads 779 are created in a two-step process with the copper pillars 772 created first. Alternate solid copper via 772, 774, 776 configurations and methods of forming are disclosed in commonly assigned U.S. Pat. No. 9,761,520 (Rathburn), the entire disclosure of which is incorporated by reference.

FIGS. 34A-34E illustrate a circuit structure 800 with one or more LCP or fusion layers 802 added to LCP substrate 812 to create cavities 804 for IC devices 806, 808, 810 in accordance with an embodiment of the present disclosure.

LCP substrate 812 includes contact pads 814 that electrically couple with BGA device 806. Contact pads 816 protrude above the substrate 812 into the cavity 804 and couple with IC device 808. In some embodiments the IC devices 806, 808 are soldered to terminals 814, 816. The IC device 810 includes terminals 818 facing up. After the next fusion step illustrated in FIG. 34C, the terminals 818 are covered with the fusion material 820 encapsulating the IC devices 806, 808, 810.

In another embodiment, the LCP based module 800 leverages an industry trend for fan out redistribution of circuitry of die in a reconstituted wafer structure. Traditional module assembly has dies and components mounted to a substrate that contains required routing already intact. The structure begins with a LCP film 812 that is populated with full metal copper vias 814, 816 plated into a pre-defined pattern of die terminal patterns corresponding to the final module layout desired. The pre-defined LCP via field 814 is populated with die and components 806, 808, 810, with the option to place die face up.

The populated LCP module assembly 800 can be tested at the assembled state by probing the underside via sites 814, 816 with rework and replacement of die or components prior to continued module fabrication. A LCP frame or housing layer 802 is added either by injection overmolding or fusion bonding a cavity layer to provide walls and protection around devices assembled the LCP base layer. The assembled components 806, 808, 810 are encapsulated or overmolded to create an embedded assembly. The base LCP layer 812 with components processing and die assembled and overmolded is flipped to enable LCP circuit stack routing and processing as described with LCP circuit stack creation with die and components already in place and embedded in the final assembly.

Figure 34A:
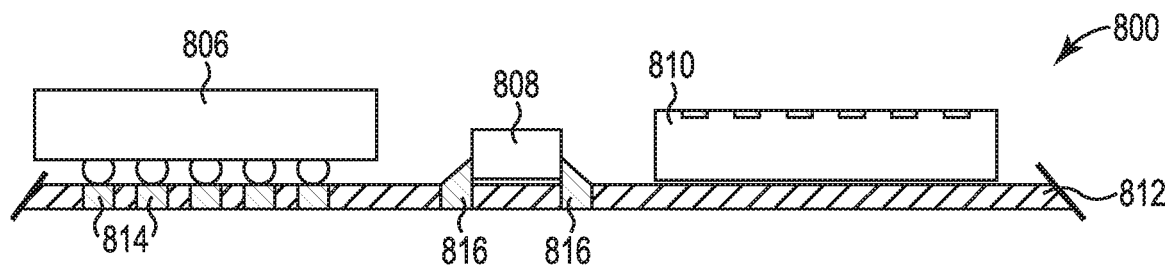
FIGS. 34A through 34G illustrate a circuit modules with a plurality of the circuit structure in accordance with an embodiment of the present disclosure.
Figure 34B:
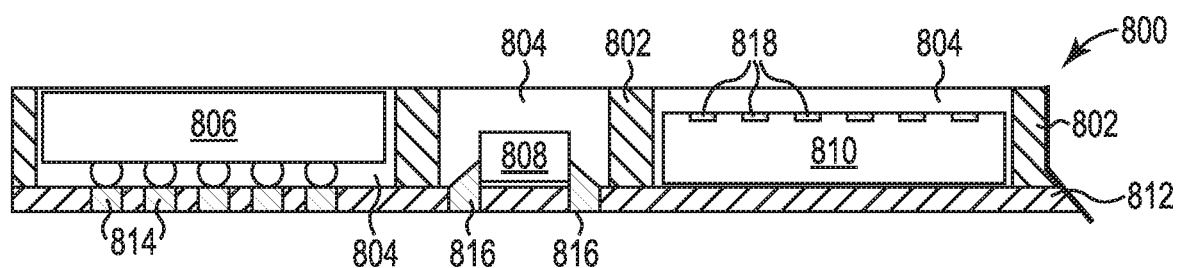
Figure 34C:
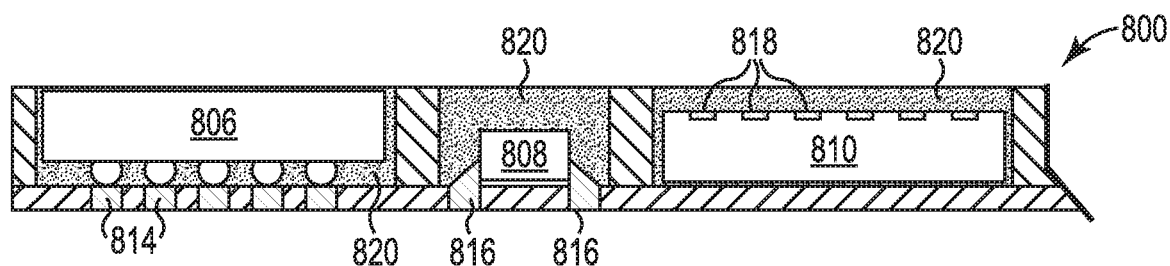
Figure 34D:
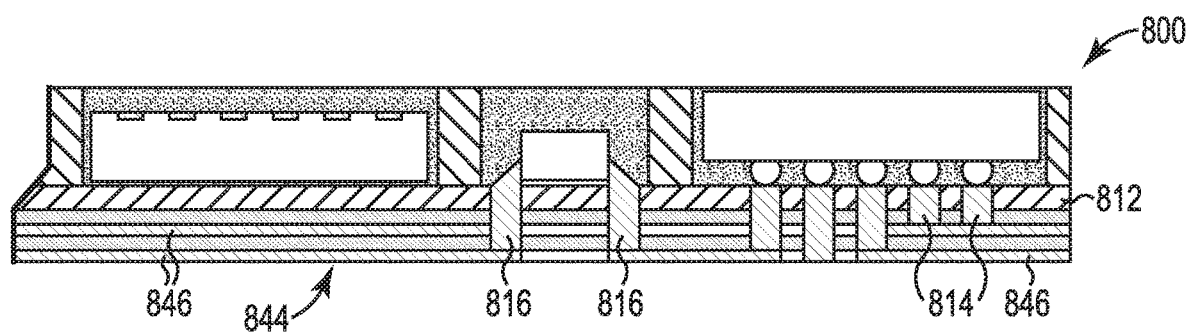

FIG. 34D illustrates one embodiment of the circuit structure 800 with an LCP circuit structure 844 constructed on the exposed surface of the LCP layer 812, using the various techniques disclosed herein. The circuit traces 846 in the LCP circuit structure 844 are coupled to the contact pads 814, 816 to provide signal routing for the circuit structure 800.

Figure 34E:
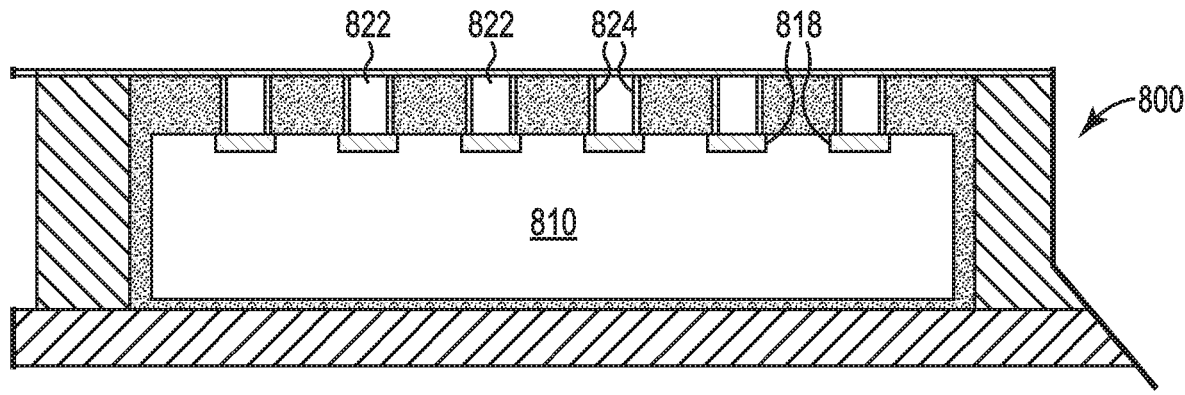
Figure 34F:
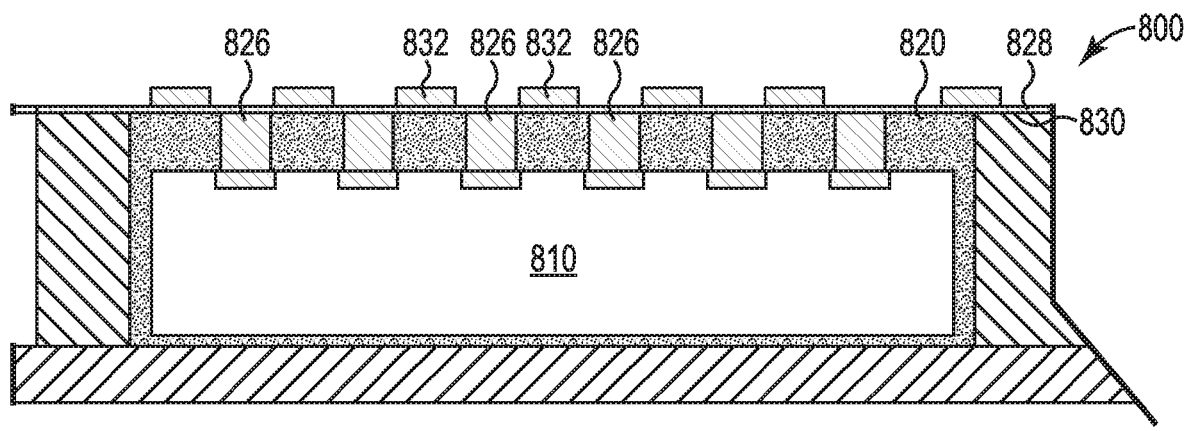

As illustrated in FIG. 34E the terminals 818 are exposed by laser drilling. The optical properties of the LCP material 820 facilitates registration of the laser with the terminals 818. The resulting holes 822 can be treated as if they were a previous metal target with vias drilled to the terminals and electroplated directly into the circuit structure 800, as discussed herein. In particular, plating 824 is applied to the inside surface of the holes 822, followed by plating the full metal vias 826 illustrated in FIG. 34F. In the illustrated embodiment, a circuit layer 828 is added to the surface 830 of the circuit structure 800 (and LCP material 820), followed by the creation of contact pads or solid copper pillars 832 configured to couple with the next layers of the circuit structure 800. The solid copper pillars 832 can be created using any of the techniques disclosed herein.

Figure 34G:
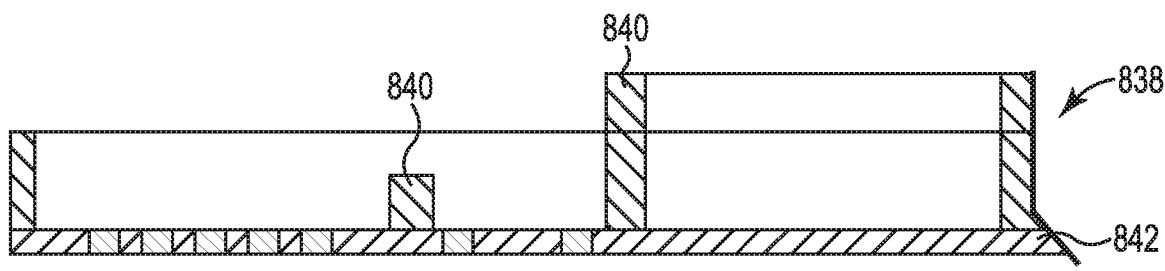

FIG. 34G illustrates an alternate circuit structure 838 with one or more LCP features 840 in accordance with an embodiment of the present disclosure. The LCP features 840 can be used for thickness control or a hard stop for an embedded IC device. Since LCP is a thermoplastic the LCP features 840 can be injection molded directly onto a base LCP film 842 with varying geometries and thicknesses. The injection molded LCP features 840 can optionally be doped to modify the electrical or mechanical properties to create a desired tuning or electrical function and serve as a platform for subsequent metallization or fusion layer lamination.

FIGS. 35A-35D illustrate a method of creating circuit structure 850 using laser ablation in accordance with an embodiment of the present disclosure. LCP layer 852 includes copper layer 854 and optional copper base 856. Resist layer 858 is located on the copper layer 854.

Figure 35A:
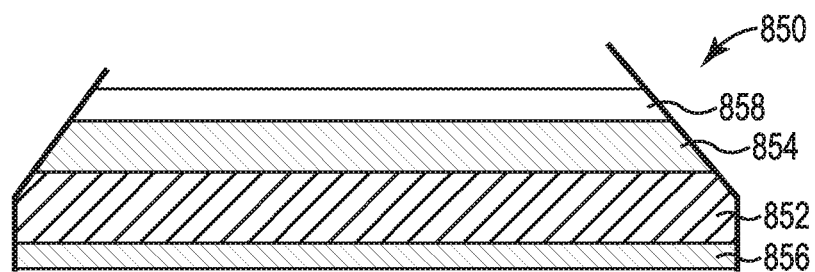
FIGS. 35A through 35D illustrate circuit structure formed using laser ablation in accordance with an embodiment of the present disclosure.
Figure 35B:
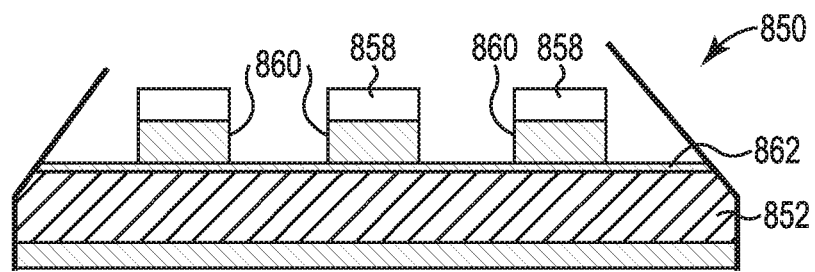

Laser ablation is used to create the circuit pattern 860 illustrated in FIG. 35B, rather than imaging. The laser ablation process selectively removes the resist 858 and a portion of the copper layer 854, without penetrating the LCP layer 852. The depth control of the laser ablation process permits a thin layer 862 of the copper layer 854 to be preserved around the circuit pattern 860. In the illustrated embodiment, resist 858 located on the circuit pattern 860 is preserved for further processing. The circuit structure 850 of FIG. 35B replicates the construction of the thin seed layer copper with pattern plated circuits illustrated in FIG. 27A.

Figure 35C:
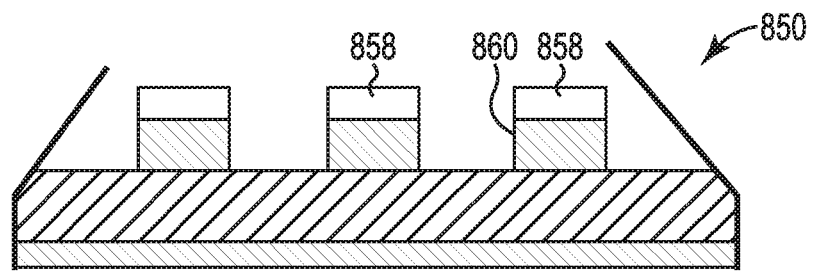
Figure 35D:
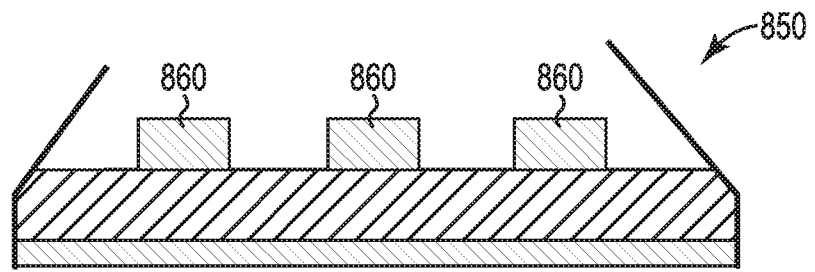

As illustrated in FIG. 35C, the circuit structure 850 is then differential etched to remove the remaining thin copper 862 with the non-ablated resist 858 remaining in place to protect the desired resultant circuit traces 860 from erosion during the etch process. FIG. 35D illustrates the final circuit structure 850 with the residual resist 858 removed from the circuit tracts 860.

FIGS. 36A-36D illustrates circuit structure 870 with various structures created using laser ablation in accordance with an embodiment of the present disclosure. Laser ablation can be performed on a base dielectric layer of LCP, a fusion layer, or LCP plus fusion layer with precise depth control to create structures, such a trench, channel, slot, or geometry of a desired shape that is then subsequently plated to fill the topography with electrodeposited copper. The depth of the geometry can be common, or the depth can be varied at any point within a given layer or layer to layer.

In the illustrated embodiment, first LCP circuit structure 872 includes a copper base layer 874, LCP layer 876, and an array of conductive traces 878. Electroplated copper pillar 880 extends above surface 882 of the LCP layer 876. Second LCP circuit structure 883 includes LCP layer 884, metal layer 886, and via 888 formed using laser ablation. The metal layer 886 optionally includes a circuit pattern.

Figure 36A:
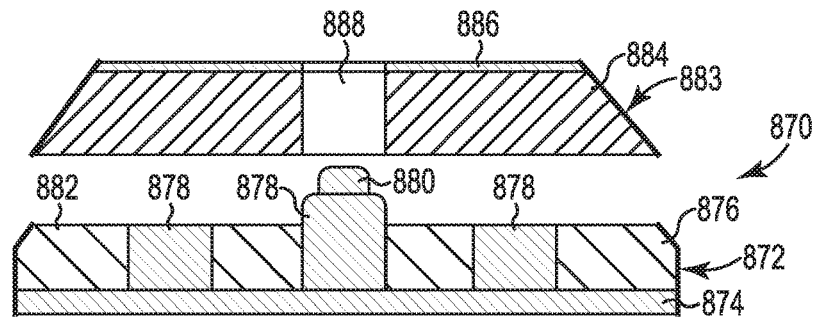
FIGS. 36A through 36D illustrate circuit structure formed using laser ablation in accordance with an embodiment of the present disclosure.
Figure 36B:
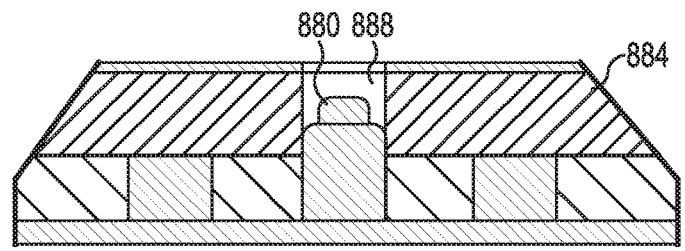
Figure 36C:
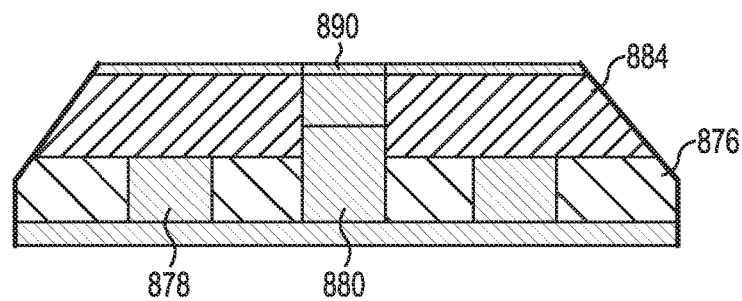

As illustrated in FIG. 36B, the copper pillar 880 is positioned in via 888 as an alignment feature with the second LCP circuit structure 883. The tip of the copper pillar 880 is optionally shaped to facility insertion into via 888. Plating 890 is subsequently deposited in via 888 as illustrated in FIG. 36C. The plating 890 serves to secure the first LCP circuit structure 872 to the second LCP circuit structure 883. A fusion bond step optionally bonds the LCP layers 876, 884 and simultaneously encapsulates and embeds the circuit structures 878, 880.

Figure 36D:
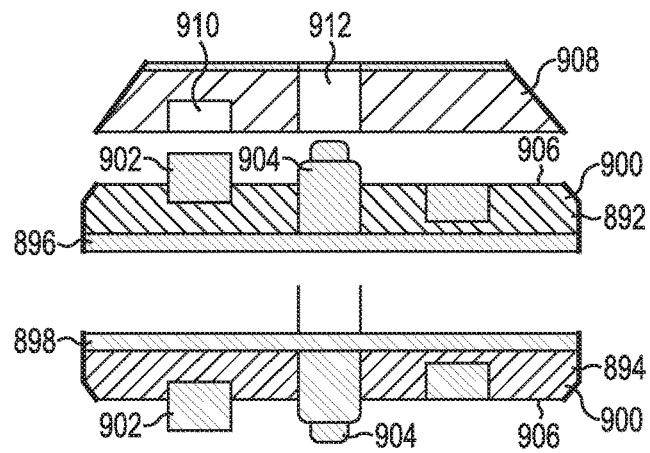

FIG. 36D illustrates a pair of LCP circuit structures 892, 894 with respective copper base layers 896, 898 arranged in a back-to-back configuration. LCP layers 900 includes a plurality of circuit structures 902, 904 that extend above the top surfaces 906 of the LCP layers 900. LCP layer 908 includes a corresponding recesses 910, 912 to receive the circuit structures 902, 904, respectively. The remainder of the processing as done as discussed herein.

Figure 37A:
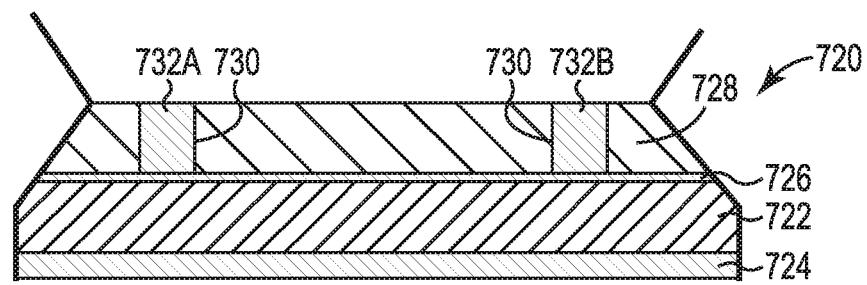
FIGS. 37A through 37E illustrate various coaxial circuit structures in accordance with an embodiment of the present disclosure.
Figure 37B:
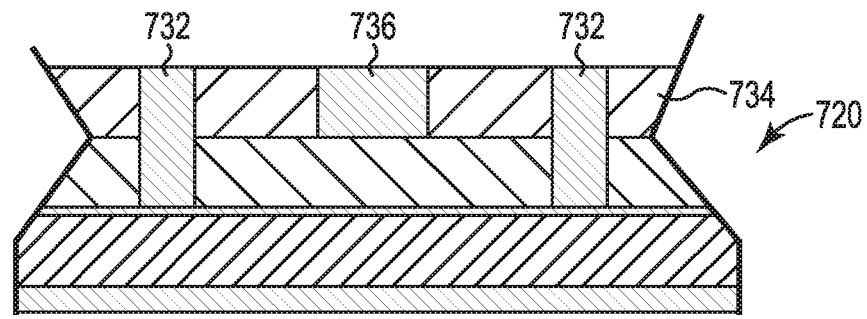
Figure 37C:
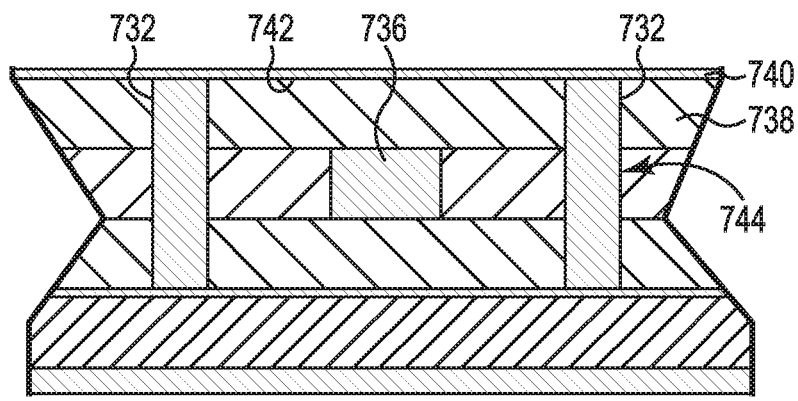

FIGS. 37A-37C illustrate a method of making a circuit structures 720 with embedded wave guides, embedded coaxial or twin axial, or embedded optical wave guides with lateral and vertical transitions, in accordance with an embodiment of the present disclosure. The circuit structure 720 is formed by creating a metallization region that can be stacked and extended by subsequent processing steps with precise control of the resultant geometric cross section designed to capture the desired signal or optical wave. LCP layer 722 includes a base copper layer 724 and a seed copper layer 726 on the opposite surface. LCP layer 728 is imaged or ablated to create recesses 730 that are plated to create vertical walls of metallization 732A, 732B ("732"), as discussed herein.

As illustrated in FIG. 37B, LCP layer 734 is similarly imaged or ablated and plated to extend the vertical walls of metalization 732 and to create signal line 736. FIG. 37C illustrates LCP layer 738 is imaged or ablated and plated to extend the vertical walls of metalization 732. Copper layer 740 deposited on top surface 742 of the LCP layer 738 to complete the coaxial structure 744.

Figure 37D:
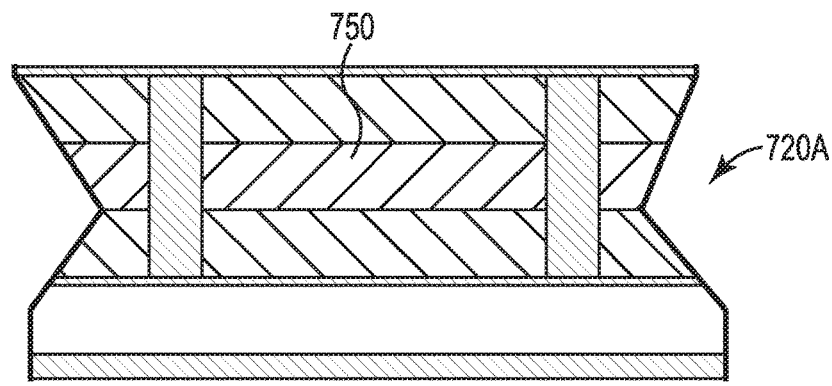
Figure 37E:
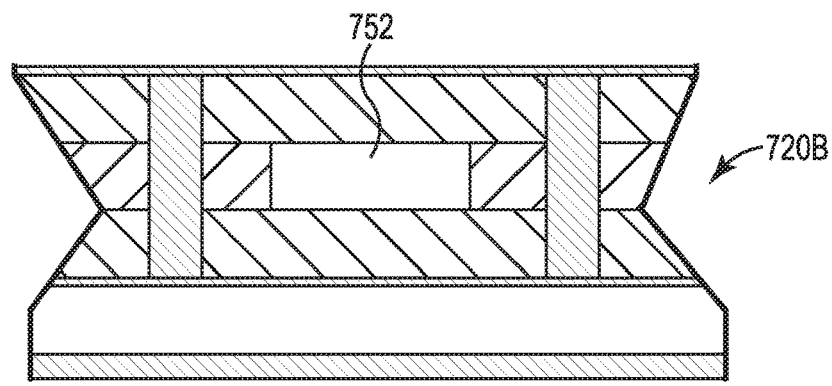

FIG. 37D illustrates an alternate circuit structure 720A with a centrally located embedded RF waveguide 750. FIG. 37E illustrates an alternate circuit structure 720B with a centrally located fluidic channel 752. It will be appreciated that the central portion of the circuit structures 720 can include an embedded wave guides, an embedded coaxial or twin axial signal lines, embedded optical wave guides, open spaces that can be used to transport materials, and the like.

Figure 38:
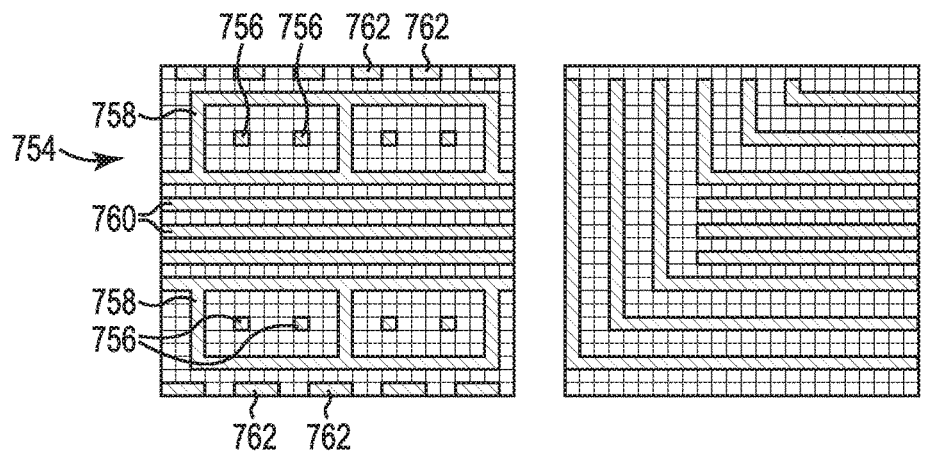
FIG. 38 illustrates a coaxial circuit structure in accordance with an embodiment of the present disclosure.

FIG. 38 illustrates end and side views of a circuit structures 754 with a plurality of embedded twin axial signal lines 756 each surrounded by a ground plane 758 made in accordance with the embodiments of FIGS. 37A-37E. Power and ground planes 760 are added to the central region and surface mount pads 762 are locate along outer surface of the circuit structure 754. As noted herein, the signal lines 756 can be an embedded wave guides, an embedded coaxial or twin axial signal lines, embedded optical wave guides, or open spaces that can be used to transport materials, and the like.

Figure 39A:
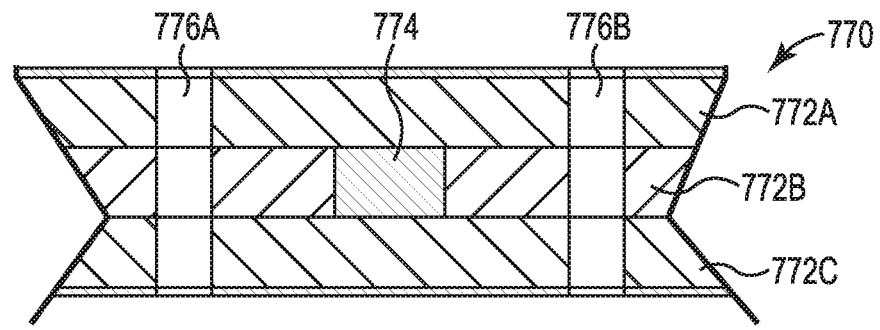
FIGS. 39A through 39C illustrate a coaxial circuit structures formed using laser ablation in accordance with an embodiment of the present disclosure.
Figure 39B:
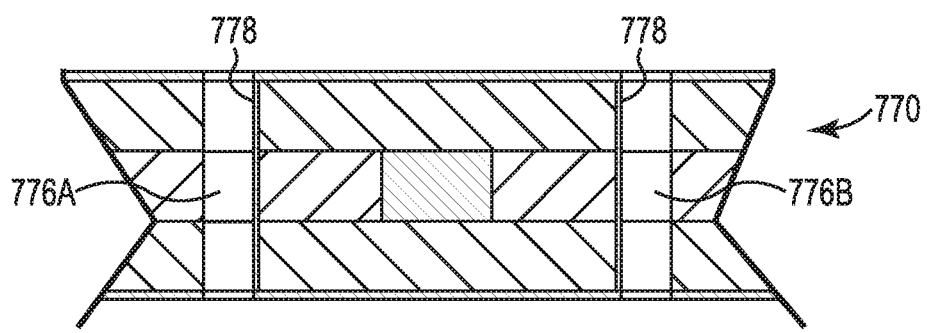
Figure 39C:
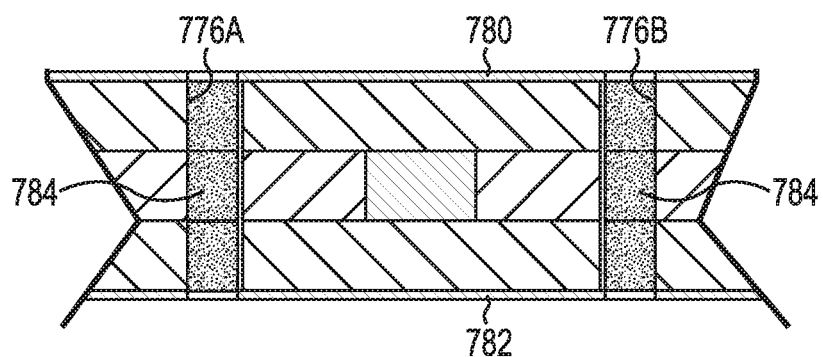

FIGS. 39A-39C illustrate an alternate method of making a circuit structures 770 with embedded wave guides, embedded coaxial or twin axial, or embedded optical wave guides with lateral and vertical transitions, in accordance with an embodiment, of the present disclosure. The circuit structure 770 is formed by creating a stack of LCP layers 772A, 772B, 772C, as discussed herein. The layer 772B is imaged or ablated and plated to create signal line 774. Laser ablation is used to form slots 776A, 776B ("776"). As illustrated in FIG. 39B, inside surfaces of the slots 776 are optionally plated 778. FIG. 39C illustrates the slots 776 fully metalized to create solid copper pillars 784. Upper and lower copper layers 780, 782 complete the shielding surrounding the signal line 774.

Figure 40:
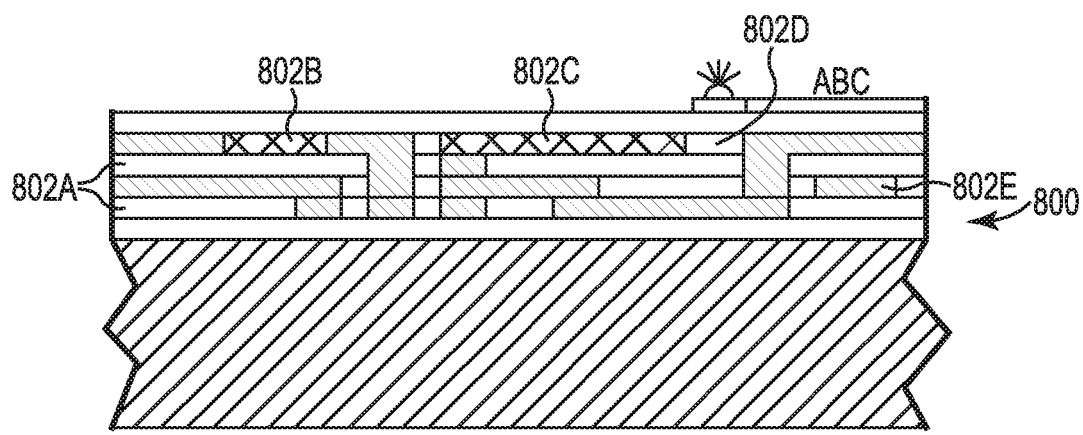
FIG. 40 illustrates a circuit structures with selective regions within a given layer modified to include a different material in accordance with an embodiment of the present disclosure.

FIG. 40 illustrates a method of making a circuit structure 800 using laser ablation to alter the dielectric, electrical, and mechanical properties of the material set at any point within a given layer of the circuit structure 800. For example, the portion or segments 802A, 802B, 802C, 802D, 802E within a given layer can be removed by laser ablation and replaced with a different material to create doping, filtering, tuning, or thermal management effects relative to the previous circuit layer or the subsequent circuit layer or both.

Figure 41:
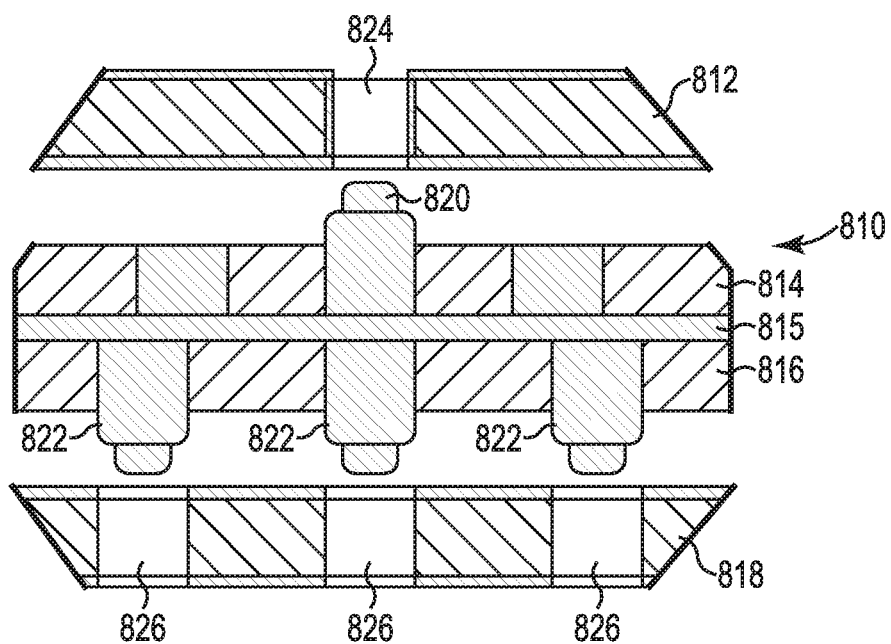
FIG. 41 illustrates a multi-layered circuit structure assembled and plated before a final fusion step in accordance with an embodiment of the present disclosure.

FIG. 41 illustrates an alternate circuit structure 810 in accordance with an embodiment of the present disclosure. LCP layers 812, 814, 816, 818 each contain pre-deposited circuits within the cross section of the LCP material. Copper pillars 820, 822 extend or protrude from the LCP layers 814, 816 and are connected to the circuit patterns 815 located within the LCP layers 814, 816. The copper pillars 820, 822 are aligned with pre-defined clearance holes 824, 826 formed in the LCP layers 812, 818. Once assembled the holes 824, 826 and corresponding pillars 820, 822 are plated (see e.g., FIG. 36C) without the need for fusion bond at that step of the construction. The approach is repeated to create the overall desired circuit structure 810 with the copper plated interfaces holding the layers together without fusion bonding. Once the circuit structure 810 is completed the entire assembly is fusion bonded to laminate the adjacent LCP layers 812, 814, 816, 818. The single fusion bonding step of the final assembly preserves the integrity of the circuit layers with minimal thermal excursions, rather than fusion bonding after each layer is added. Another approach is to fuse LCP layers in the 1-5 count with signal layers and laminate lower temperature fusion layers between ground planes due to the lower adhesion strength of LCP fused to copper planes. Circuit topography can be leveled with a LCP derivative and further bonded with the lower temperature fusion layer.

Figure 42:
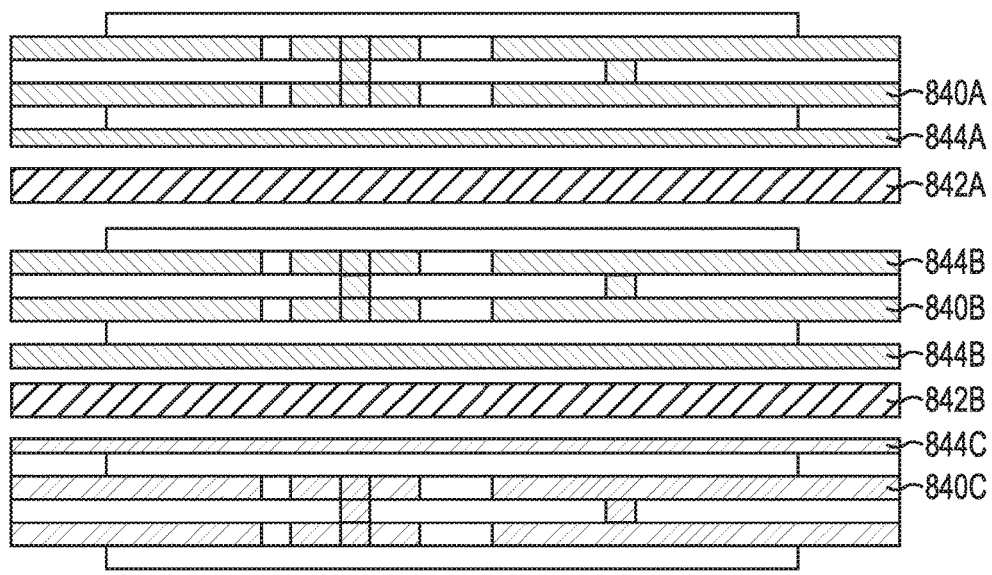
FIG. 42 illustrates a plurality of circuit structures fusion bonded with low temperature fusion layers in accordance with an embodiment of the present disclosure.

FIG. 42 illustrates three discrete high speed circuit assemblies 840A, 840B, 840C ("840") laminated together with lower temperature LCP or fusion layers 842A, 842B ("842"). In the illustrate embodiment, the LCP or fusion layers 842 are located between a ground planes 844A, 844B and 844B, 844C, respectively.

Figure 43:
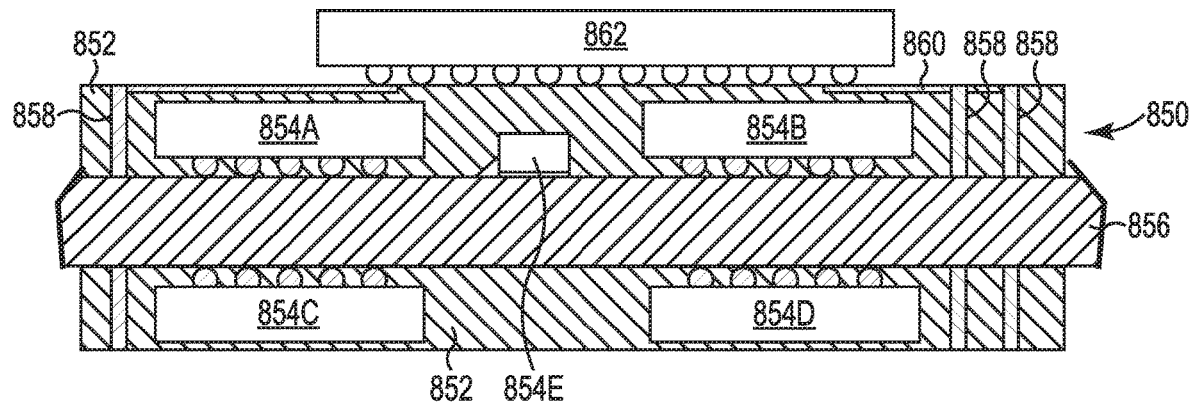
FIG. 43 illustrates an LCP circuit module with encapsulated IC device in accordance with an embodiment of the present disclosure.

FIG. 43 illustrates circuit structure 850 overmolded with LCP 852 in accordance with an embodiment of the present disclosure. IC devices 854A-854E are electrically coupled with LCP circuit structure 856 (see e.g., FIG. 34D) as disclosed herein. A series of laser drilled holes are metalized to create copper pillars 858 connecting the LCP circuit structure 856 using the various techniques disclosed herein. The entire assembly is environmentally sealed within the LCP 852. In one embodiment, external surfaces of the LCP 852 is processed as discussed herein to create a circuit structure 860 coupled to the copper pillars 858. An external IC device 862 can be surface mounted to the circuit structure 860. It is also possible to terminate the circuit construction with a copper pillar terminal that has a resist defined shape and head that provides a terminal to mate with a socket or connector and can also be surface mount soldered using solder paste.

Figure 44A:
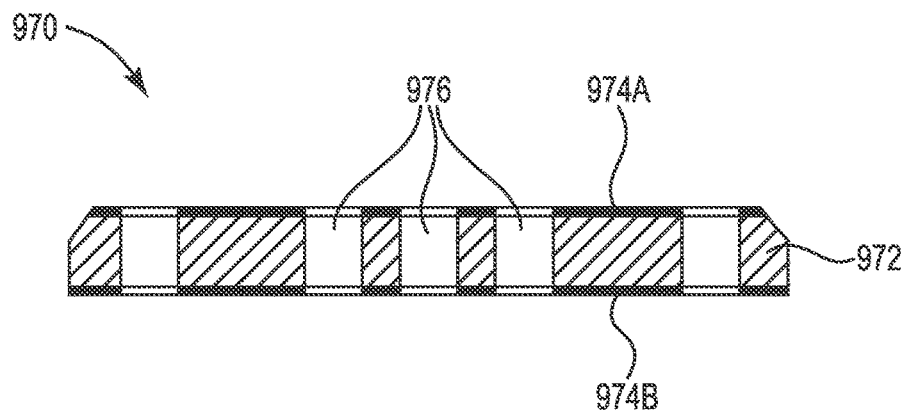
FIGS. 44A-44C illustrate an alternate method of making an LCP circuit structure in accordance with an embodiment of the present disclosure.
Figure 44B:
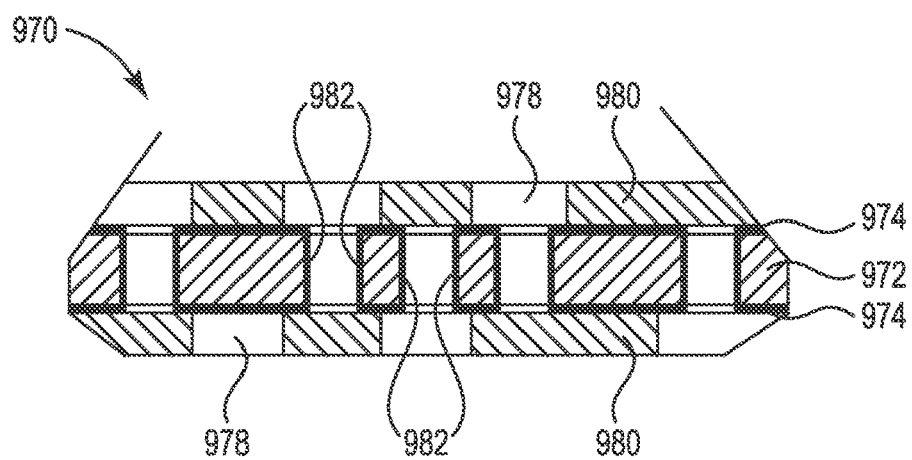
Figure 44C:
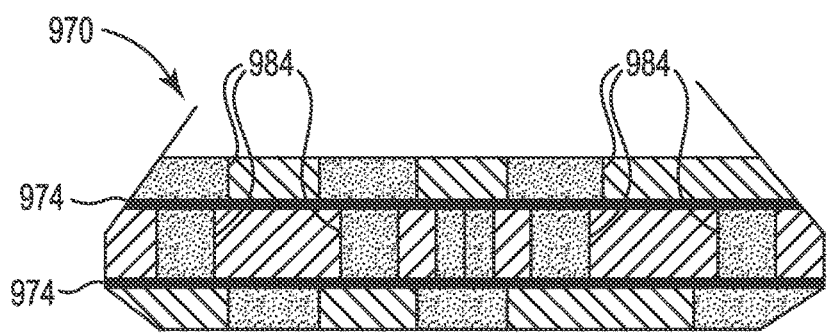

FIGS. 44A-44C illustrate a method for simultaneously creating circuit structures on opposing surfaces of LCP circuit structure 970 during the same electrolytic plating process step in accordance with an embodiment of the present disclosure. Base layer of LCP film 972 about 3-5 microns thick includes copper seed layers 974A, 974B ("974") on opposite sides. Through holes 976 are drilled in base layer of LCP film 972 and copper seed layers 974 using direct laser ablation of Copper-LCP-Copper or the via entrance openings can be etched in the seed copper.

As best illustrated in FIG. 44B, plating resist 980 is applied to the seed copper 974 on both side of the LCP film 972 and imaged to create the desired circuit pattern 978. The sidewalls 982 of the drilled vias are metalized with electroless copper plating or a palladium based direct plate that is enhanced with a thin copper plating. This metalization creates an electrical connection between the seed layers 974 on both sides of the LCP film 972.

As illustrated in FIG. 44C, the seed layers 974 are connected to an electrolytic plating bus and solid vias 984 are simultaneously plated in one operation to both surfaces of the LCP circuit structure 970.

FIGS. 45A-45E illustrate an alternate method for simultaneously creating circuit structures on opposing surfaces of LCP circuit structure 920 during the same electrolytic plating process step in accordance with an embodiment of the present disclosure. LCP film 922 is pre-formed with seed copper 924A, 924B ("924") on both sides and solid copper vias 926 connecting the seed layers 924.

Figure 45A:
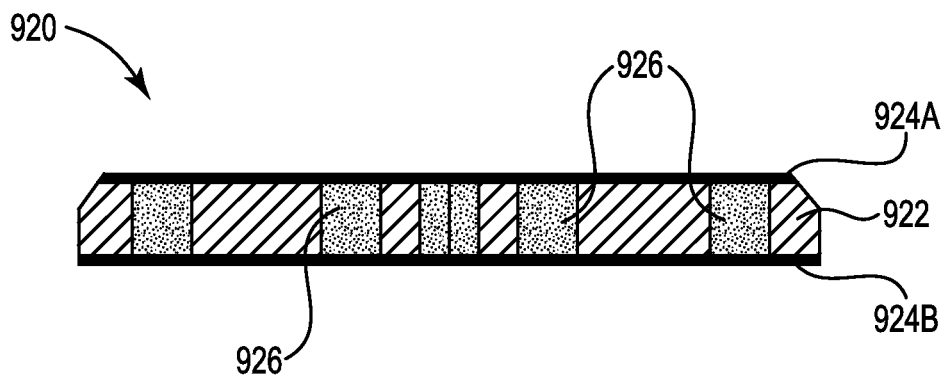
FIGS. 45A-45E illustrate an alternate method of making an LCP circuit structure in accordance with an embodiment of the present disclosure.
Figure 45B:
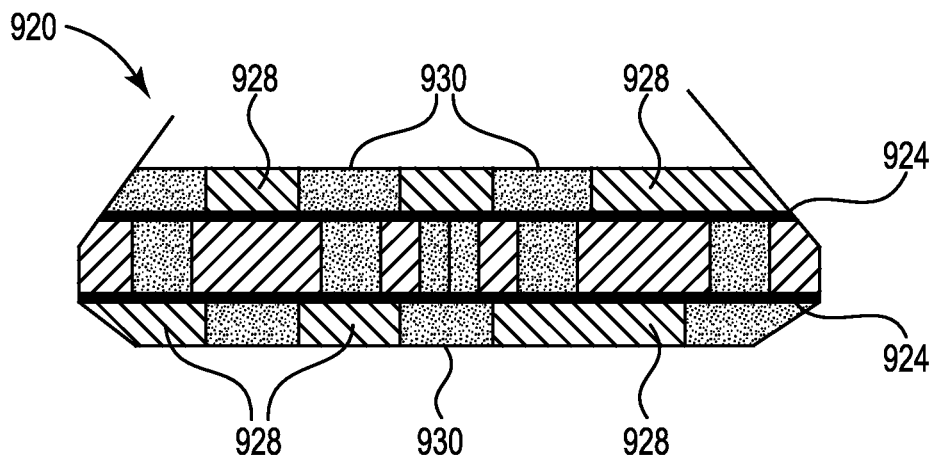

As illustrated in FIG. 45B, plating resist 928 is applied to the seed copper layers 924 and imaged to create the desired circuit patterns. Both sides of the LCP circuit structure 920 are electroplated at the same process step to grow the circuit patterns 930 restricted by the plating resist.

Figure 45C:
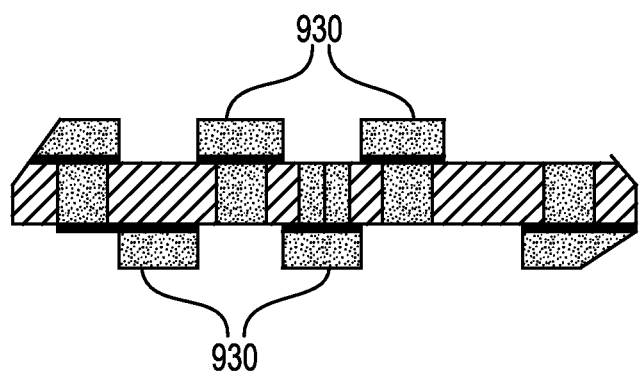

As illustrated in FIG. 45C, the plating resist 928 is removed by chemical means using stripping chemistry and the seed copper 924 remaining in between the circuit patterns 930 is removed by a differential etch process, which removes the thin copper without dramatic erosion of the circuit patterns 930. An annealing process can be applied to adjust the electroplated copper gain structure to reduce the effect of differential etch, or an etch resist can be applied to protect the exposed circuit patterns.

Figure 45D:
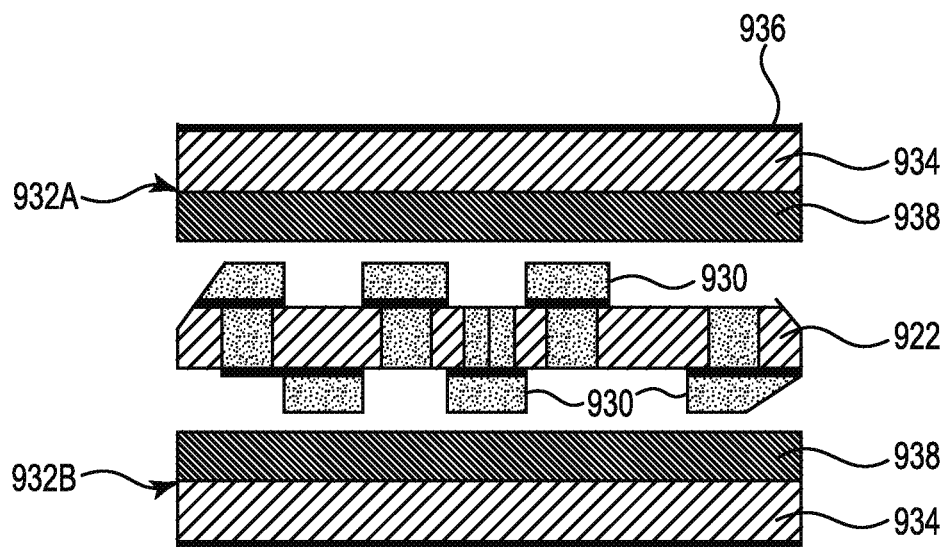
Figure 45E:
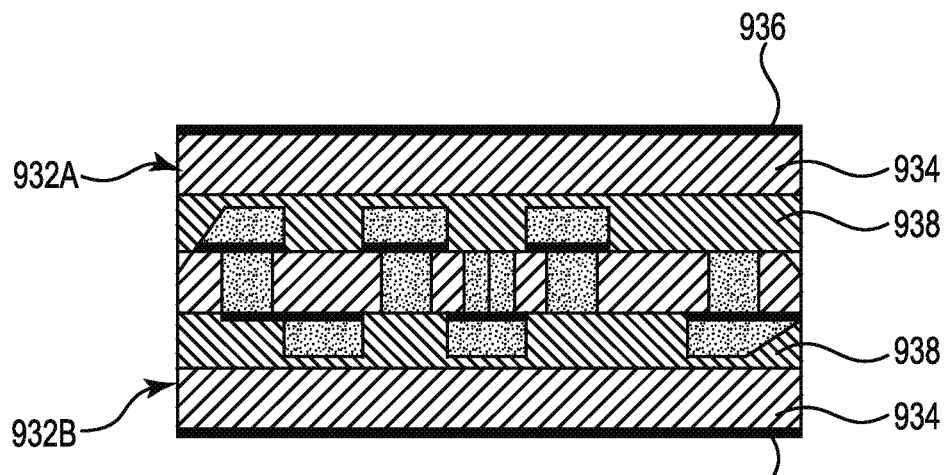

As illustrated in FIGS. 45D and 45E, the LCP core 922 is further processed to extend the multi-layer stack by adding the next dielectric separation layers 932A, 932B to both sides simultaneously. An LCP films 934 each have one layer of seed copper 936 are processed to add a fusion layers 938, which is pre-tacked to the bare LCP layer 922 with a lower temperature and pressure required for full lamination and cure.

The resulting stack benefits from a significant ability to control the dielectric separation as the fusion materials 938 encapsulate the circuit patterns 930 without disruption of the base LCP 922 layers due to the lower fusion temperature than required to fuse LCP alone to itself.

The dielectric separation can be the thickness of the LCP film in the event to fusion material completely fills the spaces between circuit patterns, while the most likely situation is there is a thinner section of fusion material in between the LCP and the exposed surfaces of the circuit patterns. The control of the dielectric separation can also be amended by adding hard stops in the lamination set-up where the lamination sequence stops at a desired distance. The ability to control the dielectric separation is very critical to impedance control.

Figure 46A:
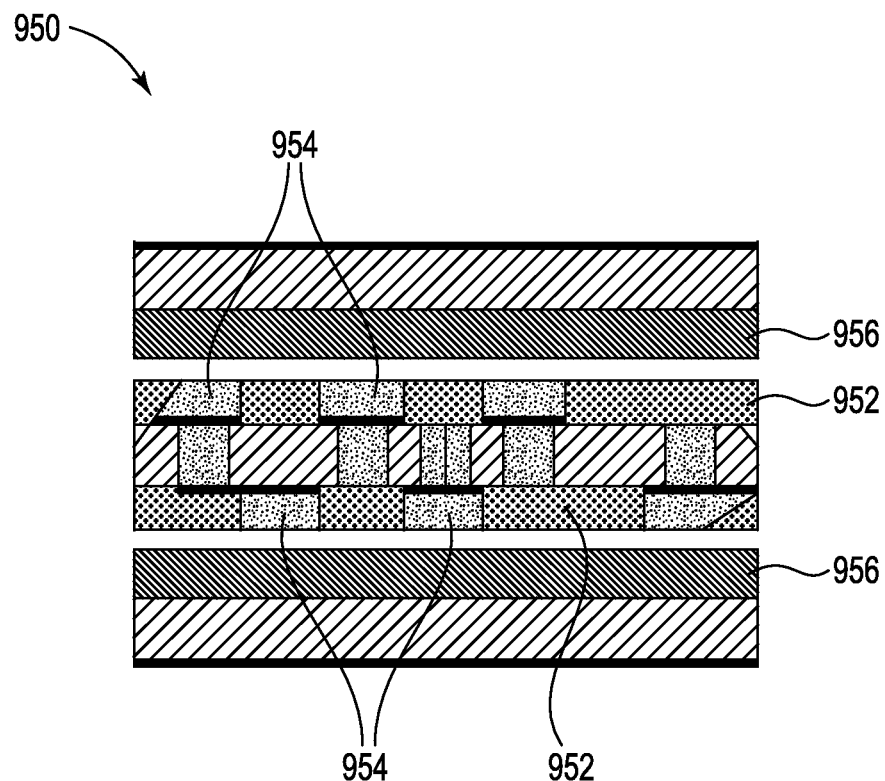
FIGS. 46A-46B illustrate an alternate method of making an LCP circuit structure in accordance with an embodiment of the present disclosure.
Figure 46B:
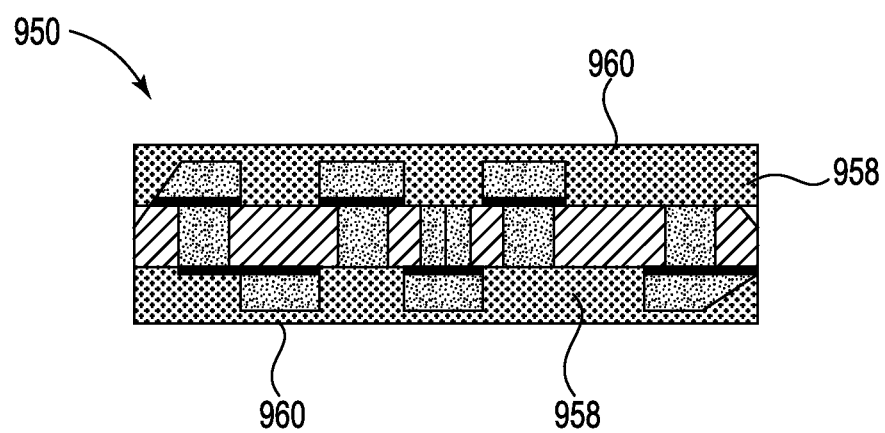

FIG. 46A illustrates an LCP circuit structure 950 modified by adding a fine powder of LCP particles 952 to fill the cavities or spaces between the circuit patterns 954, which is a variation of the embodiment in FIGS. 45D and 45E. Upon lamination of fusion layers 956, as generally illustrated in FIGS. 45D and 45E, the LCP particles 952 are encapsulated in a LCP matrix, which modifies the dielectric properties of the material intimate to the circuit patterns 954. FIG. 46B illustrates an alternate embodiment that approximates the LCP circuit structure 950 of FIG. 46A by overmolding raw LCP resin 958 and planarizing surfaces 960.

As the size of circuit structures and spaces between the structures are reduced, the thickness of the dielectric is very important for dielectric separation. As the dielectric layer thickness thins, it is increasingly difficult to process films. Applying LCP in very fine powder form to the exposed circuit patterns 954 and fusion bonding the particles to the copper circuit patterns 954 and the base core LCP 958 with a lamination process can melt the LCP particles 952 very quickly without melting the base LCP 958 due to the small fine size of the LCP particle 952 and lower thermal mass.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A method of making a fusion bonded circuit structure comprising the step of:

providing a first liquid crystal polymer (LCP) substrate with first and second major surfaces having first and second seed layers of a conductive material, respectively;

depositing first and second resist layers on the first and second major surfaces of the first LCP substrate, respectively;

processing the first and second resist layers to create a plurality of first and second recesses corresponding to a desired first and second circuitry layers, the plurality of first and second recesses exposing portions of the first and second seed layers of conductive material, respectively;

simultaneously electroplating the first LCP substrate to create first and second conductive traces defined by the plurality of first and second recesses, respectively, wherein the first and second seed layers of conductive material act as an electrical bus for the electroplating process;

removing, the first and second resist layers to reveal the first, and second conductive traces;

etching to remove exposed portions of the first and second seed layers of conductive material adjacent the first and second conductive traces, respectively, wherein an unetched portions of the first and second seed layers of conductive material remains between the first and second conductive traces and the first LCP substrate; and fusion bonding first and second LCP layers to the first and second major surface of the first LCP substrate to encapsulate the first and second conductive traces in an LCP material.

2. The method of claim 1 wherein the step of depositing the first and second resist layers comprises the steps of:
depositing the first and second resist layers as a liquid; and
imaging the first and second resist layers to create the plurality of first and second recesses.

3. The method of claim 1 wherein the first and second conductive traces comprise a pitch of about 25 microns.

4. The method of claim 1 wherein the first and second conductive traces comprise a thickness of about 20 microns to about 50 microns.

5. The method of claim 1 wherein the first and, second conductive traces comprise a generally rectangular cross-sectional shape.

6. The method of claim 1 further comprising the step of planarizing the first conductive traces before the step of removing the first resist layer.

7. The method of claim 1 further comprising the steps of:
laser drilling a plurality of first vias through the first LCP layer to the first conductive traces; and
bulk plating the plurality of first vias with a conductive material to form a plurality of conductive pillars of solid metal that substantially fill the vias.

8. The method of claim 7 further comprising, the steps of:
preparing inside surfaces of one or more of the plurality of first vias to receive electro less plating; and
electro-less plating one or more of the plurality of first vias before plating the conductive pillars.

9. The method of claim 7 further comprising the steps of:
attaching a second circuitry layer to the first major surface of the first LCP substrate; and
electrically coupling the conductive pillars to the second circuitry layer.

10. The method of claim 9 further comprising the steps of laser drilling a plurality of second vias through, the second LCP layer to the second circuitry layer.

11. The method of claim 1 further comprising the steps of:
laser drilling a plurality of first vias through the first LCP layer to the first conductive traces; and
barrel plating the plurality of first vias.

12. The method of claim 1 wherein the first and second seed layers of the conductive material is about 3 microns to about 5 microns thick.

13. The method of claim 1 further comprising the step of laser drilling the first LCP layer to expose portions of the first conductive traces.

14. The method of claim 1 further comprising, the step of electroplating the first and second recesses to a top surface of the first and second resist layers.

15. The method of claim 1 further comprising the step of applying electro-less plating to sidewalls of the first and second recesses before the electroplating process.

16. A method of making a fusion bonded circuit structure comprising the step of:
providing a first liquid crystal polymer (LCP) substrate with a first and second major surface having first and second seed layers of a conductive material, respectively;
depositing first and second resist layers on the first and second seed layers of conductive material, respectively;
processing the first and second resist layers to create a plurality of first and second recesses corresponding to a plurality of first and second vias openings, the plurality of first and second vias openings exposing portions of the first and second seed layers of conductive material;
simultaneously electroplating the first LCP substrate to create conductive pillars defined by the first and second vias openings, wherein the first and second seed layers of conductive material act as an electrical bus for the electroplating process;
removing the first and second resist layers to reveal the conductive pillars;
etching to remove exposed portions of the first and second seed layers of conductive material adjacent the conductive pillars, wherein an unetched portions of the first and second seed layers of conductive material remains between the conductive pillars and the first LCP substrate; and
fusion bonding first and second LCP layers to the first and second major surfaces of the first LCP substrate to encapsulate the conductive pillars in an LCP material.

17. The method of claim 16 further comprising the step of laser drilling the first and second LCP layers to expose the conductive pillars.

18. The method of claim 16 wherein the conductive pillars comprise a diameter in the range, of about 25 microns to about 50 microns.

19. A method of making a fusion bonded circuit structure comprising the step of:
providing a first liquid crystal polymer (LCP) substrate with a first and second major surface having first and second seed layers of a conductive material;
depositing first, and second resist layers on the first and second seed layers of conductive material;
processing the first and second resist layers to create a plurality of first and second recesses corresponding to a desired first and second circuitry layers respectively, the first and second recesses exposing portions of the first and second seed layers of conductive material, respectively;
simultaneously electroplating the first LCP substrate to create first and second conductive traces defined by the first and second recesses, respectively, wherein the first and second seed layers of conductive material act as an electrical bus for the electroplating process;
removing the first and second resist layers to reveal the first and second conductive traces;
etching to remove exposed portions, of the first and second seed layers of conductive material adjacent the first and second conductive traces; and
fusion bonding first and second fusion bonding layers to the first and second major surface of the first LCP substrate to encapsulate the first and second conductive traces in a fusion bonding material, wherein the first LCP substrate and the first and second fusion bonding layers have dielectric constants that differ less than about 20%.

* * * * *